United States Patent
Lee

(10) Patent No.: US 10,192,880 B2
(45) Date of Patent: Jan. 29, 2019

(54) SEMICONDUCTOR DEVICE AND MANUFACTURING METHOD THEREOF

(71) Applicant: SK hynix Inc., Gyeonggi-do (KR)

(72) Inventor: Ki Hong Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/638,496

(22) Filed: Jun. 30, 2017

(65) Prior Publication Data

US 2018/0130814 A1    May 10, 2018

(30) Foreign Application Priority Data

Nov. 8, 2016    (KR) .................. 10-2016-0148176

(51) Int. Cl.
| | |
|---|---|
| H01L 27/11568 | (2017.01) |
| H01L 27/11565 | (2017.01) |
| H01L 27/11582 | (2017.01) |
| H01L 27/1157 | (2017.01) |

(52) U.S. Cl.
CPC .... H01L 27/11568 (2013.01); H01L 27/1157 (2013.01); H01L 27/11565 (2013.01); H01L 27/11582 (2013.01)

(58) Field of Classification Search
CPC ......... H01L 27/11568; H01L 27/11582; H01L 27/11565

USPC .......................................................... 257/329
See application file for complete search history.

(56) References Cited

U.S. PATENT DOCUMENTS

| | | | | |
|---|---|---|---|---|
| 6,570,213 B1 * | 5/2003 | Wu | ........................ | H01L 27/115 257/314 |
| 6,667,510 B2 * | 12/2003 | Wu | ........................ | H01L 27/115 257/315 |
| 9,196,627 B2 | 11/2015 | Konno et al. | | |
| 2017/0033044 A1 * | 2/2017 | Choi | ................. | H01L 27/11582 |

FOREIGN PATENT DOCUMENTS

| | | |
|---|---|---|
| KR | 1020140093044 | 7/2014 |
| KR | 1020150116995 | 10/2015 |
| KR | 1020150126524 | 11/2015 |

* cited by examiner

*Primary Examiner* — Fernando L Toledo
*Assistant Examiner* — Adam S Bowen
(74) *Attorney, Agent, or Firm* — IP & T Group LLP

(57) ABSTRACT

A semiconductor device includes gate stacked structures surrounding channel layers, a common source line filling a separation area between the gate stacked structures adjacent to each other and having an upper surface including first concave portions, and a support insulating layer filling the first concave portions and having sidewalls facing portions of the channel layers.

19 Claims, 61 Drawing Sheets

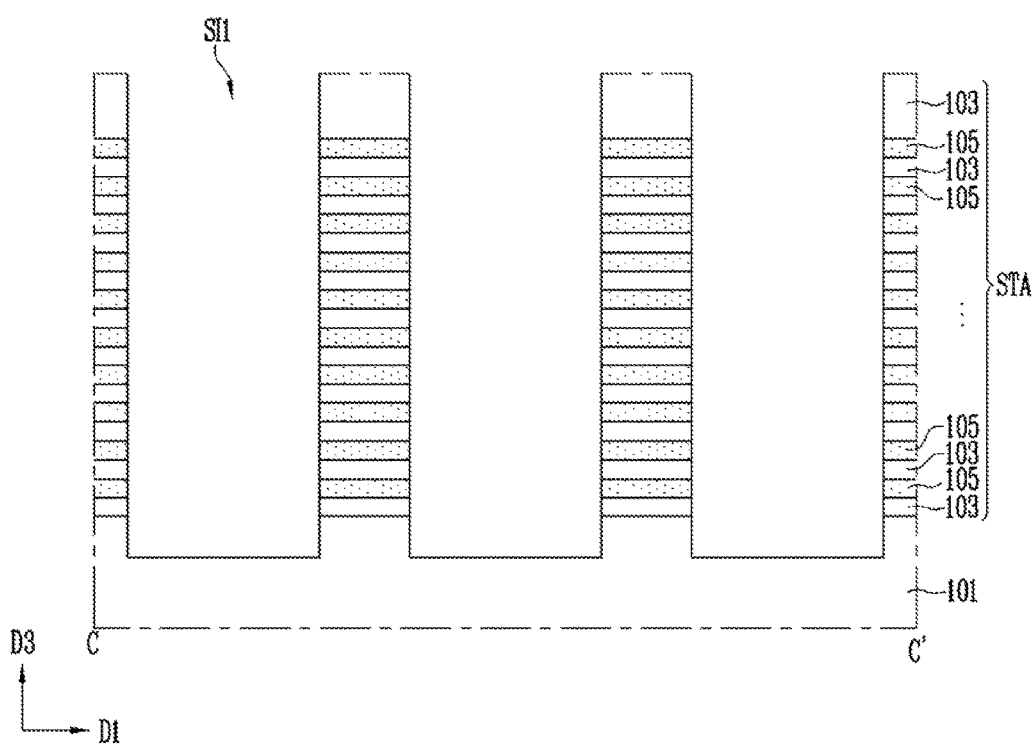

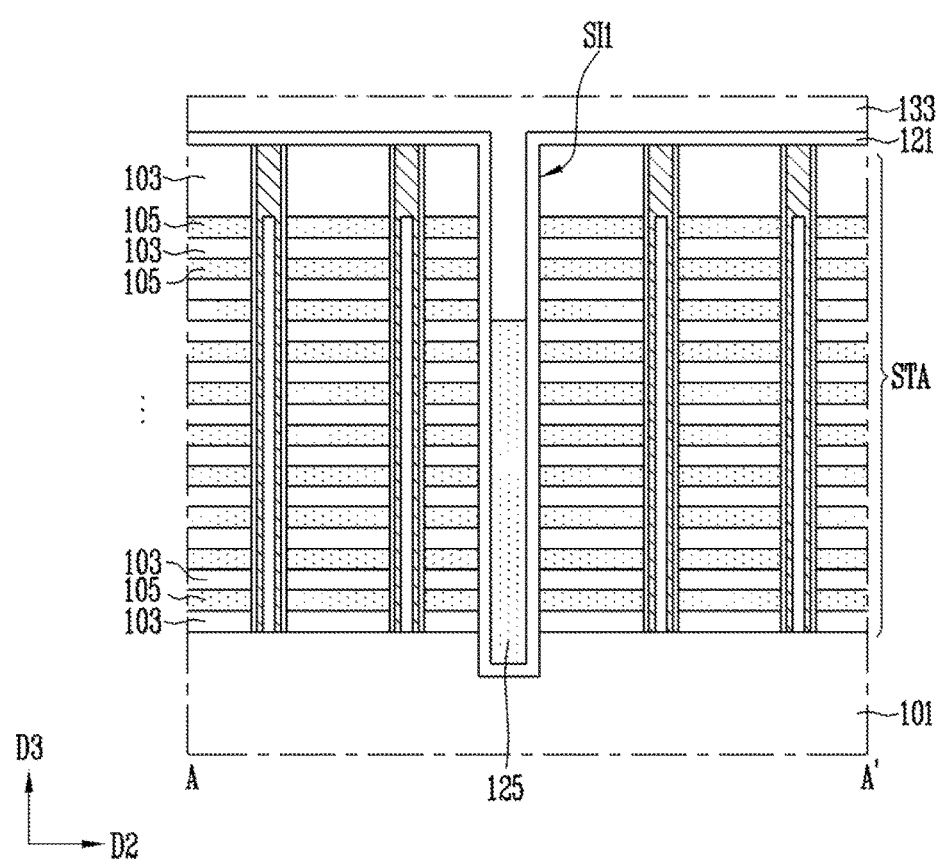

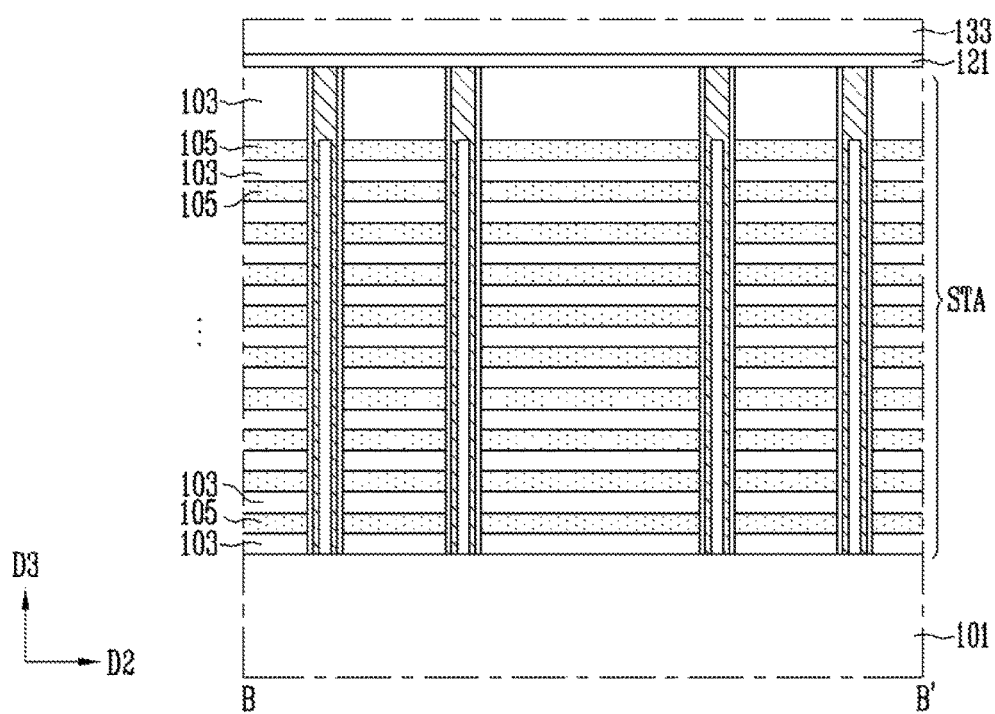

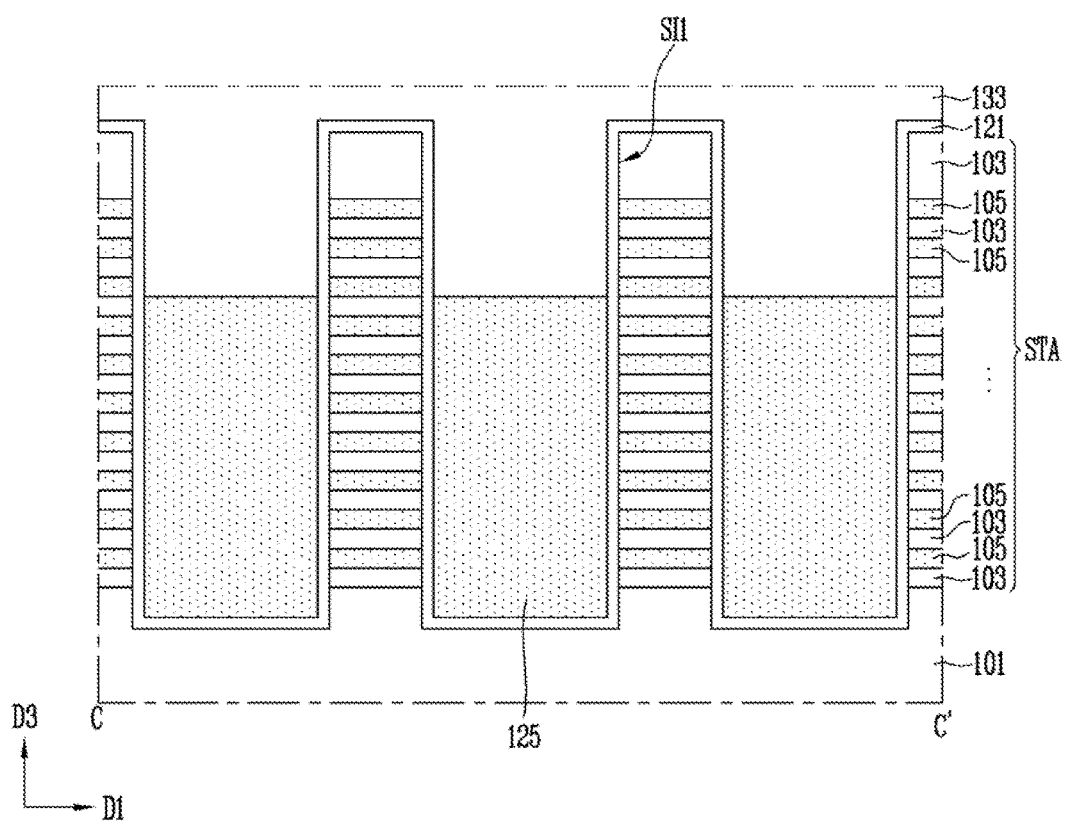

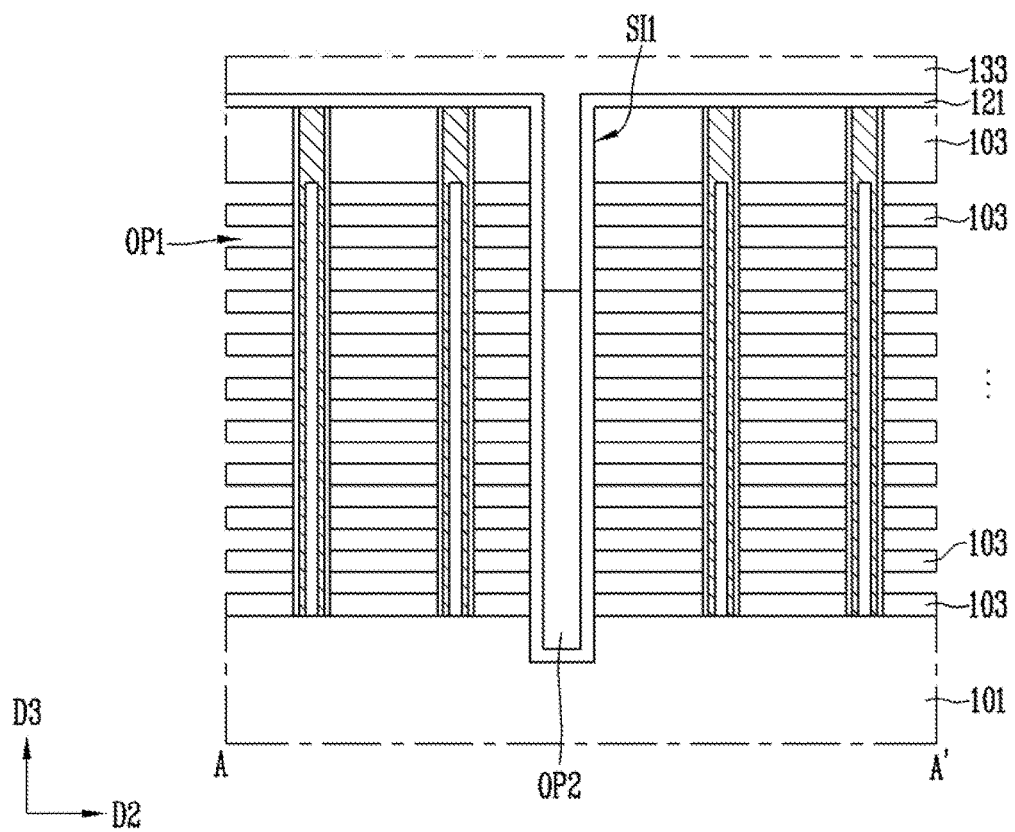

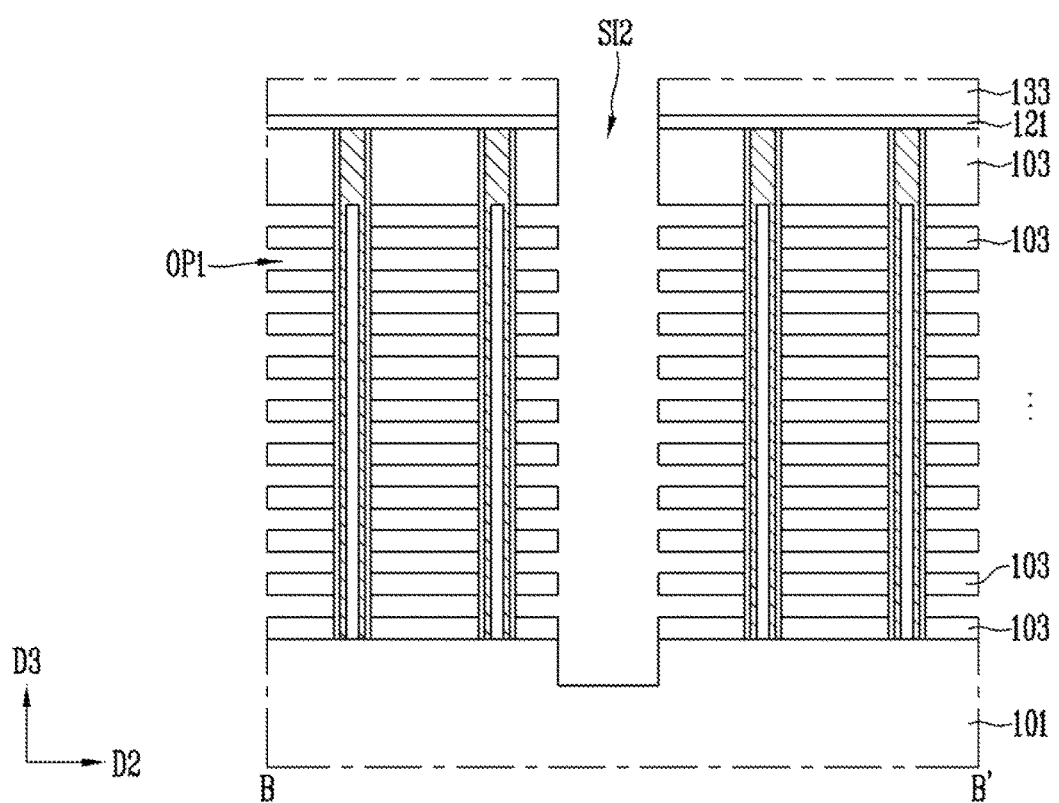

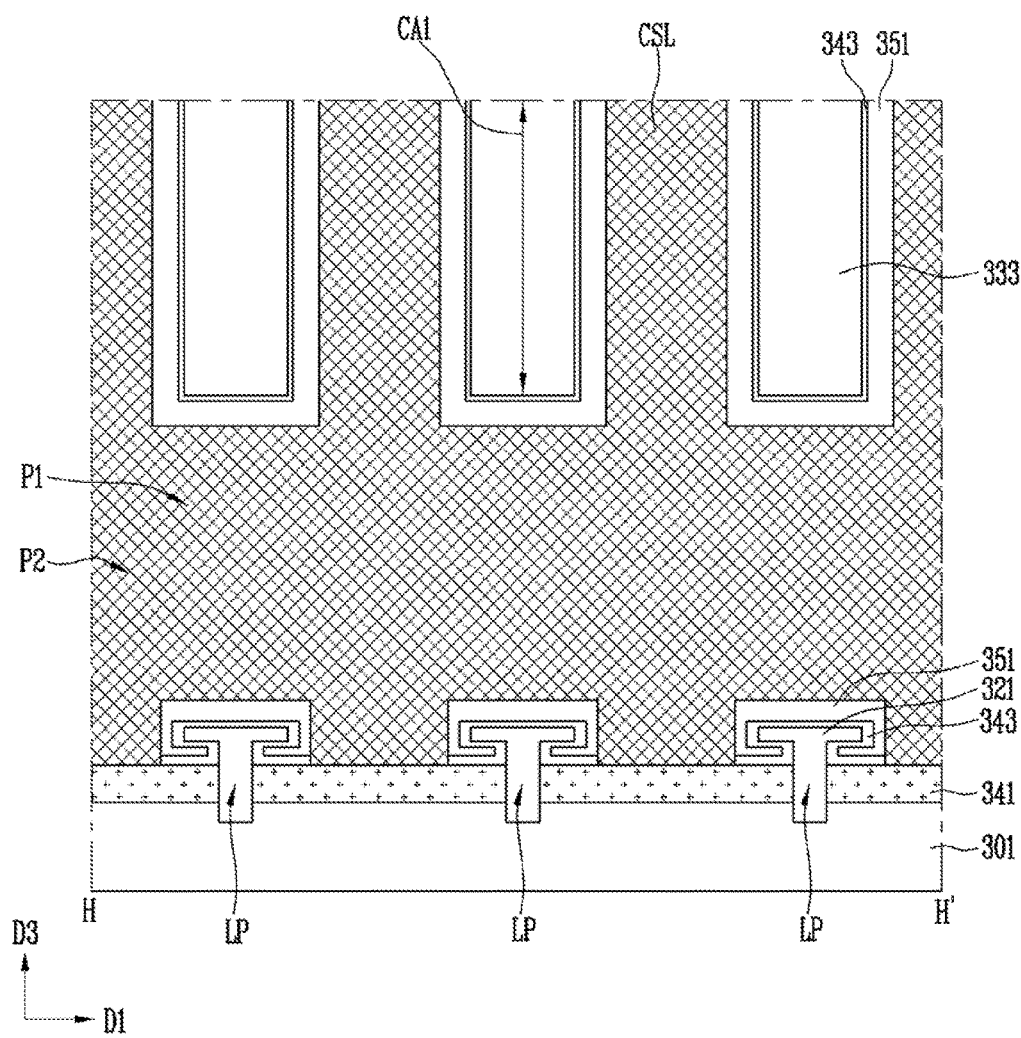

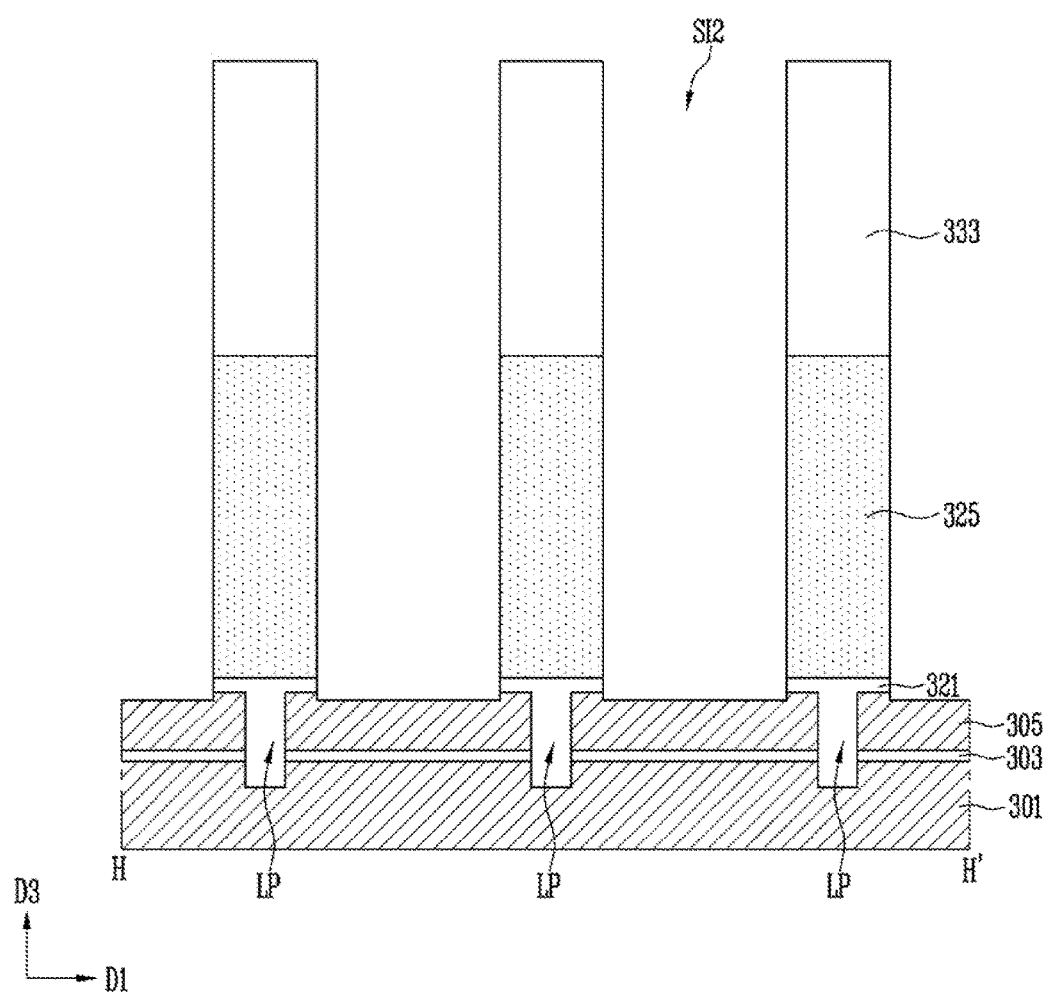

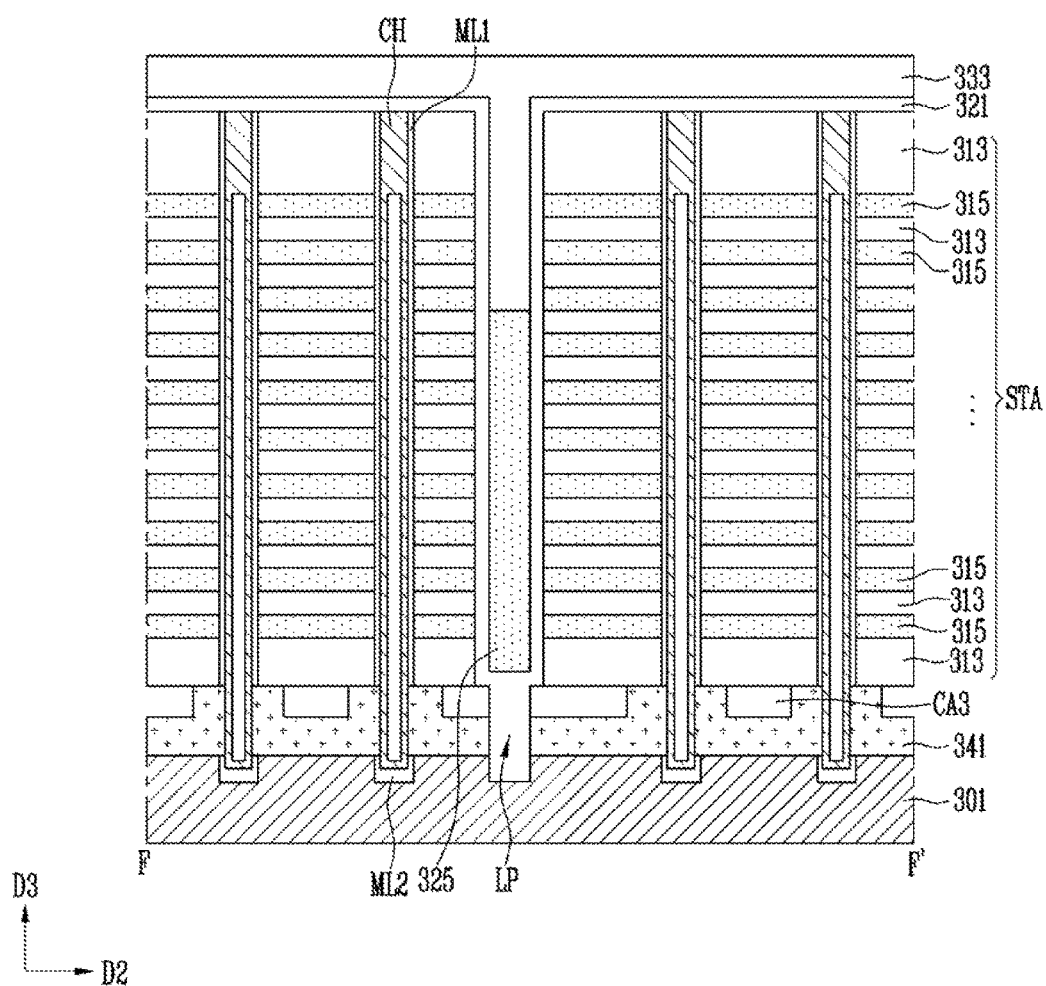

SEMICONDUCTOR DEVICE AND MANUFACTURING METHOD THEREOF

CROSS-REFERENCE TO RELATED APPLICATION

The present application claims priority under 35 U.S.C. § 119(a) to Korean patent application number 10-2016-0148176, filed on Nov. 8, 2016, the entire disclosure of which is incorporated herein by reference in its entirety.

BACKGROUND

Field of Invention

Various embodiments of the invention relate generally to a semiconductor device and a manufacturing method thereof, and more particularly, to a semiconductor device including a stacked structure and a method of manufacturing the same.

Description of Related Art

A semiconductor device may include memory cells storing data. The memory cells of the semiconductor device may be arranged in three dimensions to obtain a higher degree of integration. A three-dimensional semiconductor device including the three-dimensionally arranged memory cells may include a stacked structure surrounding a channel layer. The stacked structure may include interlayer insulating layers and conductive patterns stacked alternately with each other. The height of the stacked structure may be increased to improve the integration degree. However, structural distortion, such as bending of the stacked structure, may occur during the manufacturing processes of the three-dimensional semiconductor device.

SUMMARY

According to an embodiment, a semiconductor device may include gate stacked structures surrounding channel layers, a common source line filling a separation area between the gate stacked structures adjacent to each other and having an upper surface including first concave portions, and a support insulating layer filling the first concave portions and having sidewalls facing portions of the channel layers.

The first concave portions may be spaced apart from each other in the first direction.

The separation area may include first slits and second slits arranged alternately with each other in the first direction and coupled to each other.

According to an embodiment, a semiconductor device may include gate stacked structures, and a common source line having uneven sidewalls facing the gate stacked structures and arranged between the gate stacked structures. Each of the uneven sidewalls may have depressions and protrusions alternating with each other in a first direction.

According to an embodiment, a semiconductor device may include gate stacked structures, and a common source line arranged between the gate stacked structures and having sidewalls facing the gate stacked structures, wherein depressions and protrusions are formed on the sidewalls, a bottom surface and an upper surface of the common source line.

According to an embodiment, a method of manufacturing a semiconductor device may include forming a stacked structure including first material layers and second material layers stacked alternately with each other, forming first slits passing through the stacked structure and spaced apart from each other in a first direction, filling a lower portion of each of the first slits with a third material layer, filling an upper portion of each of the first slits with a fourth material layer, forming a second slit passing through the first material layers and the second material layers and neighboring the first slits in the first direction when the stacked structure is supported by the third material layer and the fourth material layer, and removing the third material layer through the second slit when the first material layers are supported by the fourth material layer.

The method may further include, when the second material layers include a sacrificial material having an etch rate different from the first material layers, removing the second material layers through the second slit when the first material layers are supported by the fourth material layer, and filling regions from which the second material layers are removed with gate conductive materials.

The stacked structure may be divided into a plurality of gate stacked structures by the first slits and the second slit when the second material layers include gate conductive materials.

The method may further include forming a protective layer including a material having an etch rate different from the third material layer on a sidewall of each of the first slits before the third material layer and the fourth material layer are formed.

The method may further include forming a sidewall insulating layer on a surface of the second slit and a surface from which the third material layer is removed, partially etching the sidewall insulating layer to open a bottom surface of the second slit, and forming a common source line on the sidewall insulating layer to fill the second slit and a region from which the third material layer is removed.

BRIEF DESCRIPTION OF THE DRAWINGS

FIGS. 4 to 11C are diagrams illustrating a method of manufacturing a semiconductor device, according to an embodiment of the present invention;

FIGS. 17A to 17C are cross-sectional views taken along lines "F-F'", "G-G'" and "H-H'" of FIG. 16, respectively;

DETAILED DESCRIPTION

Figure 1:
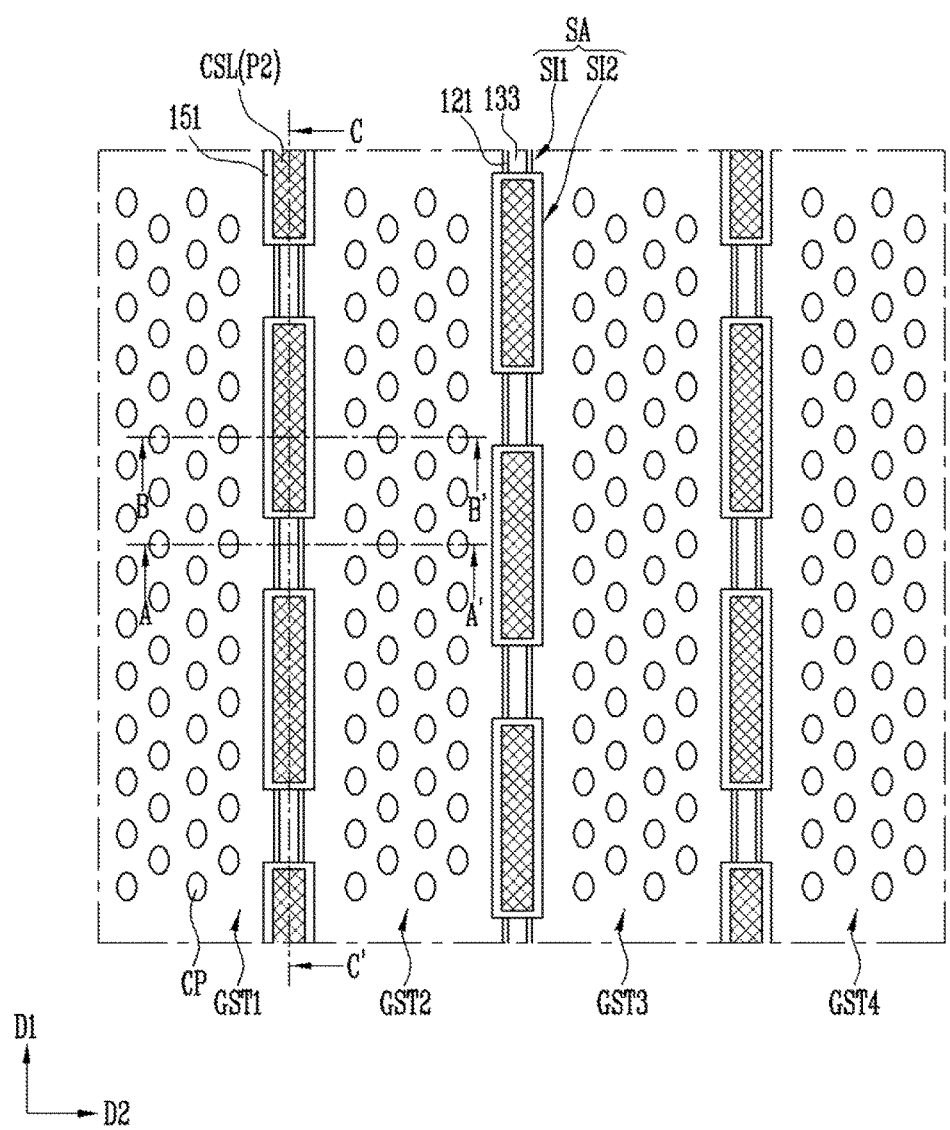
FIG. 1 is plan view Illustrating gate structures of a semiconductor device and structures separating the gate structures, according to an embodiment of the present invention.

Hereinafter, various exemplary embodiments of the present invention will be described in detail with reference to the accompanying drawings. Various modifications and changes may be applied to the illustrated exemplary embodiments. In addition, other embodiments including changes, equivalents, or alternatives thereof may be envisaged by those skilled in the art to which the present invention pertains after reading the present disclosure without departing from the spirit and technical scope of the present invention.

Various embodiments of the present invention are directed to an improved three-dimensional semiconductor memory device having an enhanced structural stability and a manufacturing method thereof.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, b, and C.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 is a plan view illustrating gate structures of a semiconductor device and structures separating the gate structures, according to an embodiment of the present invention. FIG. 1 is a plan view taken along a plane extending in a first direction D1 and a second direction D2 crossing each other on a top surface of the gate structures.

Referring to FIG. 1, the semiconductor device may include gate stacked structures GST1 to GST4 separated by separation areas SA. Each of the separation areas SA is interposed between two consecutive gate stacked structures and extends in the first direction D1. Each of the separation areas is adjacent to two consecutive gate stacked structures. A plurality of cell pillars CP may pass through each of the gate stacked structures GST1 to GST4. Each of the separation areas SA may include first slits SI1 and second slits SI2 that are alternately arranged in the first direction D1.

The first slits SI1 may be spaced apart from each other in the first direction D1. Each of the second slits SI2 may couple neighboring first slits SI1 in the first direction D1. As viewed from the top, the first and second slits SI1 and SI12 may have an elongated, rectangular shape extending in the D1 direction. The second slits S12 may be longer than the first slits SI1 in the D1 direction. The second slits SI2 may be wider than the second slits in the D2 direction. The first and second slits SI1 and SI12 may have a common axis of symmetry extending along the D1 direction.

A common source line CSL may fill each of the separation areas SA. The common source line CSL may extend in the first direction D1. The common source line CSL may be divided into first portions P1 (see FIG. 2C) arranged in the first slits SI1 and second portions P2 arranged in the second slits S12. The structure of the common source line CSL will be described in more detail with reference to FIGS. 2A to 3.

The common source line CSL may be separated from the gate stacked structures GST1 to GST4 by a protective layer 121 or a sidewall insulating layer 151. The protective layer 121 may be formed on sidewalls of each of the first slits SI1. The sidewall insulating layer 151 may be formed on sidewalls of each of the second slits SI2.

The common source line CSL may include first concave portions filled with a support insulating layer 133. The first concave portions may be arranged in the first slits SI1 and spaced apart from each other in the first direction D1. The structure of the first concave portions will be described in more detail with reference to FIG. 3.

The sidewall insulating layer 151 may extend along the boundary between the common source line CSL and the support insulating layer 133.

The cell pillars CP passing through each of the gate stacked structures GST1 to GST4 may be arranged in a matrix format in the first and the second directions D1 and D2. The cell pillars CP arranged in a line in the first direction D1 may form a column. The cell pillars CP may be divided into a plurality of columns. To increase the arrangement density of the cell pillars CP, the columns of the cell pillars CP may be arranged in a zigzag pattern.

Figure 2A:
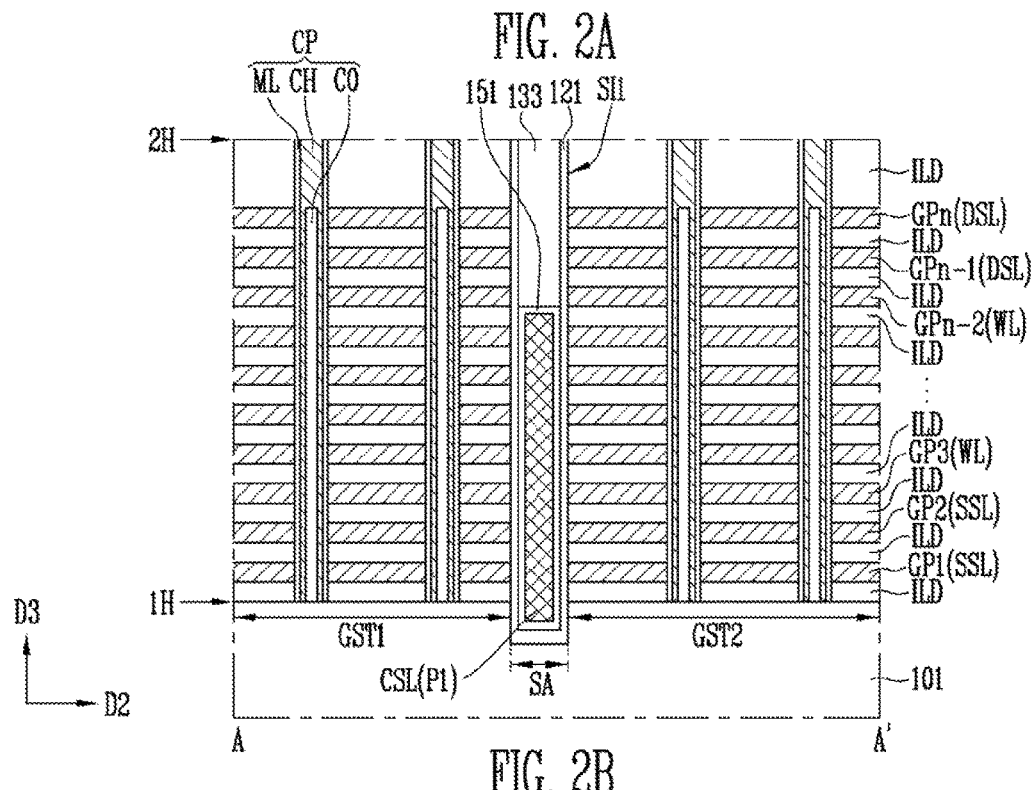
FIGS. 2A to 2C are cross-sectional views taken along lines "A-A'", "B-B'" and "C-C'" of FIG. 1, respectively.
Figure 2B:
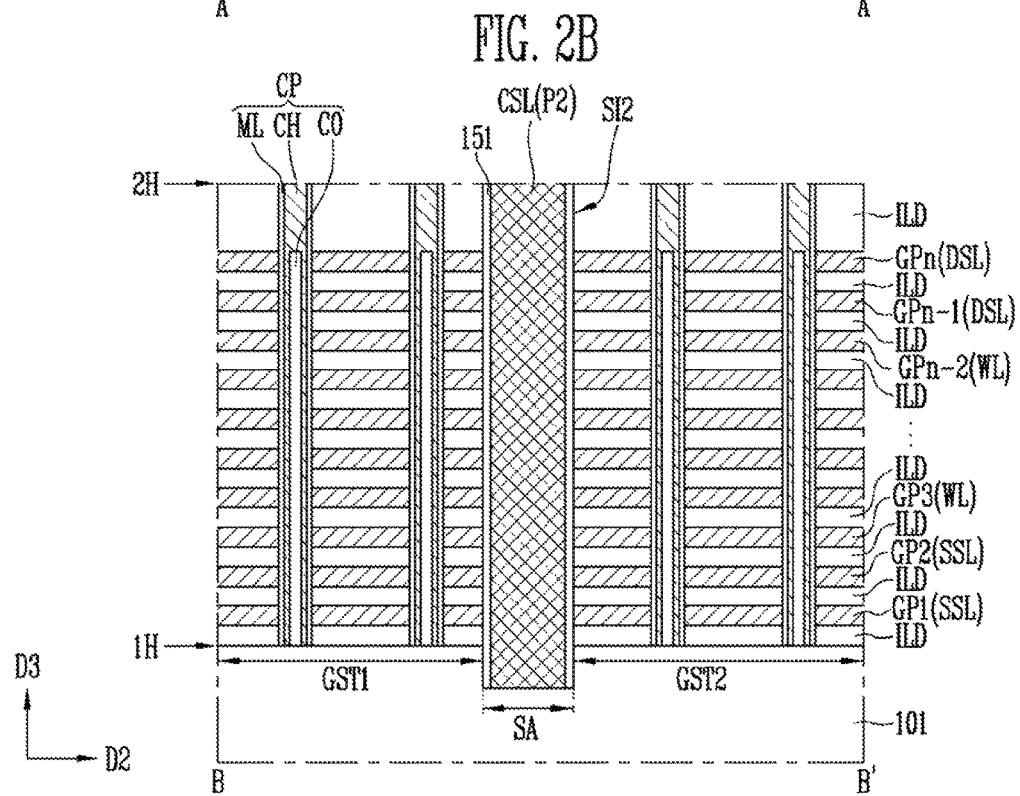
Figure 2C:
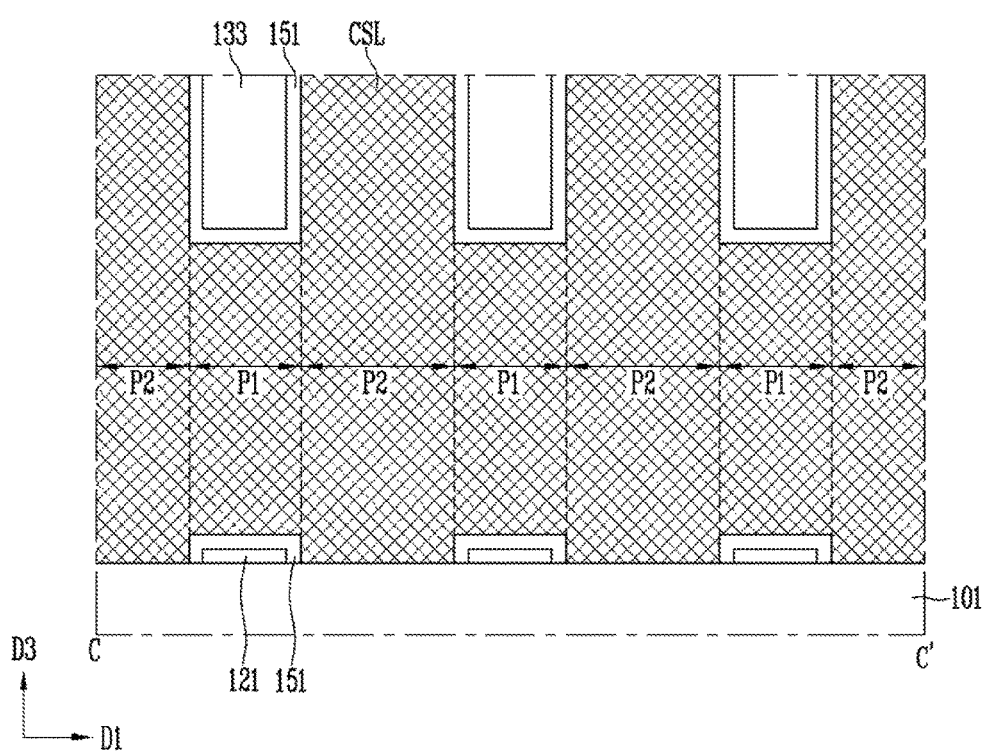

FIGS. 2A to 2C are cross-sectional views taken along "A-A'", "B-B'" and "C-C'" of FIG. 1, respectively. More specifically, FIG. 2A is a cross-sectional view taken along line A-A'" of FIG. 1. FIG. 2B is a cross-sectional view taken along line "B-B'" of FIG. 1. FIG. 2C is a cross-sectional view taken along line "C-C'" of FIG. 1.

Referring to FIGS. 2A and 2B, each of the gate stacked structures GST1 and GST2 may Include conductive patterns GP1 to GPn and interlayer insulating layers ILD that are alternately stacked in a third direction D3. The third direction D3 may perpendicularly cross the first and second directions D1 and D2. Each of the gate stacked structures GST1 and GST2 may surround the cell pillars CP.

Each of the cell pillars CP may include a channel layer CH. Each of the cell pillars CP may further include a multilayer memory layer ML surrounding the channel layer CH. Each of the cell pillars CP may further include a core insulating layer CO surrounded by the channel layer CH. More specifically, the core insulating layer CO may extend centrally along the cell pillar CP with its lowermost surface in direct contact with a source layer 101 and its uppermost surface being substantially at the same level as the upper surface of an uppermost conductive pattern GPn (DSL). The channel layer CH may surround the sidewall of the core insulating layer CO and also extend above the top surface of the core layer CO filling the space within the cell pillar CP that is at the same level with the uppermost interlayer layer ILD except for the area occupied by the multilayer memory layer ML. The multilayer memory layer ML extends conformally along the entire extent of the inner sidewall of the cell pillar CP.

Each of the channel layers CH surrounded by the gate stacked structures GST1 and GST2 may contact a source layer 101 arranged below the gate stacked structures GST1 and GST2. The source layer 101 may be a source conductive layer or a semiconductor layer, deposited on a semiconductor substrate (not shown). For example, the source layer 101 may be a doped silicon layer deposited on the semiconductor substrate. In another example, the source layer 101 may be formed by injecting impurities into the semiconductor substrate from the surface thereof to a predetermined depth.

The multilayer memory layer ML may include a tunnel insulating layer, a data storage layer, and a first blocking insulating layer. The multilayer memory layer ML may extend along interfaces between the channel layer CH and each of the gate stacked structures GST1 and GST2. The tunnel insulating layer may include a silicon oxide layer capable of tunneling charges. The data storage layer may include a silicon nitride layer capable of trapping charges. The first blocking insulating layer may include a silicon oxide layer capable of blocking charges.

The core insulating layer CO may fill a central area of the channel layer CH.

The conductive patterns GP1 to GPn may serve as a source selection line SSL, word lines WL and a drain selection line DSL. The source selection line SSL may be configured as a gate of a source selection transistor, the word lines WL may be configured as gates of memory cells, and the drain selection line DSL may be configured as a gate of a drain selection transistor.

The lowermost conductive pattern GP1 may serve as the source selection line SSL. However, in addition to the conductive pattern GP1, the conductive pattern GP2, i.e., the next lowermost conductive pattern may also serve as the source selection line SSL. Though not shown in FIGS. 2A and 2B, according to design, more than two lowermost conductive patterns may also serve as the source selection line SSL.

The uppermost conductive pattern GPn may serve as the drain selection line DSL. In addition to the uppermost conductive pattern GPn, the next uppermost conductive pattern GPn-1 may also serve as the drain selection line DSL. Though not shown in FIGS. 2A and 2B, more than two uppermost conductive patterns may also serve as the drain selection line DSL.

Conductive patterns between the drain selection line DSL and the source selection line SSL, for example, the conductive patterns CP3 to CPn-2 may serve as the word lines WL.

Each of the gate stacked structures GST1 and GST2 may have a height defined between a first height 1H and a second height 2H. The separation area SA between neighboring gate stacked structures GST1 and GST2 may extend into the source layer 101.

As shown in FIG. 2A, the first slit SI1 of the separation area SA may be filled with the first portion P1 of the common source line CSL and the support insulating layer 133. The first portion P1 of the common source line CSL may fill a lower portion of the first slit SI1. The support insulating layer 133 may fill an upper portion of the first slit SI1 which is defined as the first concave portion of the common source line CSL. The support insulating layer 133 may function as a support when the semiconductor device is manufactured. To stably support the gate stacked structures GST1 and GST2, the support insulating layer 133 may extend from the second height 2H to a position between the first height 1H and the second height 2H and may be formed on the protective layer 121.

For example, the support insulating layer 133 may extend to a depth corresponding to one of the word lines WL. However, the position at which a bottom surface of the support insulating layer 133 is arranged may not be limited to the height shown in FIG. 2A, and the support insulating layer 133 may be located at various heights in the first slit SI1. The support insulating layer 133 may have sidewalls facing portions of the channel layer CH.

The first portion P1 of the common source line CSL and the support insulating layer 133 may be formed on the protective layer 121. The protective layer 121 may extend along the sidewall and the bottom surface of the first slit SI1. The first portion P1 of the common source line CSL may be surrounded by the sidewall insulating layer 151. The sidewall insulating layer 151 may extend between the first portion P1 of the common source line CSL and the support insulating layer 133 and between the first portion P1 of the common source line CSL and the protective layer 121.

As shown in FIG. 2B, the second slit SI2 of the separation area SA may be filled with the second portion P2 of the common source line CSL. The second portion P2 of the common source line CSL may extend in the third direction D3 to fill the second slit SI2 so that the second portion P2 may be longer than the first portion P1 in the third direction D3. More specifically, the second portion P2 of the common source line CSL may extend from a bottom surface of the second slit SI12 to the second height 2H. Though not shown in FIG. 2B, the common source line CSL may extended to be higher than the second height 2H.

The sidewall insulating layer 151 may extend along the sidewall of the second slit SI2. The second portion P2 of the common source line CSL may be insulated from the gate stacked structures GST1 and GST2 by the sidewall insulating layer 151. The second portion P2 may extend into the source layer 101. A bottom surface of the second portion P2 of the common source line CSL may contact the source layer 101.

Referring to FIG. 2C, the separation area SA may be filled with the common source line CSL including the first portions P1 and the second portions P2 alternating with each other in the first direction D1. Each of the first portions P1 of the common source line CSL may be arranged between the source layer 101 and the support insulating layer 133. Each of the first portions P1 of the common source line CSL may be spaced apart from the source layer 101 by the protective layer 121 and the sidewall insulating layer 151 and may be spaced apart from the support insulating layer 133 by the Insulating layer 151. Each of the second portions P2 of the common source line CSL may contact the source layer 101 and extend to face sidewalls of the support insulating layer 133.

Therefore, the second portions P2 of the common source line CSL may extend in the third direction D3 so that the second portions P2 may be longer than the first portions P1 in the third direction D3.

The protective layer 121 and the sidewall insulating layer 151 including insulating materials may be arranged between each of the first portions P1 and the source layer 101. The sidewall Insulating layer 151 may extend along the sidewalls and the bottom surface of the support insulating layer 133.

Figure 28:
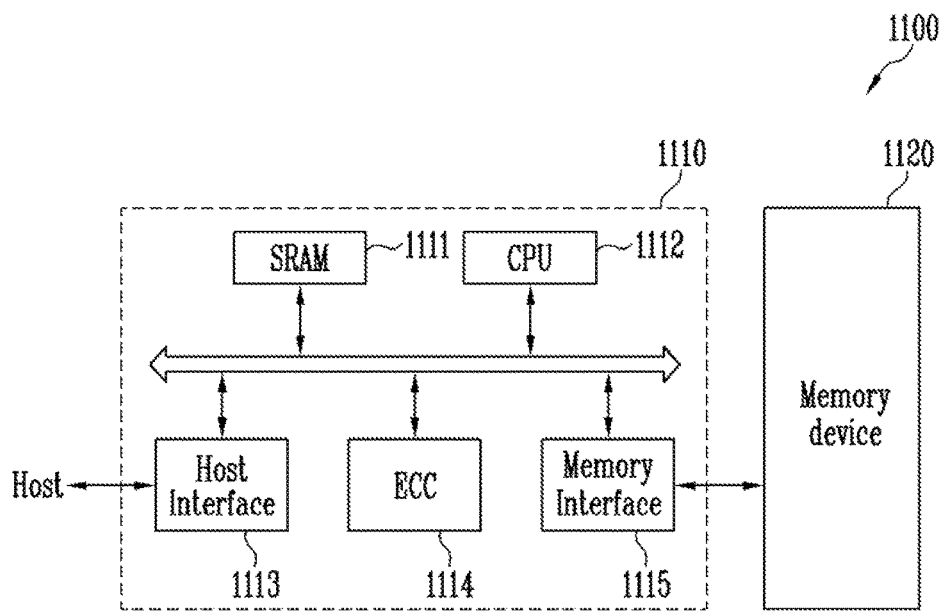
FIG. 28 is a block diagram illustrating a memory system, according to an embodiment of the present invention.

The first portions P1 of the common source line CSL as shown in FIGS. 2A and 2C may be arranged in the first slits SI1 and be lower than the channel layers CH and the gate stacked structures GST1 and GST2. The second portions P2 of the common source line CSL as shown in FIGS. 28 and 2C may be arranged in the second slits SI2 and have a top surface higher than or equal to those of the channel layers CH and gate stacked structures GST1 and GST2. FIG. 11B and etc. show the second portions P2 having a top surface higher than those of the channel layers CH and the gate stacked structures GST1 and GST2.

The process of forming the first slits SI1 may be differentiated from the process of forming the second slits SI12. The protective layer 121 may remain in the first slits SI1 and may not remain in the second slits SI12. A width of each of the first slits SI1 in the second direction D2 may be different from a width of each of the second slits S12 in the second direction D2. The common source line CSL may have a sidewall facing the channel layers CH or the gate stacked structures GST1 and GST2.

Figure 3:
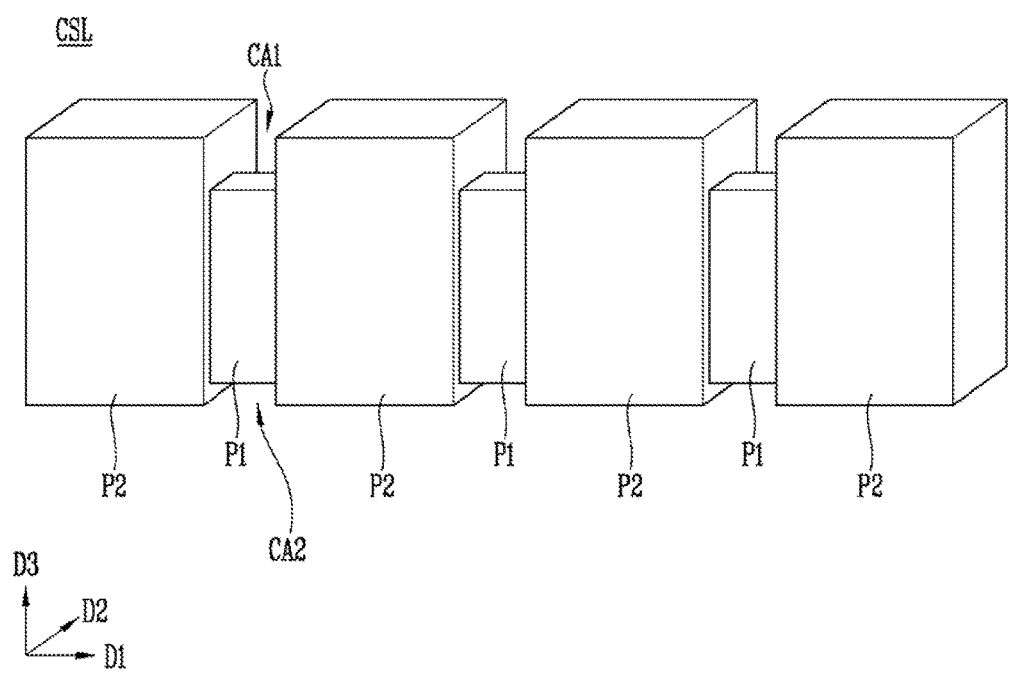
FIG. 3 is a diagram illustrating a common source line, according to an embodiment of the present invention.

FIG. 3 is a diagram illustrating a common source line, according to an embodiment of the present invention.

Referring to FIG. 3, the common source line CSL may have an upper surface including first concave portions CA1 spaced apart from each other in the first direction D1 and a bottom surface including second concave portions CA2 spaced apart from each other in the first direction D1. The second concave portions CA2 may overlap with the first concave portions CA1.

Each of the first concave portions CA1 may be filled with the sidewall insulating layer 151 and the support insulating layer 133 as shown in FIG. 2C. Each of the second concave portions CA2 may be filled with the protective layer 121 and the sidewall insulating layer 151 as shown in FIG. 2C.

In addition, according to an embodiment, the common source line CSL in the second direction D2 may have uneven sidewalls having depressions and protrusions. The depressions and protrusions of the sidewalls of the common source line CSL may alternate with each other in the first direction D1. The first concave portion CA1 may be formed on the upper surface of the common source line CSL and the second concave portion CA2 may be formed on the bottom surface of the common source line CSL. As a result, the depressions and protrusions may be formed on the sidewalls, the upper surface, and the bottom surface of the common source line CSL.

FIGS. 4 to 11C are diagrams illustrating a method of manufacturing a semiconductor device, according to an embodiment of the present invention.

Figure 4:
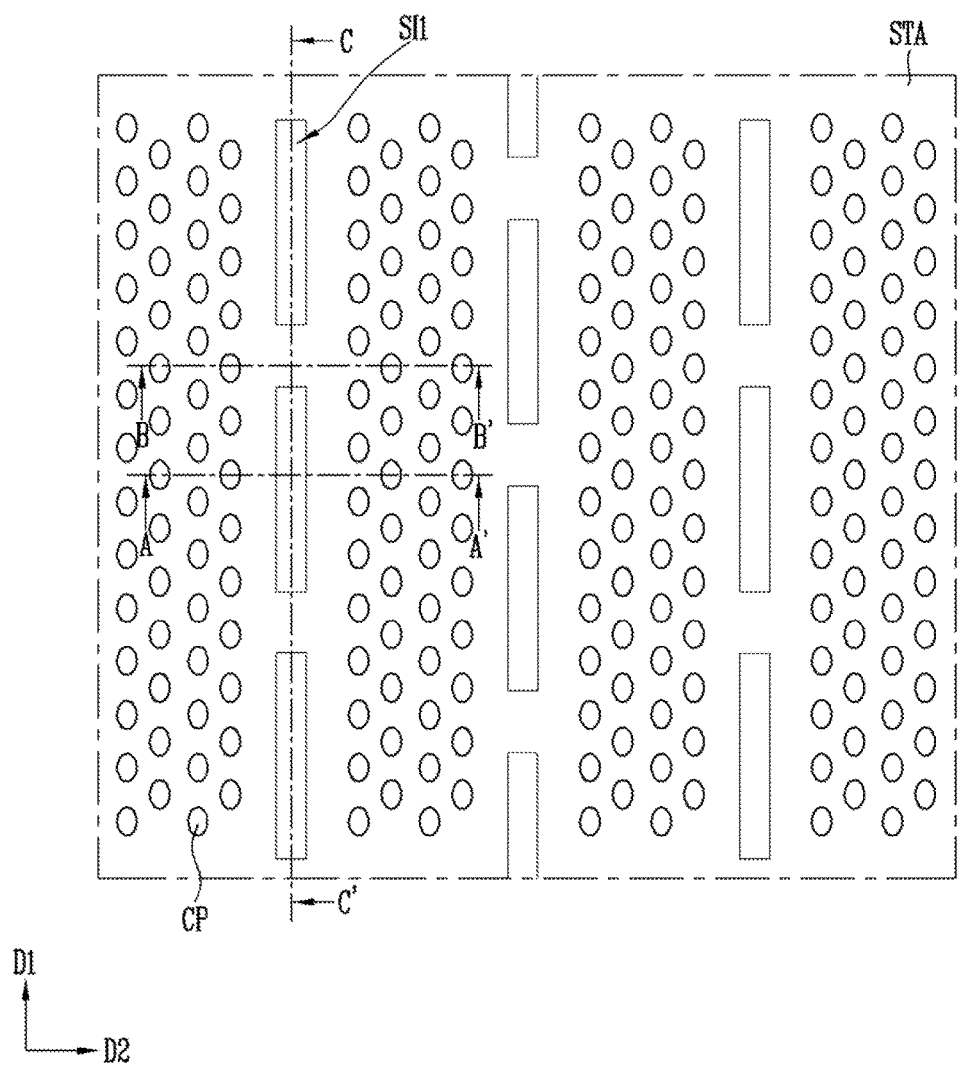
Figure 5A:
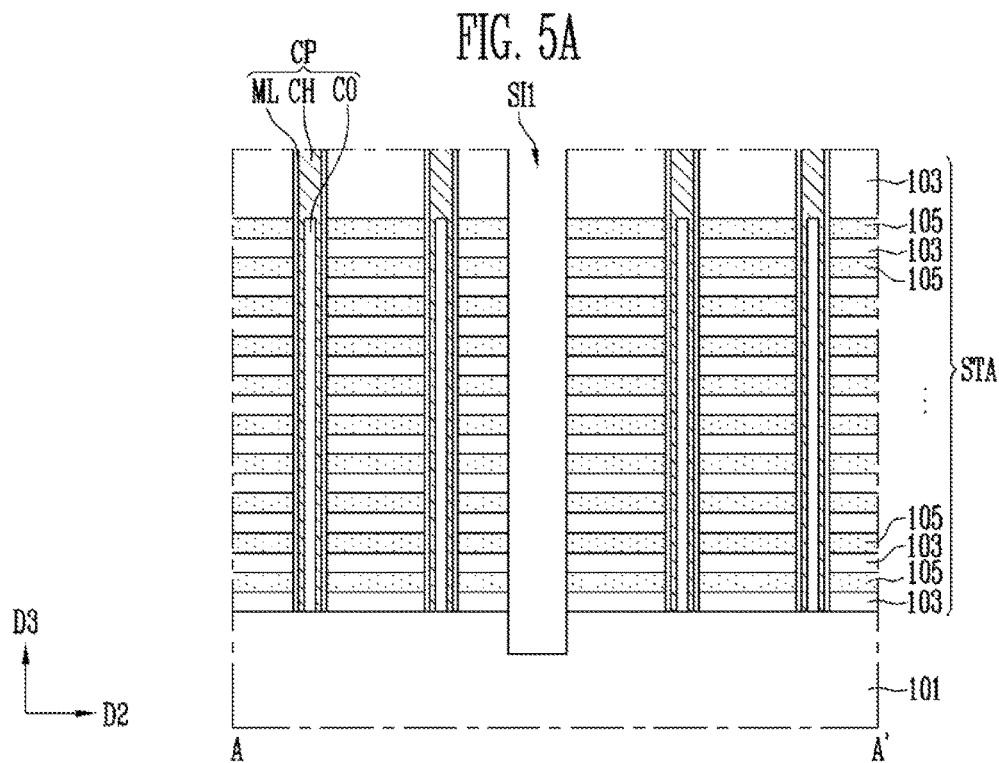
Figure 5B:
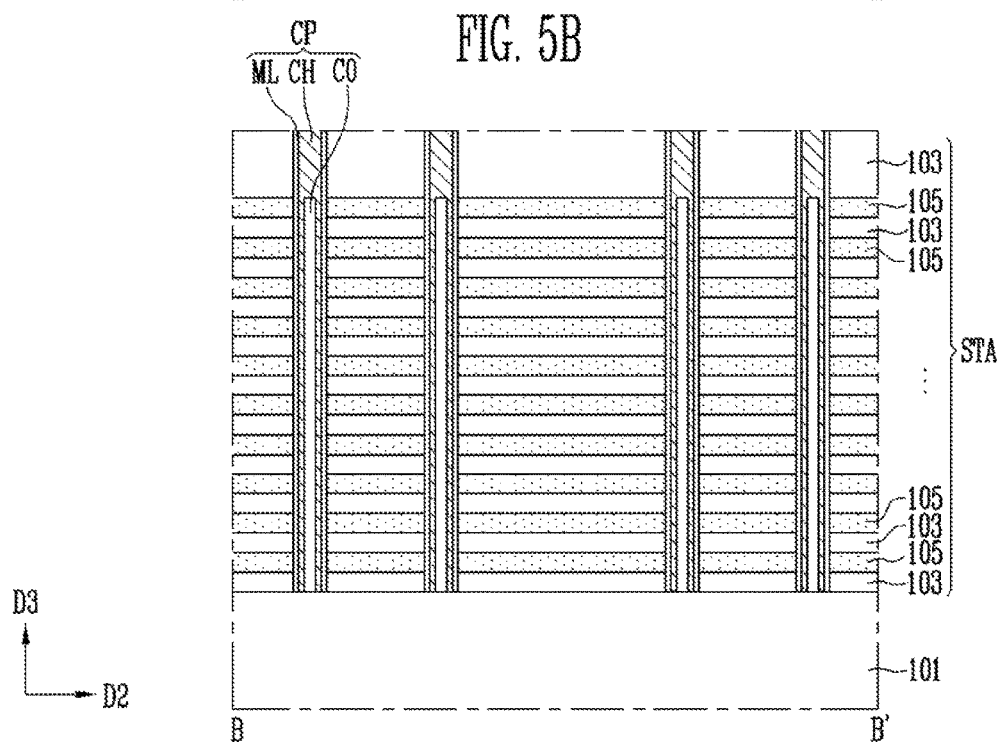

FIGS. 4 to 5C are a plan view and cross-sectional views Illustrating processes of forming first slits. More specifically, FIG. 4 is a plan view, FIG. 5A is a cross-sectional view taken along line "A-A'" of FIG. 4, FIG. 5B is a cross-sectional view taken along line "B-B'" of FIG. 4, and FIG. 5C is a cross-sectional view taken along line "C-C'" of FIG. 4.

Referring to FIGS. 4 to 5C, a stacked structure STA may be formed in which first slits SI1 may be formed through the stacked structure STA. As shown in FIGS. 5A to 5C, first material layers 103 and second material layers 105 may be alternately stacked over a source layer 101 to form the stacked structure STA.

The first material layers 103 and the second material layers 105 may include different materials from each other. The first material layers 103 may include an insulating material for an interlayer insulating layer. The second material layers 105 may include a sacrificial material having an etch rate different from the first material layers 103. For example, the first material layers 103 may include silicon oxide layers, and the second material layers 105 may include nitride layers. More specifically, the second material layers 105 may include silicon nitride layers.

Subsequently, cell pillars CP may be formed by etching the first material layers 103 and the second material layers 105 so that the cell pillars CP may pass through the first material layers 103 and the second material layers 105. The processes of forming the cell pillars CP may include etching the first material layers 103 and the second material layers 105 to form channel holes, forming a multilayer memory layer ML on the surface of each of the channel holes, removing the multilayer memory layer ML formed on the bottom of each of the channel holes so that the multilayer memory layer ML may remain on the sidewall of each of the channel holes, and forming a channel layer CH on the multilayer memory layer ML.

The processes of forming the channel holes may include forming a mask pattern (not Illustrated) over the stacked structure STA by using a photolithography process, etching the first material layers 103 and the second material layers 105 by using the mask pattern as an etch barrier, and removing the mask pattern.

The multilayer memory layer ML may be formed by sequentially stacking a first blocking insulating layer, a data storage layer and a tunnel insulating layer on the sidewall of each of the channel holes. The channel layer CH may surround a core insulating layer CO. The processes of forming the core insulating layer CO and the channel layer CH may include forming a first semiconductor layer on the multilayer memory layer ML in each of the channel holes, filling a central area of each of the channel holes opened by the first semiconductor layer with the core insulating layer CO, partially etching an upper portion of the core insulating layer CO, and filling a region from which the core insulating layer CO is etched with a second semiconductor layer. The second semiconductor layer may contact the first semiconductor layer and include impurities having a higher concentration than the first semiconductor layer. The first semiconductor layer may or may not be doped with impurities. The first and second semiconductor layer may form the channel layer CH and include a silicon layer.

Subsequently, the first material layers 103 and the second material layers 105 through which the cell pillars CP pass may be etched to form the first slits SI1 passing through the first material layers 103 and the second material layers 105. The first slits SI1 may extend into the source layer 101. To perform the etching process for forming the first slits SI1, a mask pattern (not illustrated) functioning as an etch barrier may be formed on the top surface of the stacked structure STA through a photolithography process. The mask pattern may then be removed after the first slits SI1 are formed.

Referring to FIG. 4, the first slits SI1 may be spaced apart from each other in the first and the second directions D1 and D2. The first slits SI1 arranged in a row in the first direction D1 may be arranged between neighboring cell pillar columns. The first slits SI1 may be adjacent to each other in the second direction D2 with a plurality of cell pillar columns interposed therebetween. The first slits SI1 may be arranged in a zigzag pattern in the second direction D2. Each of the first slits SI1 may be formed in a bar shape extending in the first direction D1.

Figure 6A:
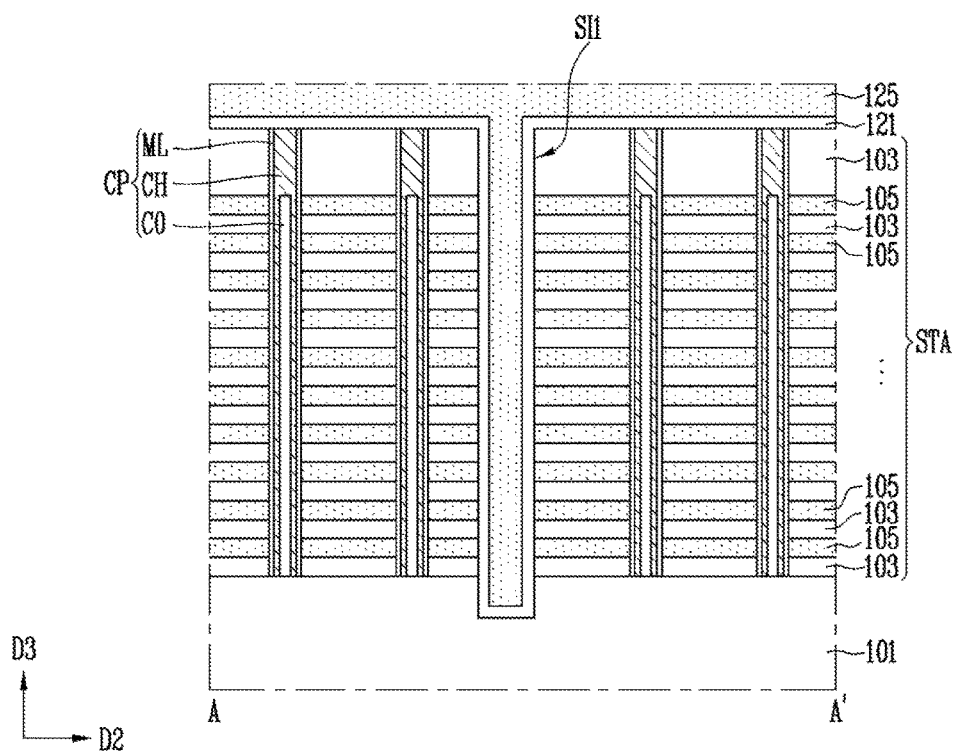
Figure 6B:
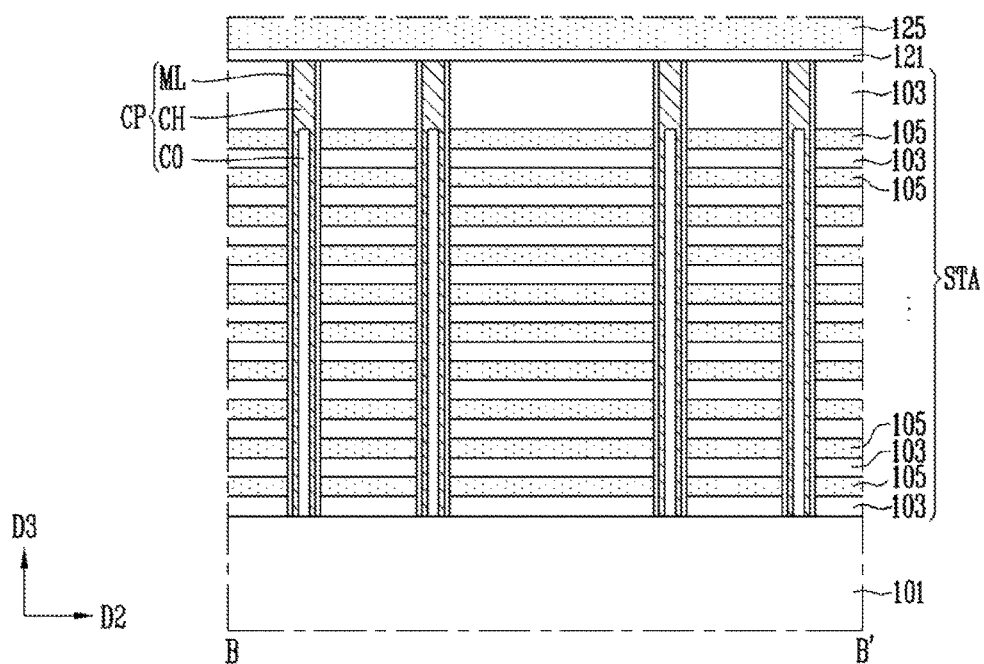
Figure 6C:
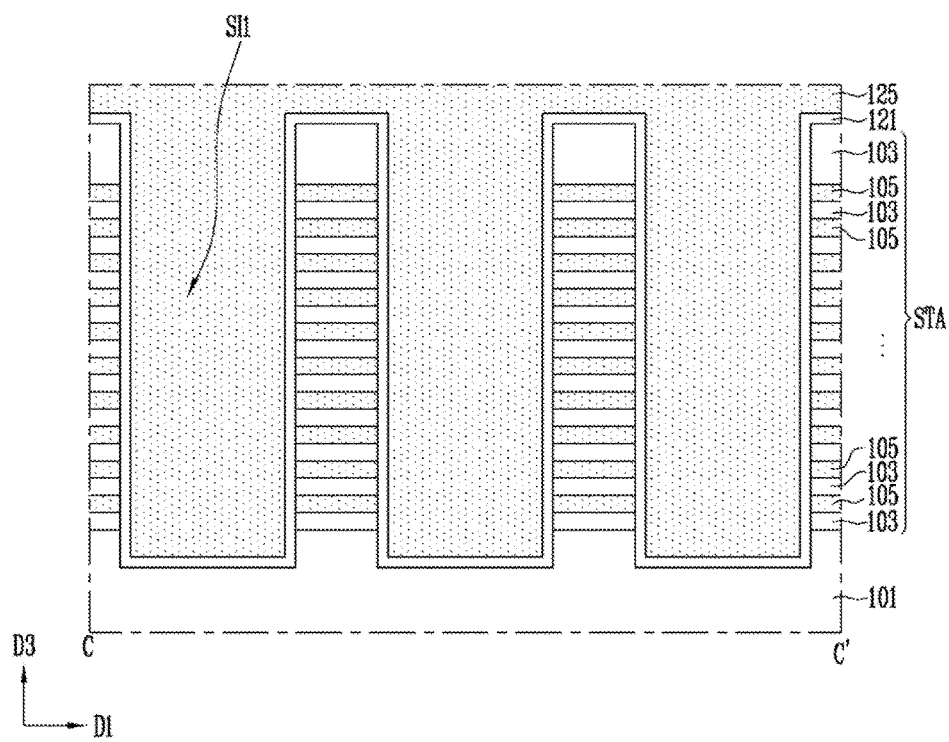

FIGS. 6A to 6C are cross-sectional views illustrating processes of forming a third material layer.

Referring to FIGS. 6A to 6C, a protective layer 121 may be formed over the surfaces of the first slits SI1 passing through the stacked structure STA. The protective layer 121 may extend to an upper surface of the stacked structure STA so as to cover the cell pillars CP.

The protective layer 121 may include a material having an etch rate different from a third material layer 125 which will be formed in subsequent processes. The protective layer 121 may include an insulating material. For example, the protective layer 121 may include an oxide layer.

Subsequently, the third material layer 125 may be formed on the protective layer 121. The third material layer 125 may completely fill the first slits SI1. The third material layer 125 may also extend to cover the upper surface of the stacked structure STA. The third material layer 125 may include a material having an etch rate different from the first material layers 103. The third material layer 125 may include a nitride, or include the same material as the second material layers 105. More specifically, the third material layer 125 may include a silicon nitride layer.

FIGS. 7A to 7C are cross-sectional views Illustrating a third material layer etching process and a fourth material layer forming process.

Referring to FIGS. 7A to 7C, a portion of the third material layer 125 may be etched to open an upper portion of each of the first slits SI1. An etch process may be controlled so that the third material layer 125 may remain and fill a lower portion of each of the first slits SI1. When the third material layer 125 is etched, the protective layer 121 covering the upper surface of the stacked structure STA may be etched by a predetermined thickness. When the third material layer 125 is etched, the protective layer 121 may protect the second material layers 105 so as not to expose the second material layers 105.

Subsequently, the region from which the third material layer 125 is removed may be filled with a support insulating layer 133. The support insulating layer 133 may be formed to completely fill the upper portion of each of the first slits SI1. The support Insulating layer 133 may include a fourth material layer. The fourth material layer may extend to cover the upper surface of the stacked structure STA. The fourth material layer may include a material having an etch rate different from the second material layers 105 and the third material layer 125. For example, the fourth material layer may include an oxide layer.

By performing the above-described processes, the stacked structure STA may be supported by the third material layer 125 and the fourth material layer (i.e., the support insulating layer 133) filling each of the first slits SI1.

Figure 8:
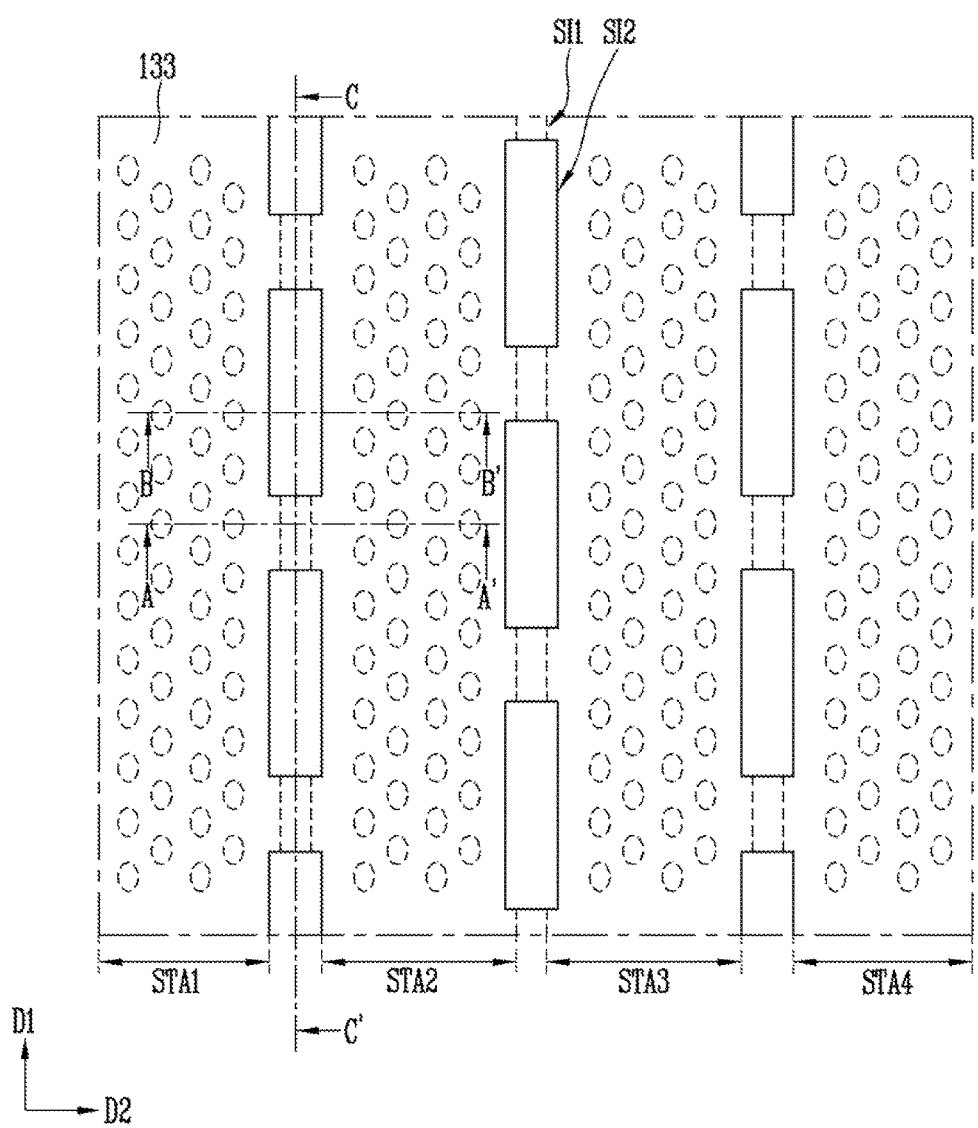
Figure 9A:
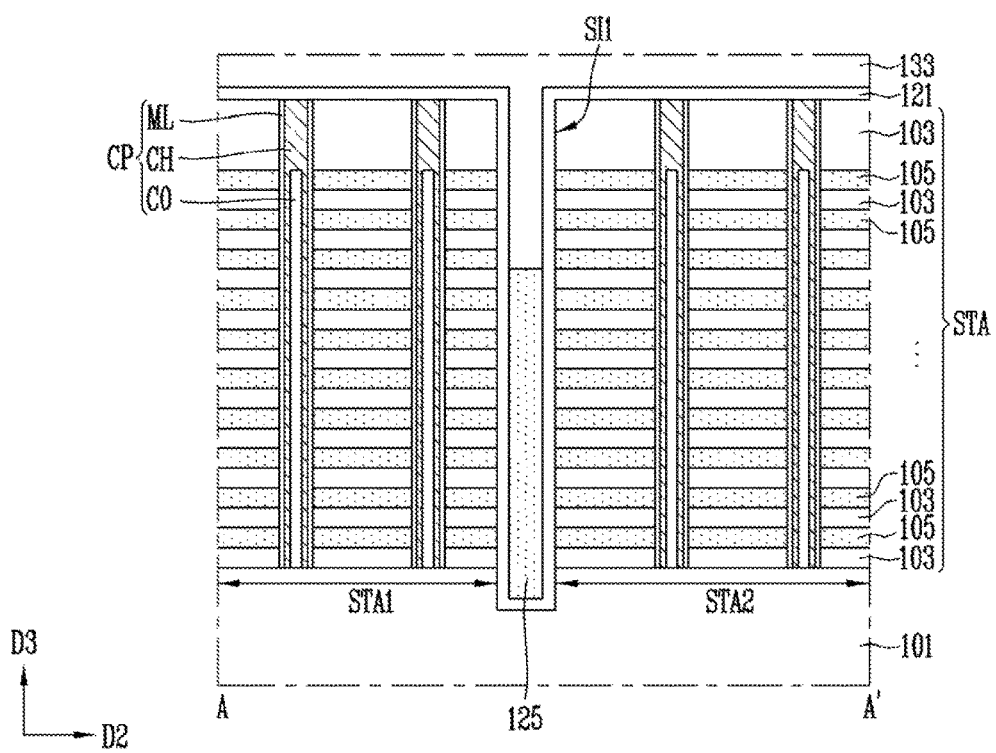
Figure 9B:
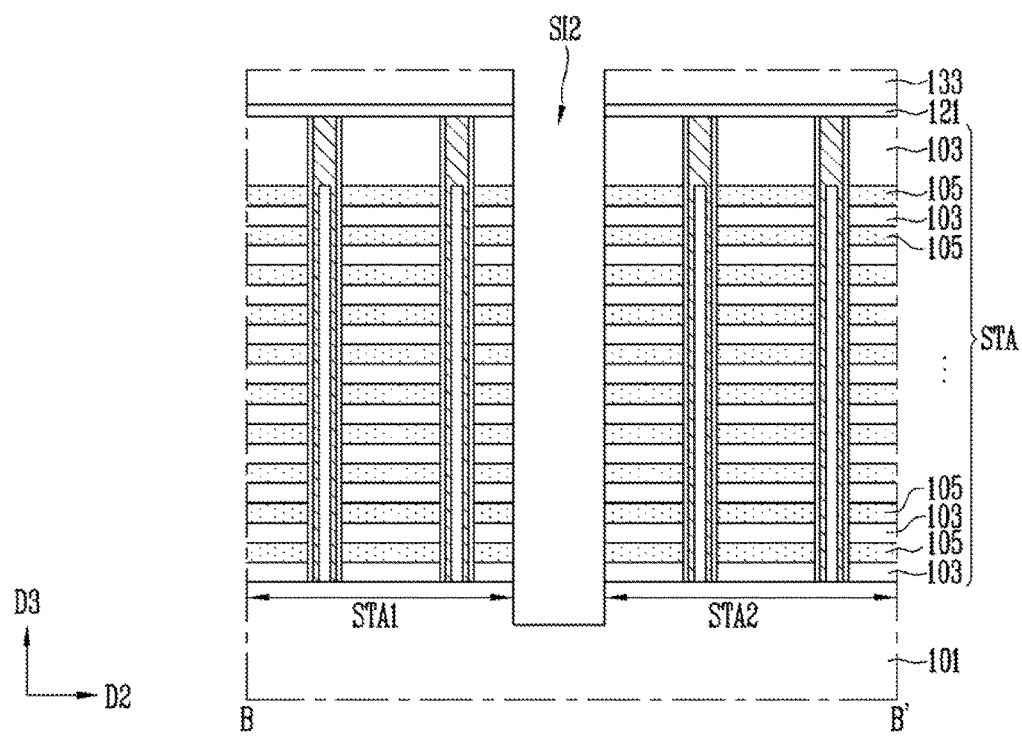
Figure 9C:
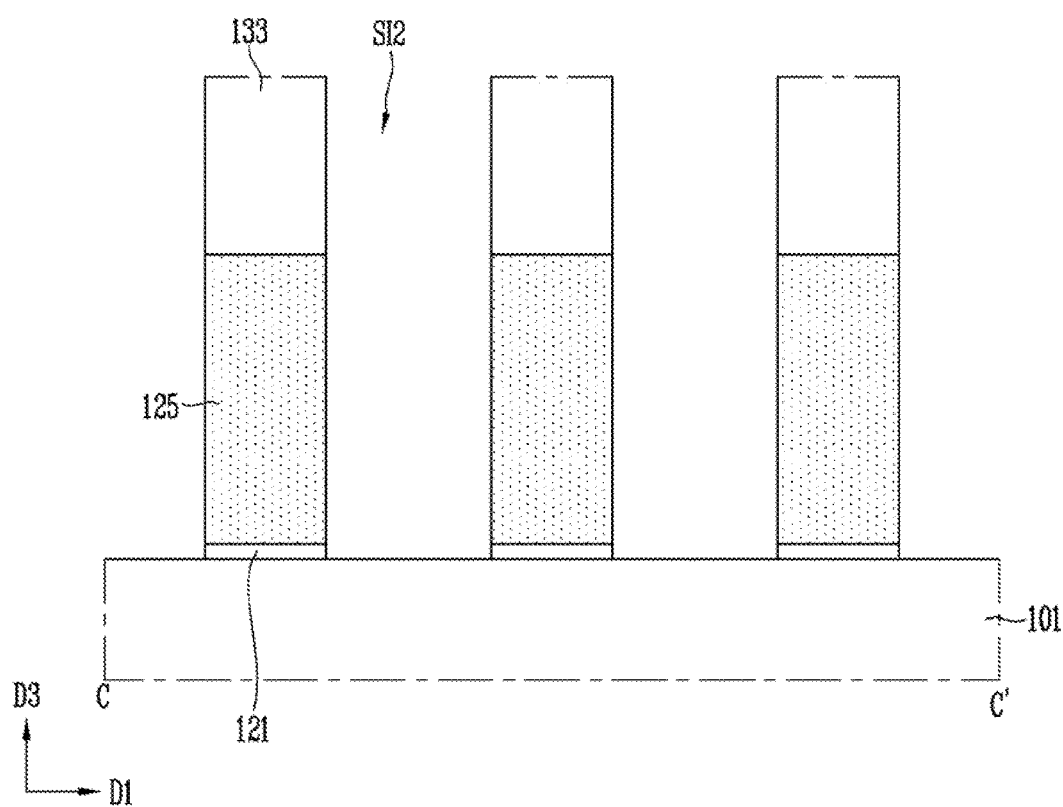

FIGS. 8 to 9C are a plan view and cross-sectional views illustrating processes of forming second slits. More specifically, FIG. 8 is a plan view, FIG. 9A is a cross-sectional view taken along line "A-A'" of FIG. 8, FIG. 98 is a cross-sectional view taken along line "B-B'" of FIG. 8, and FIG. 9C is a cross-sectional view taken along line "C-C'" of FIG. 8.

Referring to FIGS. 8 to 9C, second slits SI2 may pass through the first material layers 103 and the second material layers 105 between neighboring first slits SI1 in the first direction D1. The second slits SI2 may be coupled to the first slits SI1. The second slits SI2 may extend in the D1 direction to partially overlap with the first slits SI1. The second material layers 105 and the third material layer 125 may be exposed by sidewalls of each of the second slits SI2.

When the second slits SI2 are formed, portions of the protective layer 121, the third material layer 125 and the fourth material layer 133 which overlap with the second slits SI2 may be removed. The process of forming the second slits SI2 may include forming a mask pattern (not illustrated) on the stacked structure STA through a photolithography process, etching the stacked structure STA by using the mask pattern as an etch barrier, and removing the mask pattern.

The first material layers 103 and the second material layers 105 may be separated into a plurality of sub-stacked structures STA1 to STA4 through the second slits SI2.

Figure 10C:
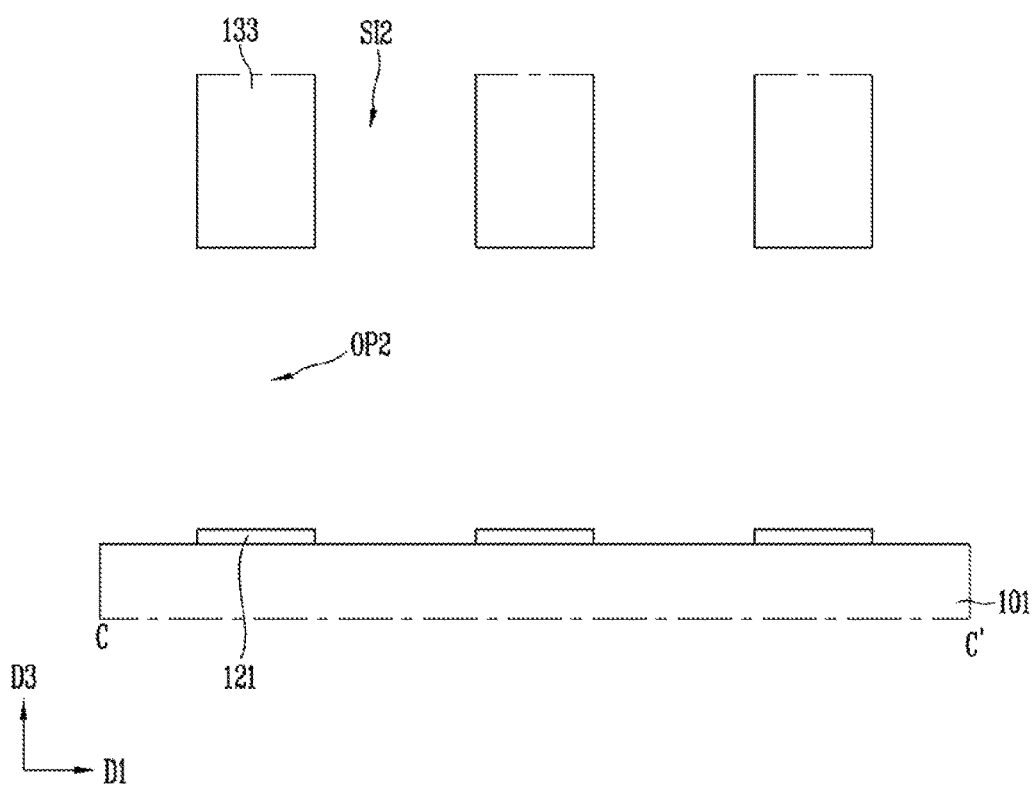

FIGS. 10A to 10C are cross-sectional views illustrating process of forming first openings and second openings.

Referring to FIGS. 10A to 10C, when the first material layers 103 are supported by the fourth material layer (i.e., the support insulating layer 133), the second material layers (105 of FIGS. 9A and 9B) and the third material layer (125 of FIGS. 9A and 9C) may be removed through the second slits SI2. Therefore, first openings OP1 may be formed in regions from which the second material layers are removed, and second openings OP2 may be formed in the first slits SI1 from which the third material layer is removed.

The first openings OP1 may be formed between the first material layers 103 and the second openings OP2 may be formed below the support insulating layer 133. Since the second material layers and the third material layer have the same material, an etch process for removing the second material layers and the third material layer may be simplified.

When the first openings OP1 and the second openings OP2 are formed, the first material layers 103, the protective layer 121, and the fourth material layer (i.e., the support insulating layer 133) having an etch rate different from the second material layers and third material layer may not be removed and remain.

The remaining support insulating layer 133 may support some upper layers of the first material layers 103. Therefore, even when an aspect ratio of the sub-stacked structures (STA1 to STA4 of FIG. 8) increases due to a large number of the first material layers 103 and the first openings OP1 formed in the third direction D3, the sub-stacked structures may be supported by the support insulating layer 133. As a result, the support insulating layer 133 may prevent the sub-stacked structures from being bent.

The protective layer 121 may be formed before the third and fourth material layers are formed, and may remain after the third material layer is removed. The protective layer 121 may support the first material layers 103 so that the shape of the first openings OP1 between the first material layers 103 may be maintained. Therefore, the protective layer 121 may prevent the first material layers 103 from being bent when the first openings OP1 are formed.

Figure 11A:
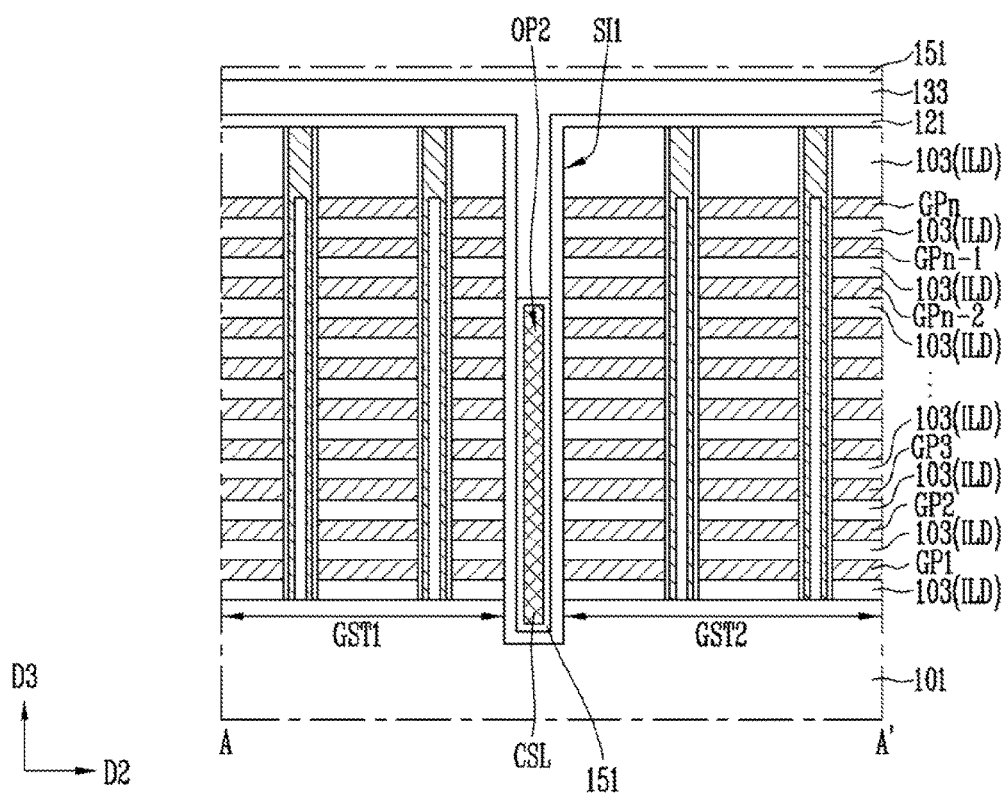
Figure 11B:
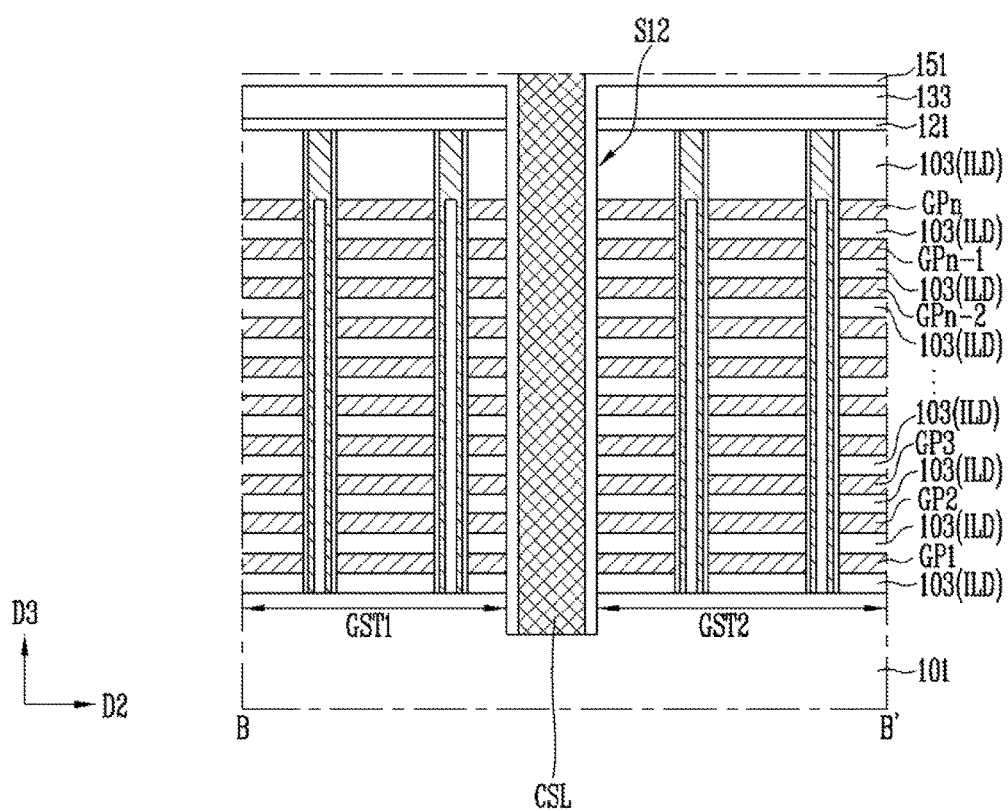
Figure 11C:
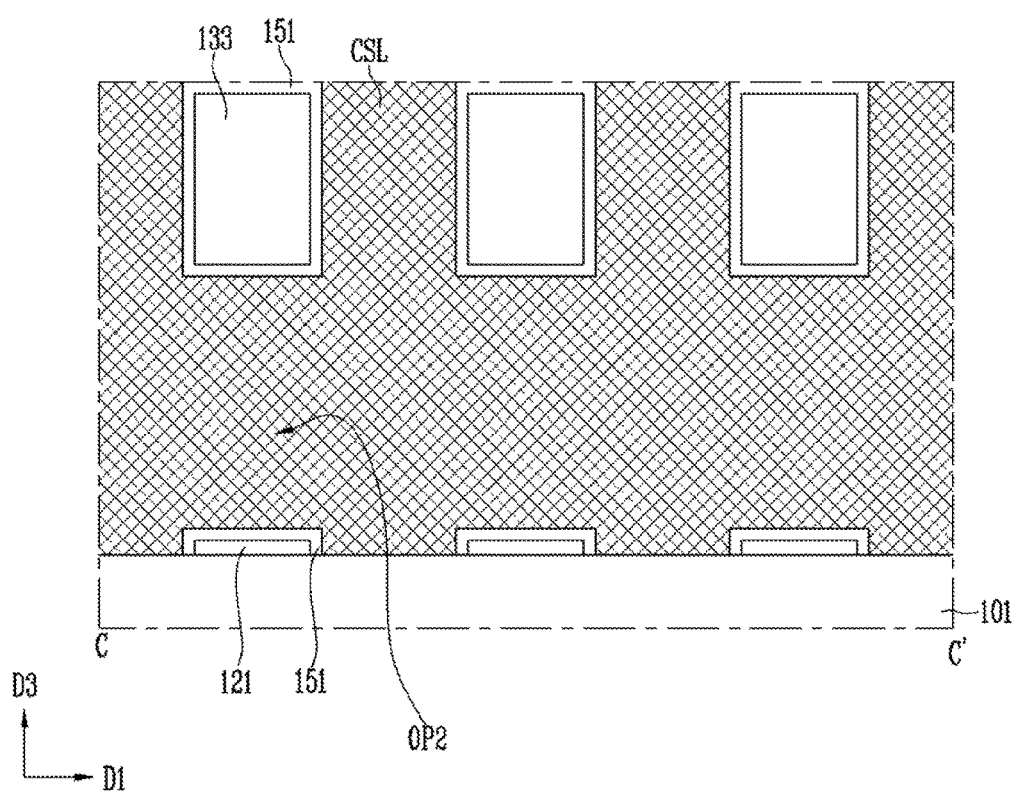

FIGS. 11A to 11C are cross-sectional views illustrating a conductive pattern forming process and a common source line forming process.

Referring to FIGS. 11A to 11C, conductive patterns GP1 to GPn may be formed in each of the first openings OP1 described above with reference to FIGS. 10A and 10B. To form the conductive patterns GP1 to GPn, when the first material layers 103 is supported by the fourth material layer (i.e., the support insulating layer 133), each of the first openings OP1 may be filled with a gate conductive material through the second slits SI2.

Though not shown in FIGS. 11A to 11C, before the conductive patterns GP1 to GPn are formed, a second blocking insulating layer may be further formed over the surfaces of the first openings OP1, the second openings OP2, the second slits SI2 and the support insulating layer 133 as shown in FIGS. 10A and 10B. The conductive patterns GP1 to GPn may be formed on the second blocking insulating layer of the first openings OP1.

The conductive patterns GP1 to GPn may include at least one of polysilicon, metal, and metal silicide layer. When the conductive patterns GP1 to GPn include metal, a low resistance metal, such as tungsten, may be used. When the conductive patterns GP1 to GPn include metal, a barrier metal layer (not illustrated) may be formed over the surfaces of the first openings OP1 as shown in FIGS. 10A and 10B before the conductive patterns GP1 to GPn are formed.

The process of forming the conductive patterns GP1 to GPn may include removing gate conductive materials formed in the first slits SI1 and second slits SI2.

After the conductive patterns GP1 to GPn are formed, a sidewall insulating layer 151 may be formed on the surfaces of the second openings OP2 and the surface of the second slit SI2. The sidewall insulating layer 151 may extend along an upper surface of the support insulating layer 133.

After the sidewall insulating layer 151 is formed, the sidewall Insulating layer 151 may be partially removed to open bottom surfaces of the second slits SI12 so that the source layer 101 may be exposed.

Subsequently, a common source line CSL may be formed to completely fill the second openings OP2 and the second slits SI12. The common source line CSL may include a conductive material and contact the source layer 101 arranged below the bottom surfaces of the second slits S12.

The first material layers 103 shown in FIGS. 11A and 11B may correspond to the interlayer insulating layers ILD described above with reference to FIGS. 2A and 2B.

In FIGS. 4 to 11B, the second material layers 105 of the stacked structure STA formed on the source layer 101 may include sacrificial Insulating materials. However, the invention is not limited thereto.

FIGS. 12A to 13B are cross-sectional views Illustrating a method of manufacturing a semiconductor device, according to an embodiment of the present invention. FIGS. 12A to 13B exemplify that the second material layers of the stacked structure formed on the source layer include gate conductive materials.

Figure 12A:
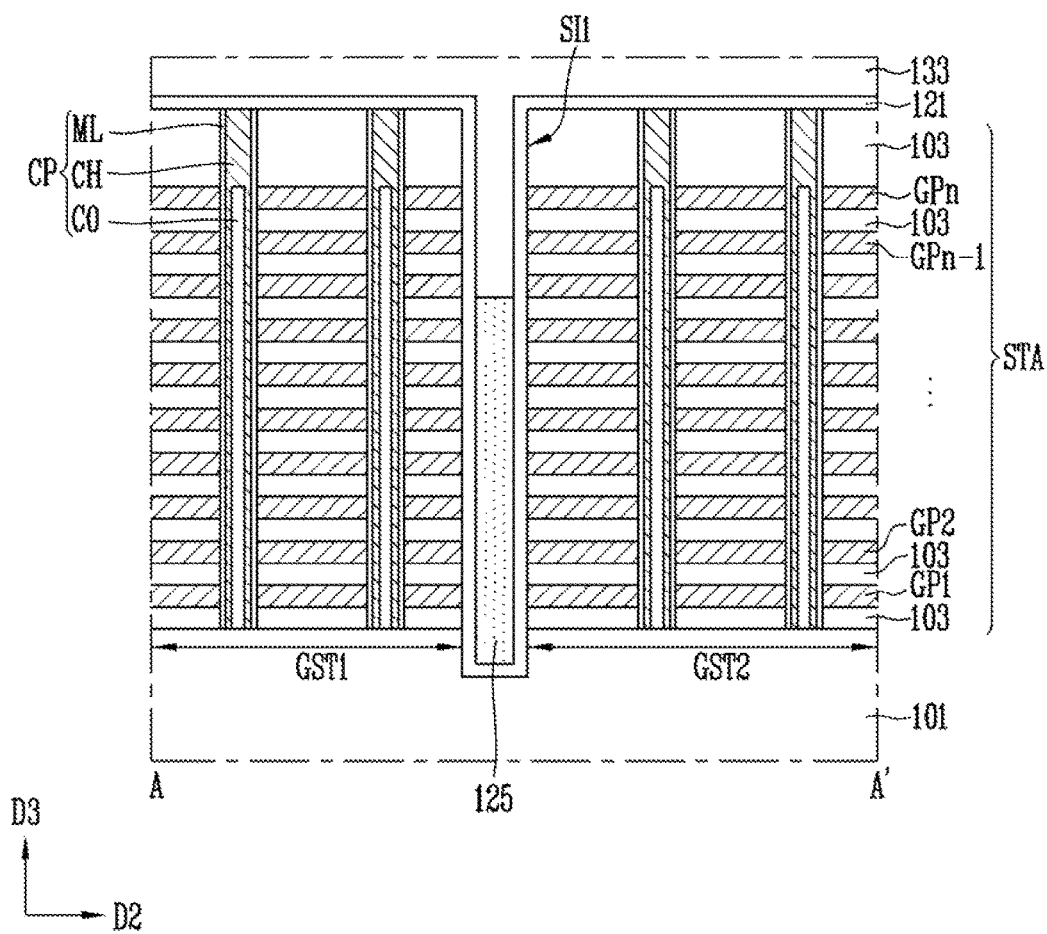
FIGS. 12A to 13B are cross-sectional views illustrating a method of manufacturing a semiconductor device, according to an embodiment of the present invention.
Figure 12B:
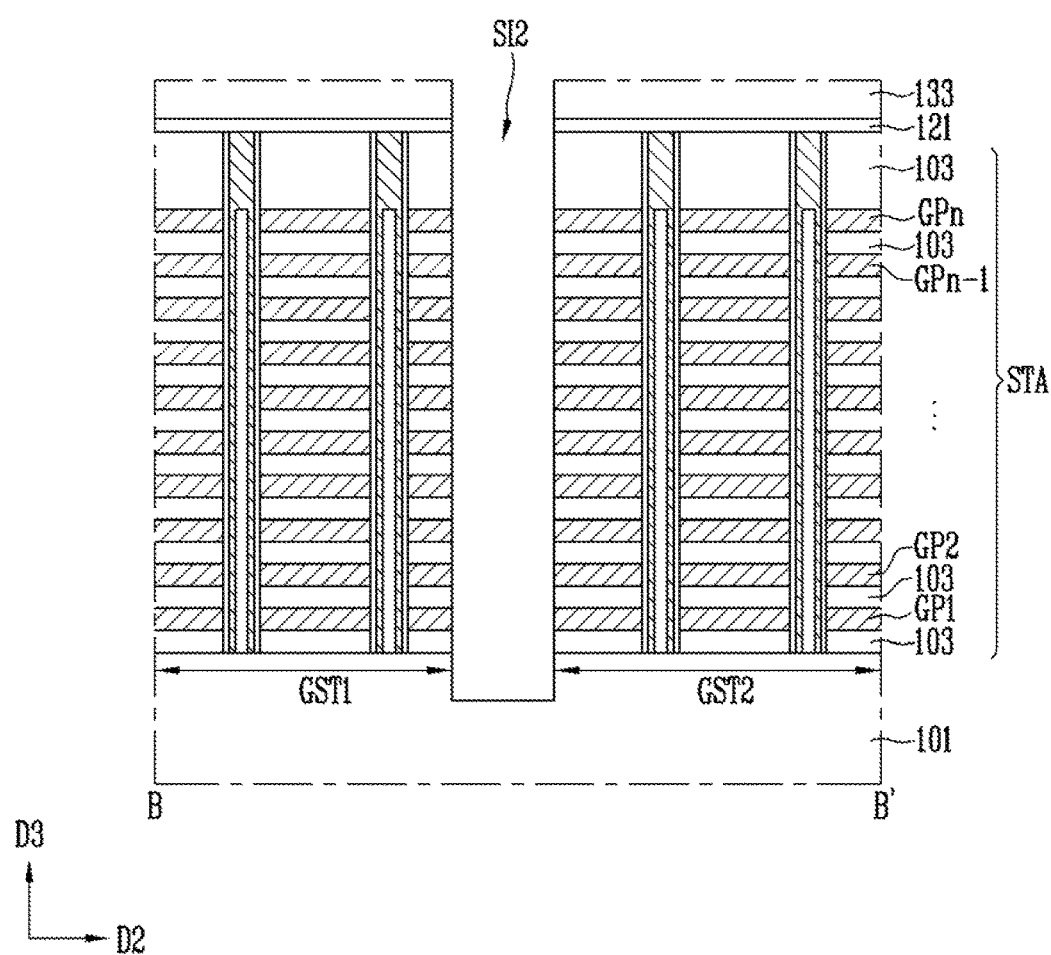

FIGS. 12A and 12B are cross-sectional views illustrating a process of separating the gate stacked structures. FIG. 12A is a cross-sectional view taken along line "A-A'" of FIG. 1. FIG. 12B is a cross-sectional view taken along line "B-B'" of FIG. 1. The cross-sectional view taken along line "C-C'" of FIG. 1 is omitted since it is the same as that in FIG. 9C.

Referring to FIGS. 12A and 12B, first material layers 103 and second material layers including gate conductive materials may be alternately stacked to form a stacked structure STA. The stacked structure STA may be formed on a source layer 101. The source layer 101 and the first material layers 103 may include the same materials as described above with reference to FIGS. 5A to 5C.

Subsequently, cell pillars CP may be formed through the stacked structure STA and contact the source layer 101 below the stacked structure STA. The cell pillars CP may be formed through the processes described above with reference to FIGS. 5A to 5C. Each of the cell pillars CP may include a multilayer memory layer ML, a channel layer CH, and a core insulating layer CO as described above with reference to FIGS. 5A to 5C.

Subsequently, first slits SI1 may be formed using the processes described above with reference to FIGS. 5A to 5C. The planar arrangement of the first slits SI1 may be the same as described above with reference to FIG. 4.

Subsequently, a protective layer 121 and a third material layer 125 may be formed using the processes described above with reference to FIGS. 6A to 6C. The first material layers 103 and the second material layers including the gate conductive materials may have an etch rate different from the third material layer 125. Therefore, the process of forming the protective layer 121 may be omitted. Subsequently, by using the processes described above with reference to FIGS. 7A to 7C, while the third material layer 125 remains in lower portions of the first slits SI1, upper portions of the first slits SI1 may be filled with a fourth material layer. The fourth material layer may be a support insulating layer 133.

Subsequently, second slits SI2 may be formed using the processes described above with reference to FIGS. 8 to 9C. The planar arrangement of the second slits SI2 is the same as described above with reference to FIG. 8.

The stacked structure STA may be divided into a plurality of gate stacked structures GST1 and GST2 by coupling the first slits SI1 and the second slits SI2. The first material layers 103 of each of the gate stacked structures GST1 and GST2 may correspond to the interlayer insulating layers ILD described above with reference to FIGS. 2A and 2B, and the second material layers may correspond to the conductive patterns GP1 to GPn.

The gate stacked structures GST1 and GST2 may be supported by the third material layer 125 filling the lower portion of each of the first slits SI1 and the support insulating layer 133 filling the upper portion of each of the first slits SI1. Therefore, even when the aspect ratio of the gate stacked structures GST1 and GST2 increases, the structural stability of the gate stacked structures GST1 and GST2 may be ensured by the third material layer 125 and the support insulating layer 133.

Figure 13A:
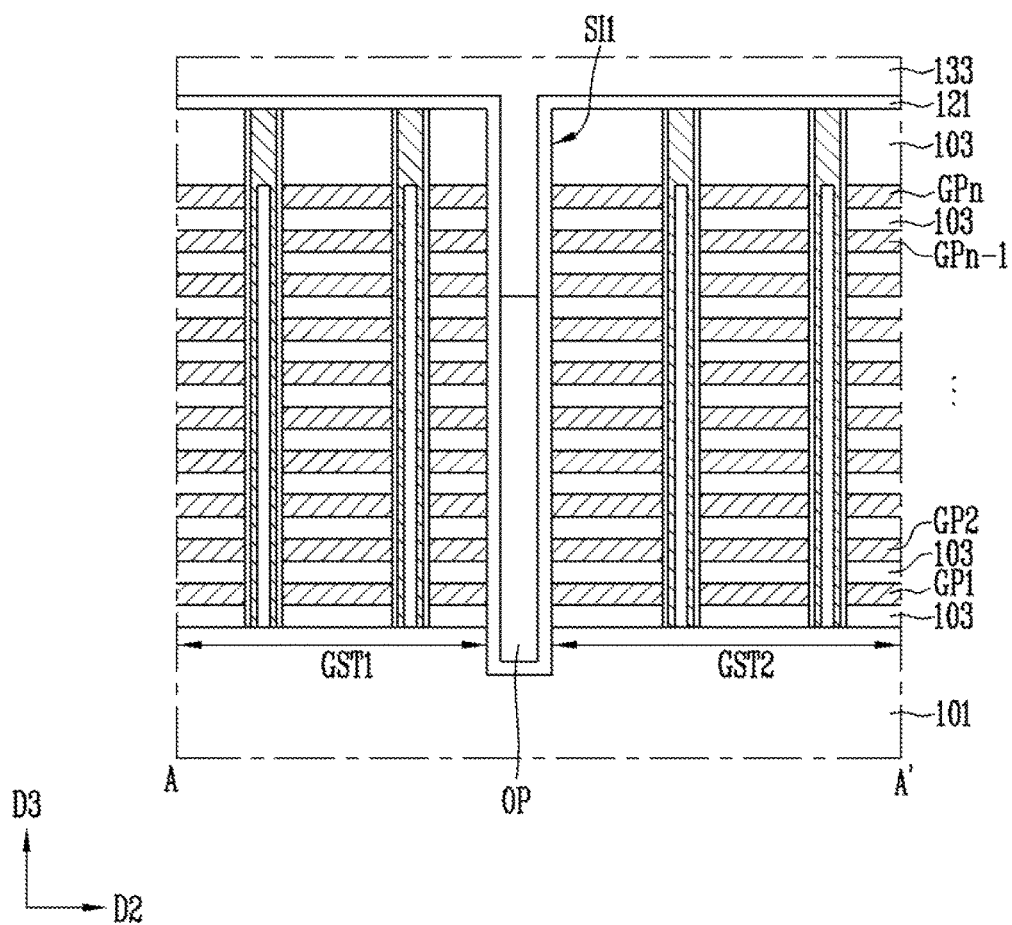
Figure 13B:
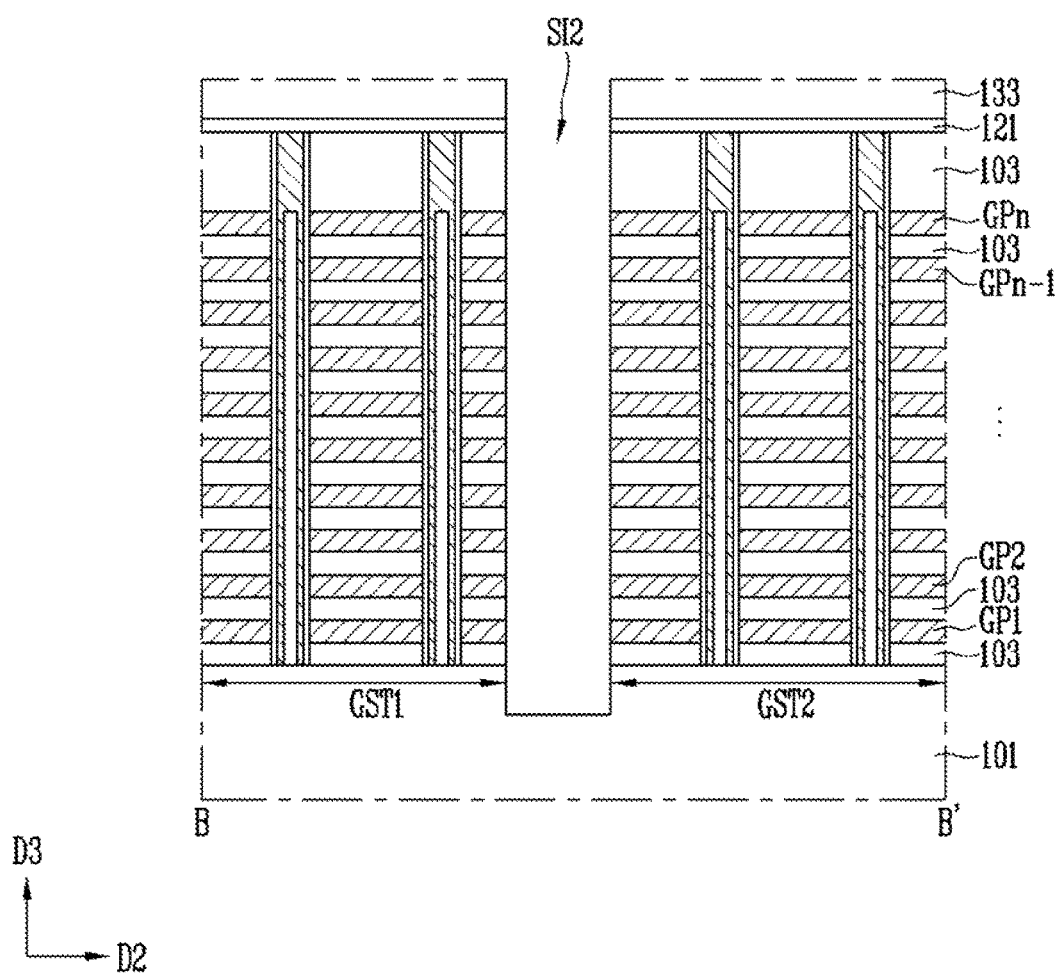

FIGS. 13A and 13B are cross-sectional views illustrating processes of removing the third material layer 125. FIG. 13A is a cross-sectional view taken along line "A-A'" of FIG. 1. FIG. 13B is a cross-sectional view taken along line "B-B'" of FIG. 1. The cross-sectional view taken along "C-C'" of FIG. 1 is omitted since it is the same as that in FIG. 10C.

Referring to FIGS. 13A and 13B, the third material layer (125 of FIG. 12A) may be removed by the second slits S12 while the first material layers 103 and the second material layers (i.e., the conductive patterns GP1 to GPn) are supported by the fourth material layer (i.e., the support insulating layer 133). Therefore, openings OP may be formed in the first slits SI1 through which the third material layer is removed. The openings OP may correspond to the second openings OP2 described above with reference to FIGS. 10A to 10C. Even when the openings OP are formed, the upper portions of the gate stacked structures GST1 and GST2 may be supported by the support insulating layer 133. Accordingly, the gate stacked structures GST1 and GST2 may be prevented from being bent.

Subsequently, a sidewall insulating layer and a common source line may be formed using the same processes as described above with reference to FIGS. 11A to 11C. The structures of the sidewall insulating layer and the common source line may be formed in substantially the same manner as described with reference to FIGS. 11A to 11C.

Figure 14:
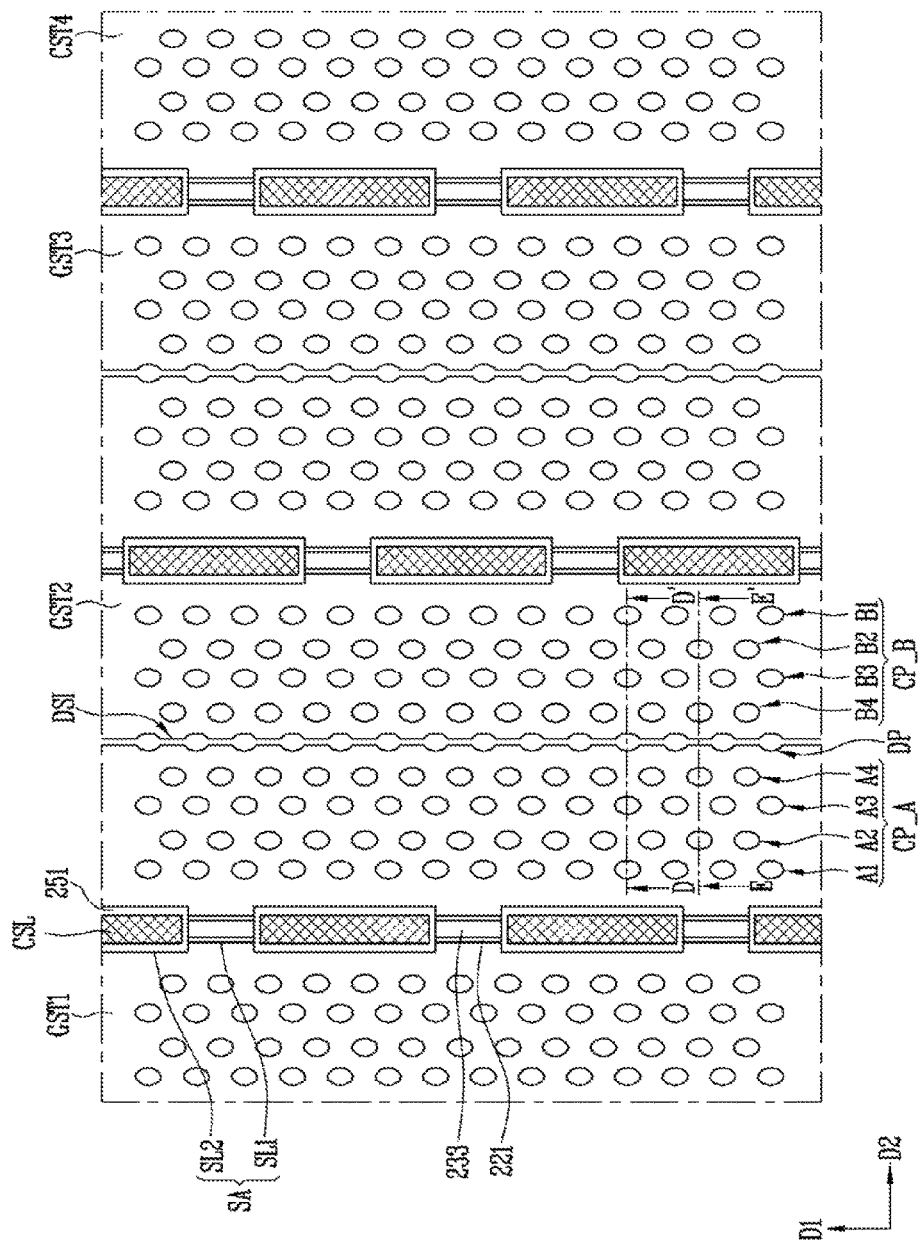
FIG. 14 is a plan view illustrating gate structures of a semiconductor device and structures separating the gate structures, according to another embodiment of the present invention.

FIG. 14 is a plan view Illustrating gate stacked structures of a semiconductor device and structures separating the gate stacked structures, according to another embodiment of the present invention. FIG. 14 is a plan view taken along a plane extending in the first and second directions D1 and D2 on the top surface of the gate stacked structures.

Referring to FIG. 14, the semiconductor device may include gate stacked structures GST1 to GST4 separated by separation areas SA. Each of the separation areas SA may include first and second slits SI1 and SI2 having the same structures as described above with reference to FIG. 1.

A common source line CSL may fill each of the separation areas SA. The common source line CSL may have the same structure as described above with reference to FIG. 1.

The common source line CSL may be separated from the gate stacked structures GST1 to GST4 by a protective layer 221 or a sidewall insulating layer 251. The protective layer 221 and the sidewall insulating layer 251 may have the same structures as described above with reference to FIG. 1.

The common source line CSL may include first concave portions filled with a support insulating layer 233.

Cell pillars CP passing through each of the gate stacked structures GST1 to GST4 may be arranged in a matrix format in the first and the second directions D1 and D2. The cell pillars CP may be divided into first and second groups CP_A and CP_B passing through the gate stacked structures GST1 to GST4. The cell pillars CP of the first group CP_A may include a plurality of columns A1 to A4. The cell pillars CP of the second group CP_B may include a plurality of columns B1 to B4 symmetrical to the cell pillars CP of the first group CP_A. For example, as shown in FIG. 14, the cell pillars CP of the first group CP_A may include the first to fourth columns A1 to A4 and the cell pillars CP of the second group CP_B may include the first to fourth columns B1 to B4. However, the invention is not limited thereto. For example, the cell pillars CP of the first group CP_A may include four or more columns of cell pillars, and the cell pillars CP of the second group CP_B may include four or more columns of cell pillars.

A drain separation slit DSI may pass through upper stacked structures of the gate stacked structures GST1 to GST4. The drain separation slit DSI may extend in the first direction D1. The drain separation slit DSI may be arranged between the cell pillars CP of the first group CP_A and the cell pillars CP of the second group CP_B.

According to an embodiment, the semiconductor device may further include dummy pillars DP passing through the gate stacked structures GST1 to GST4. The dummy pillars DP may be arranged in a line in the first direction D1 between the cell pillars CP of the first group CP_A and the cell pillars CP of the second group CP_B. In other words, the dummy pillars DP may be arranged along the drain separation slit DSI and may overlap with the drain separation slit DSI.

The cross-sectional view of the cell pillars CP and the separation area SA taken along the second direction D2 as shown in FIG. 14 is the same as illustrated in FIGS. 2A and 2B. The cross-sectional view of the separation area SA taken along the first direction D1 is the same as illustrated in FIG. 2C.

Figure 15A:
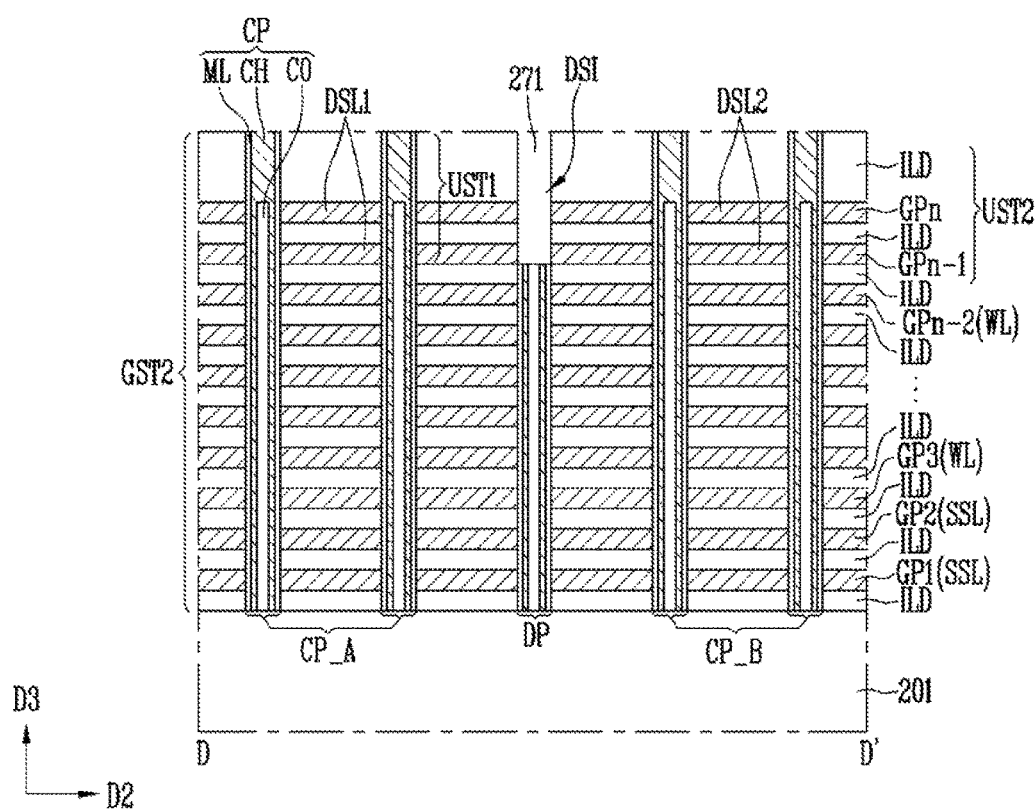
FIGS. 15A and 15B are cross-sectional views taken along lines "D-D'" and "E-E'" of FIG. 14, respectively.
Figure 15B:
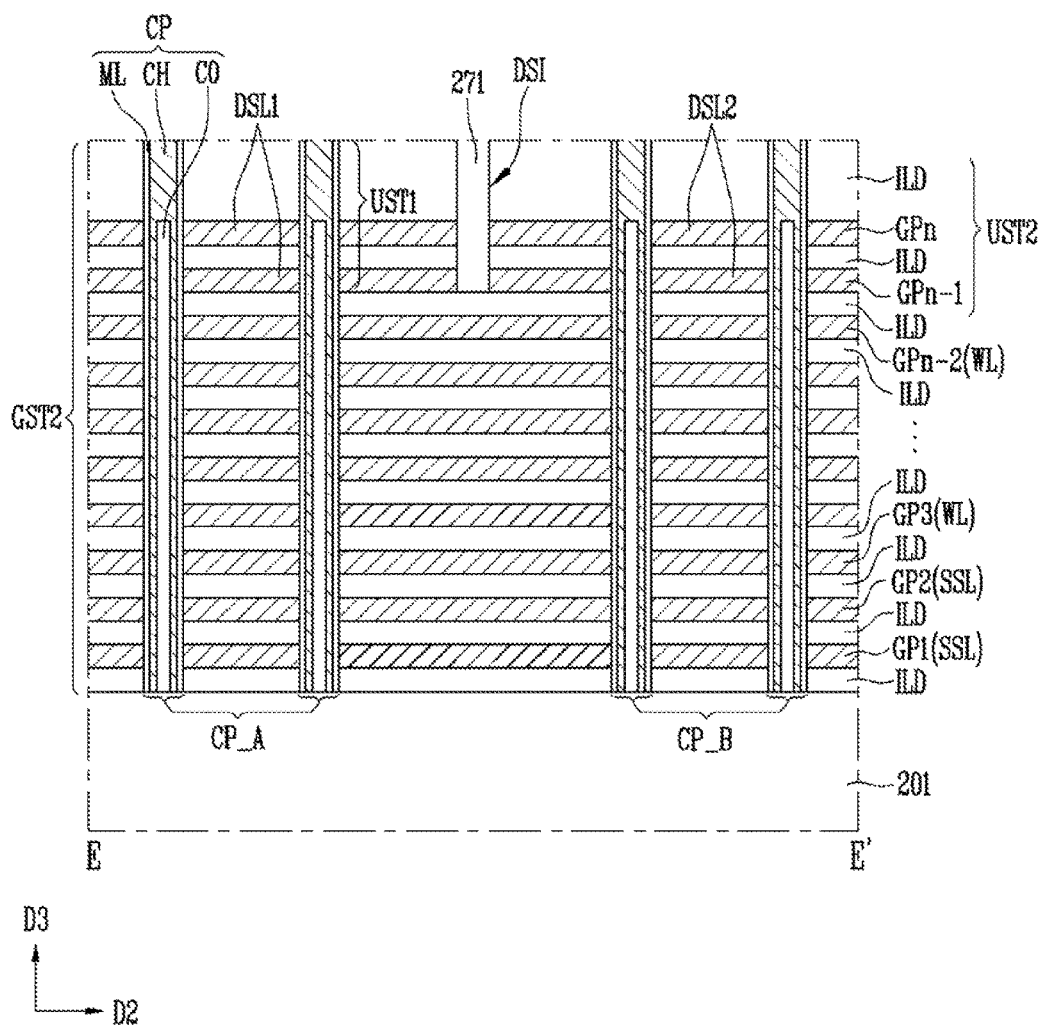

FIGS. 15A and 15B are cross-sectional views taken along lines "D-D'" and "E-E'" of FIG. 14, respectively.

Referring to FIGS. 15A and 15B, the gate stacked structure GST2 may include conductive patterns GP1 to GPn and interlayer insulating layers ILD stacked alternately in the third direction D3. The third direction D3 may perpendicularly cross the first and second directions D1 and D2. The gate stacked structure GST2 may surround the cell pillars CP of the first and second groups CP_A and CP_B and the dummy pillars DP. The depth of a first portion of the drain separation slit DSI overlapping with the dummy pillars DP may be different from the depth of a second portion of the drain separation slit DSI not overlapping with the dummy pillars DP In the third direction D3.

Each of the cell pillars CP of the first and second groups CP_A and CP_B may include the channel layer CH. Each of the cell pillars CP of the first and second groups CP_A and CP_B may further include a multilayer memory layer ML surrounding a channel layer CH. Each of the cell pillars CP of the first and second groups CP_A and CP_B may further include a core insulating layer CO surrounded by the channel layer CH.

The channel layer CH may contact a source layer 201 arranged below the gate stacked structure GST2. The source layer 201 may be a semiconductor substrate. The source layer 201 may be substantially the same as the source layer 101 described above with reference to FIGS. 2A and 2B.

The multilayer memory layer ML and the core insulating layer CO may be the same as the multilayer memory layer ML and the core insulating layer CO described above with reference to FIGS. 2A and 2B.

The dummy pillars DP may have substantially the same structure as the cell pillars CP of the first and second groups CP_A and CP_B. The dummy pillars DP may pass through the gate stacked structure GST2 between the cell pillars CP of the first group CP_A and the cell pillars CP of the second group CP_B.

As described above with reference to FIGS. 2A and 2B, the conductive patterns GP1 to GPn may be configured as a source selection line SSL, word lines WL and drain selection lines DSL1 and DSL2.

The drain separation slit DSI may be arranged between the cell pillars CP of the first group CP_A and the cell pillars CP of the second group CP_B and overlap with the dummy pillars DP. The drain separation slit DSI may divide the upper stacked structure of the gate stacked structure GST2 into a first select stacked structure UST1 and a second select stacked structure UST2. The drain selection lines DSL1 and DSL2 may be divided into the drain selection lines DSL1 of the first group CP_A included in the first select stacked structure UST1 and the drain selection lines DSL2 of the second group CP_B Included in the second select stacked structure UST2. The drain separation slit DSI may be filled with an insulating layer 271.

Figure 16:
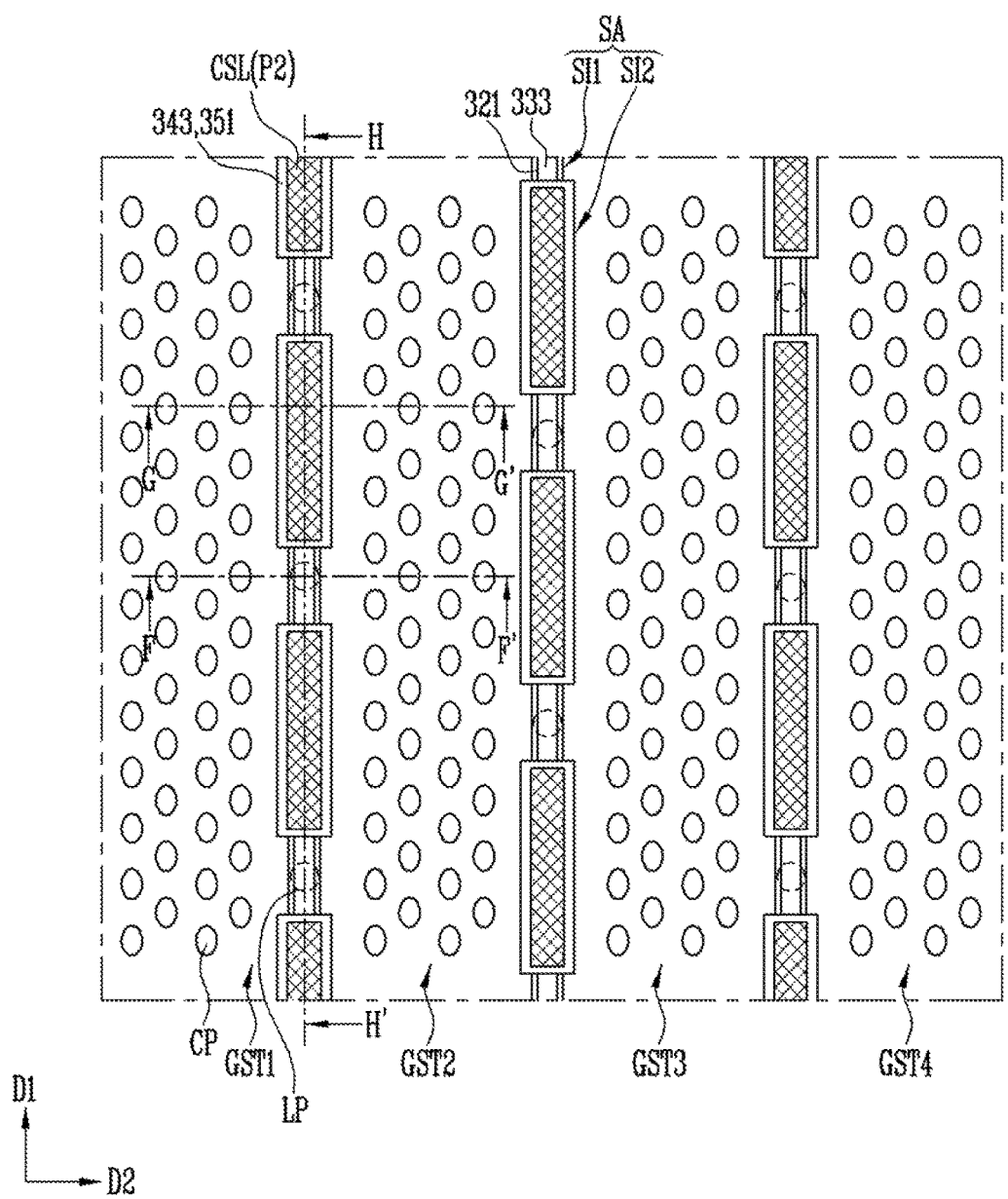
FIG. 16 is a plan view illustrating gate structures of a semiconductor device and structures separating the gate structures, according to yet another embodiment of the present invention.

FIG. 16 is a plan view illustrating gate stacked structures of a semiconductor device and structures separating the gate stacked structures, according to an embodiment of the present invention. FIG. 16 is a plan view taken along a plane extending in the first and second directions D1 and D2 crossing each other on the uppermost surface of the gate stacked structures.

Referring to FIG. 16, the semiconductor device may include gate stacked structures GST1 to GST4 separated by separation areas SA. Each of the separation areas SA may have substantially the same structure as described above in FIG. 1. Cell pillars CP may pass through the gate stacked structures GST1 to GST4. Each of the separation areas SA may include first slits SI1 and second slits SI2 arranged alternately in the first direction D1.

The first slits SI1 and the second slits SI2 may have substantially the same structures as described above with reference to FIG. 1.

A common source line CSL may fill the separation areas SA. The common source line CSL may extend in the first direction D1. The common source line CSL may be divided into first portions (P1 of FIGS. 17A and 17C, not illustrated) arranged in the first slits SI1 and second portions P2 arranged in the second slits SI2. The structure of the common source line CSL will be described in more detail with reference to FIGS. 17A to 17C. The three-dimensional structure of the common source line CSL will be shown with reference to FIG. 3.

The common source line CSL may be spaced apart from the gate stacked structures GST1 to GST4 by a protective layer 321 or a sidewall Insulating layer 351. The protective layer 321 may be formed on sidewalls of each of the first slits SI1. The sidewall insulating layer 351 may be formed on sidewalls of each of the second slits SI2. The sidewall insulating layer 351 may be arranged adjacent to a second blocking insulating layer 343.

The common source line CSL may include first concave portions filled with a support insulating layer 333. The first concave portions may fill the first slits SI1 and be spaced apart from each other in the first direction D1. The arrangement of the first concave portions may be the same as described above with reference to FIG. 3.

The sidewall insulating layer 351 may extend along the boundary between the common source line CSL and the support insulating layer 333. The arrangement of the cell pillars CP passing through the gate stacked structures GST1 to GST4 may be substantially the same as described above with reference to FIG. 1.

Insulating plugs LP may be arranged in a direction in which the separation areas SA extend. The insulating plugs LP may be arranged so as not to inhibit contact between the second portion P2 of the common source line CSL and a source layer (301 and 341 of FIGS. 17A to 17C, not shown) arranged therebelow. More specifically, the insulating plugs LP may overlap with the first slits SI1. The structures of the insulating plugs LP and the source layer 301 and 341 will be described in more detail with reference to FIGS. 17A to 17C.

Figure 17A:
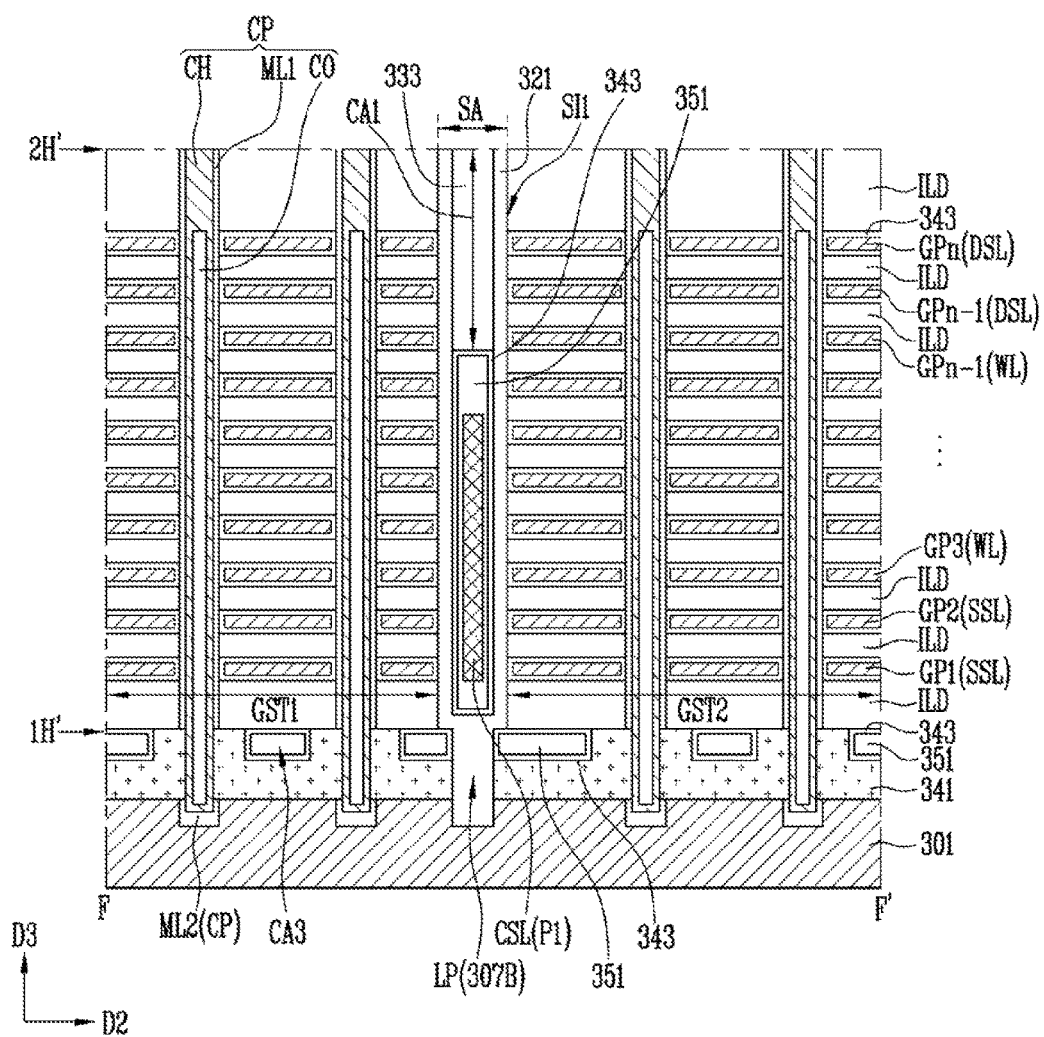
Figure 17B:
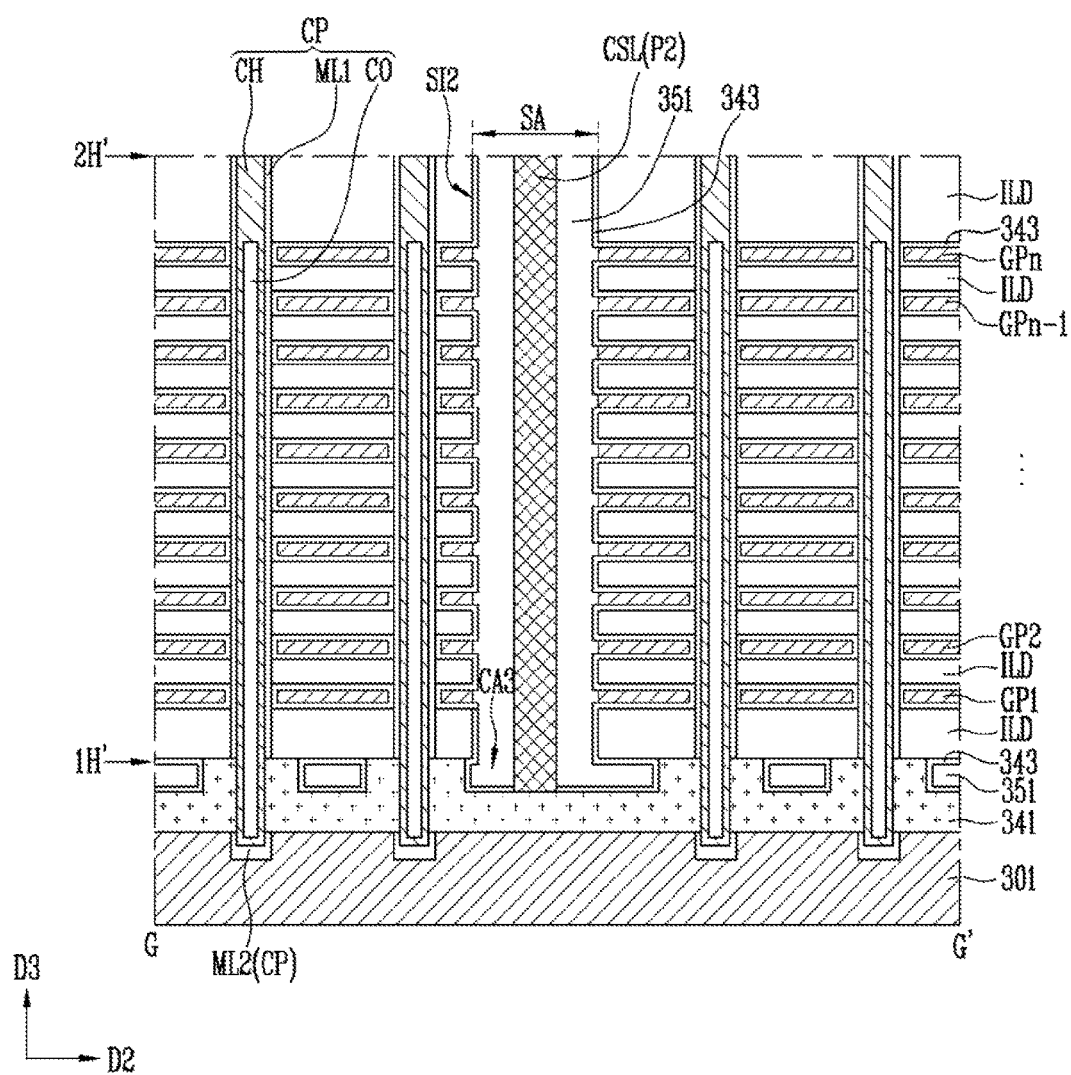

FIGS. 17A to 17C are cross-sectional views taken along lines "F-F'", "G-G'" and "H-H'" of FIG. 16, respectively. More specifically, FIG. 17A is a cross-sectional view taken along line "F-F'" of FIG. 16, FIG. 17B is a cross-sectional view taken along line "G-G'" of FIG. 16, and FIG. 17C is a cross-sectional view taken along line taken along line "H-H'" of FIG. 16.

Referring to FIGS. 17A and 17B, each of the gate stacked structures GST1 and GST2 may include conductive patterns GP1 to GPn and interlayer insulating layers ILD stacked alternately in the third direction D3. The third direction D3 may perpendicularly cross the first and second directions D1 and D2. Each of the gate stacked structures GST1 and GST2 may surround the cell pillars CP.

Each of the cell pillars CP may include a channel layer CH. Each of the cell pillars CP may further include first and second multilayer memory layers ML1 and ML2 surrounding the channel layer CH. Each of the cell pillars CP may further Include a core insulating layer CO surrounded by the channel layer CH.

Each of the channel layers CH surrounded by the gate stacked structures GST1 and GST2 may contact source layers 301 and 341 arranged below the gate stacked structures GST1 and GST2. Each of the channel layers CH may extend into the source layers 301 and 341.

The source layers 301 and 341 may include a contact source layer 341 contacting sidewalls of the channel layers CH and a base source layer 301 arranged below the contact source layer 341. The contact source layer 341 and the base source layer 301 may include at least one of a metal layer and a doped silicon layer. For example, each of the contact source layer 341 and the base source layer 301 may include a doped silicon layer. In an embodiment, the base source layer 301 may have a stacked structure including a metal layer and a doped silicon layer, and the contact source layer 341 may include a doped silicon layer. The contact source layer 341 may be formed to completely bury a source region between the base source layer 301 and each of the gate stacked structures GST1 and GST2. In addition, as shown in FIGS. 17A to 17C, the contact source layer 341 may grow from the sidewalls of the channel layers CH and the base source layer 301. The contact source layer 341 may include grooves CA3 that include at least one insulating material. For example, the grooves CA3 of the contact source layer 341 may be filled with the sidewall insulating layer 351 surrounded with the second blocking insulating layer 343. However, in another embodiment, an air gap may be defined in the grooves CA3 of the contact source layer 341.

The first multilayer memory layer ML1 may be formed between each of the channel layers CH and each of the gate stacked structures GST1 and GST2 along the entire length of each cell pillar CP except for the length of the cell pillar CP which enters the contact source layer 341 and the base source layer 301. The channel layer CH extends along the entire length of each cell pillar CP including the length of the cell pillar CP entering the contact source layer 141 and the base source layer 301 and surrounds the core insulating layer CO. The second multilayer memory layer ML2 may be formed between the part each of the channel layers CH that surrounds the bottom part of the core insulating layer CO that enters partially in the source layer 301 and the base source layer 301. Hence, the contact source layer 341 may be arranged between the first multilayer memory layer ML1 and the second multilayer memory layer ML2 separating the first multilayer memory layer ML1 from the second multilayer memory layer ML2.

Each of the first and second multilayer memory layers ML1 and ML2 may include a tunnel insulating layer, a data storage layer, and a first blocking insulating layer. The tunnel insulating layer may include a silicon oxide layer capable of tunneling charges. The data storage layer may include a silicon nitride layer capable of trapping charges. The first blocking insulating layer may include a silicon oxide layer capable of blocking charges. The core insulating layer CO may be formed to fill a central area defined by the channel layer CH inside each cell pillar CP, the central area extending from a top surface which is substantially at the same height as the top surface of the uppermost conductive layer GPn that may serve as a drain selection line DSL to a bottom surface which is inside the base source layer 301. More specifically, as illustrated in FIG. 17A, in an embodiment, the bottom surface of the core insulating layer CO may be at least slightly below a top surface of the base source layer 301 and may not penetrate through the base layer 301.

The conductive patterns GP1 to GPn may be configured as a source selection line SSL, word lines WL and a drain selection line DSL as described above with reference to FIG. 1. Each of the conductive patterns GP1 to GPn may be surrounded by the second blocking insulating layer 343.

As better illustrated in FIG. 17B, the second blocking insulating layer 343 may also extend along the sidewall of each of the interlayer insulating layers ILD facing the second portion P2 of the common source line CSL. Sidewall insulating layer 351 is disposed between the second portion P2 of the common source line CSL and the sidewall of each of the interlayer insulating layers ILD and the sidewall of each of the conductive patterns GP1 to GPn facing the second portion P2 of the common source line CSL.

When the contact source layer 341 has the grooves CA3, the second blocking insulating layer 343 may extend along the surfaces of the grooves CA3 of the contact source layer 341. The second blocking insulating layer 343 may include a material having a higher dielectric constant than the first blocking insulating layers of the first and second multilayer memory layers ML1 and ML2. For example, the second blocking insulating layer 343 may include a metal oxide layer, and more particularly, an aluminum oxide layer.

Each of the gate stacked structures GST1 and GST2 may have a height defined between a first height 1H' and a second height 2H'. The separation area SA may be arranged between neighboring gate stacked structures GST1 and GST2.

As shown in FIG. 17A, the first slit SI1 of the separation area SA may be filled with the first portion P1 of the common source line CSL and the support insulating layer 333. More specifically, the first portion P1 of the common source line CSL may fill a lower portion of the first slit SI1. The support insulating layer 333 may fill an upper portion of the first slit SI1 defined as the first concave portion CA1 of the common source line CSL. The support insulating layer 333 may function as a support during manufacturing of the semiconductor device. To stably support the gate stacked structures GST1 and GST2, the support insulating layer 333 may extend to a position between the first height 1H' and the second height 2H', for example, from the second height 2H' to the height of one of the conductive patterns GPn-1.

Therefore, the support insulating layer 333 may have sidewalls facing portions of the channel layer CH.

The first portion P1 of the common source line CSL and the support insulating layer 333 may be formed on the protective layer 321. The protective layer 321 may extend along the sidewalls and a bottom surface of the first slit SI1. The first portion P1 of the common source line CSL may be surrounded by the sidewall insulating layer 351. The sidewall insulating layer 351 may extend between the first portion P1 of the common source line CSL and the support insulating layer 333 and between the first portion P1 of the common source line CSL and the protective layer 321. The second blocking insulating layer 343 may surround the first portion P1 of the common source line CSL. Particularly, the second blocking insulating layer 343 may surround an outer wall of the sidewall Insulating layer 351.

The protective layer 321 may extend to pass through the contact source layer 341 below the first portion P1 of the common source line CSL. Second source holes 307B to be described below may be formed through the contact source layer 341, and extend into the base source layer 301. Each of the second source holes 307B may be filled with the protective layer 321. Hereinafter, a portion of the protective layer 321 filling each of the second source holes 307B is referred as the insulating plug LP. The insulating plug LP may overlap with the first concave portion CA1 and the first portion P1 of the common source line CSL. The insulating plug LP may pass through the contact source layer 341. The insulating plug LP may extend into the base source layer 301.

As shown in FIG. 17B, the second slit SI2 of the separation area SA may be filled with the second portion P2 of the common source line CSL. The second portion P2 of the common source line CSL may extend in the third direction D3 to fill the second slit SI2 so that the second portion P2 may be longer than the first portion P1 in the third direction D3. More specifically, the second portion P2 of the common source line CSL may extend from a bottom surface of the second slit SI2 to the second height 2H'. Though not shown in FIG. 17B, the common source line CSL may extend to be higher than the second height 2H.

The sidewall insulating layer 351 may extend along the sidewalls of the second slit SI2. The second portion P2 of the common source line CSL may be insulated from the gate stacked structures GST1 and GST2 by the sidewall insulating layer 351. The bottom surface of the second portion P2 of the common source line CSL may contact the contact source layer 341.

Referring to FIG. 17C, the separation area SA may be filled with the common source line CSL including the first portions P1 and the second portions P2 arranged alternately in the first direction D1. Each of the first portions P1 of the common source line CSL may be arranged between the source layers 301 and 341 and the support insulating layer 333 and spaced apart from the source layers 301 and 341 by the second blocking insulating layer 343, the protective layer 321 and the sidewall insulating layer 351. Each of the second portions P2 of the common source line CSL may extend to contact the contact source layer 341, among the source layers 301 and 341, and extend to face the sidewalls of the support insulating layer 333.

The support insulating layer 333 may fill the first concave portions CA1 and be surrounded by the second blocking insulating layer 343 and the sidewall Insulating layer 351.

The insulating plugs LP may overlap with the first concave portions CA1 and the first portions P1 so as not to inhibit contact between the second portions P2 and the contact source layer 341. The insulating plugs LP may pass through the contact source layer 341. As described above with reference to FIG. 17A, the insulating plugs LP may be part of the protective layer 321. The protective layer 321 in the separation area SA may be surrounded by the second blocking insulating layer 343 and the sidewall insulating layer 351.

As described above, the first portions P1 of the common source line CSL may be shorter than the second portions P2 in the third direction D3.

The second blocking insulating layer 343, the protective layer 321 and the sidewall insulating layer 351 including insulating materials may be arranged between each of the first portions P1 and the source layers 301 and 341.

FIGS. 18A to 25C are cross-sectional views illustrating a method of manufacturing a semiconductor device, according to an embodiment of the present invention. More specifically, FIGS. 18A to 25A are cross-sectional views taken along line "F-F'" of FIG. 16, FIGS. 18B to 25B are cross-sectional views taken along line "G-G'" of FIG. 16, and FIGS. 18C to 25C are cross-sectional views taken along line "H-H'" of FIG. 16.

Figure 18A:
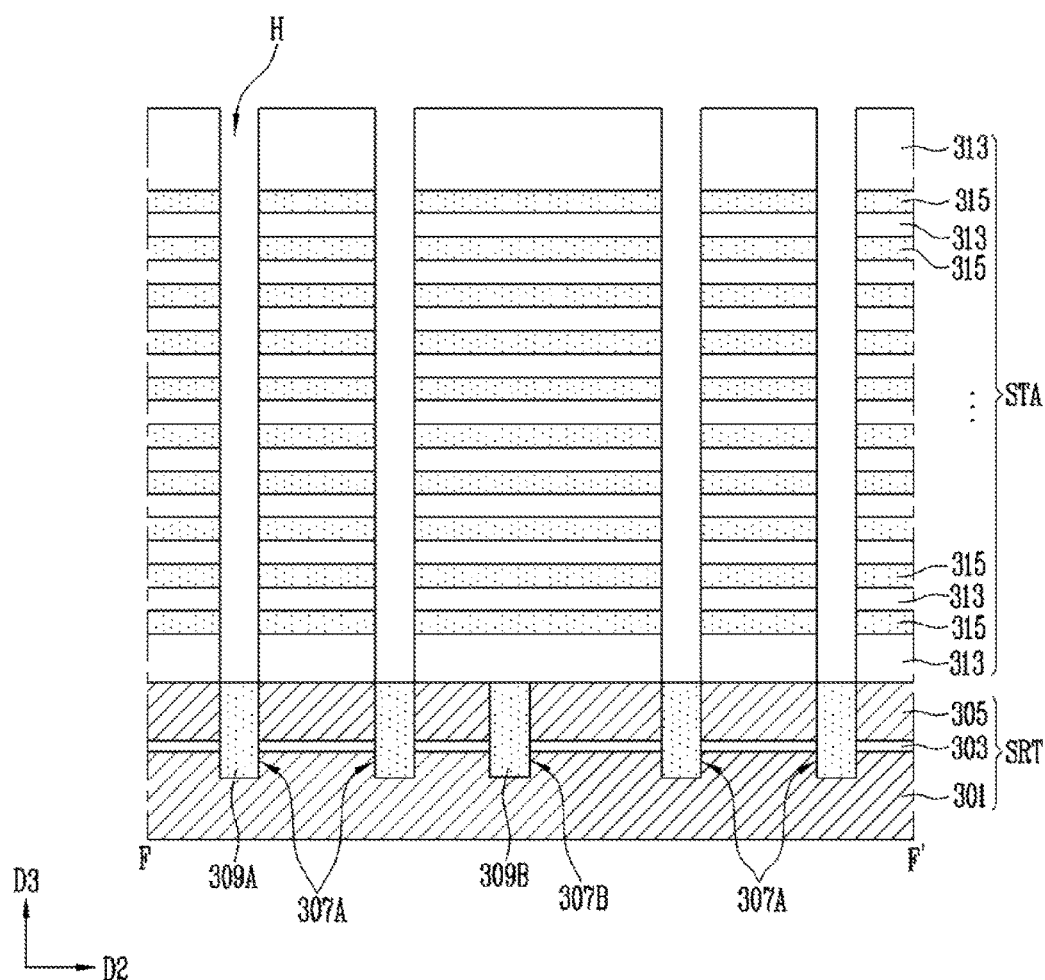
FIGS. 18A to 25C are cross-sectional views Illustrating a method of manufacturing a semiconductor device, according to an embodiment of the present invention.
Figure 18B:
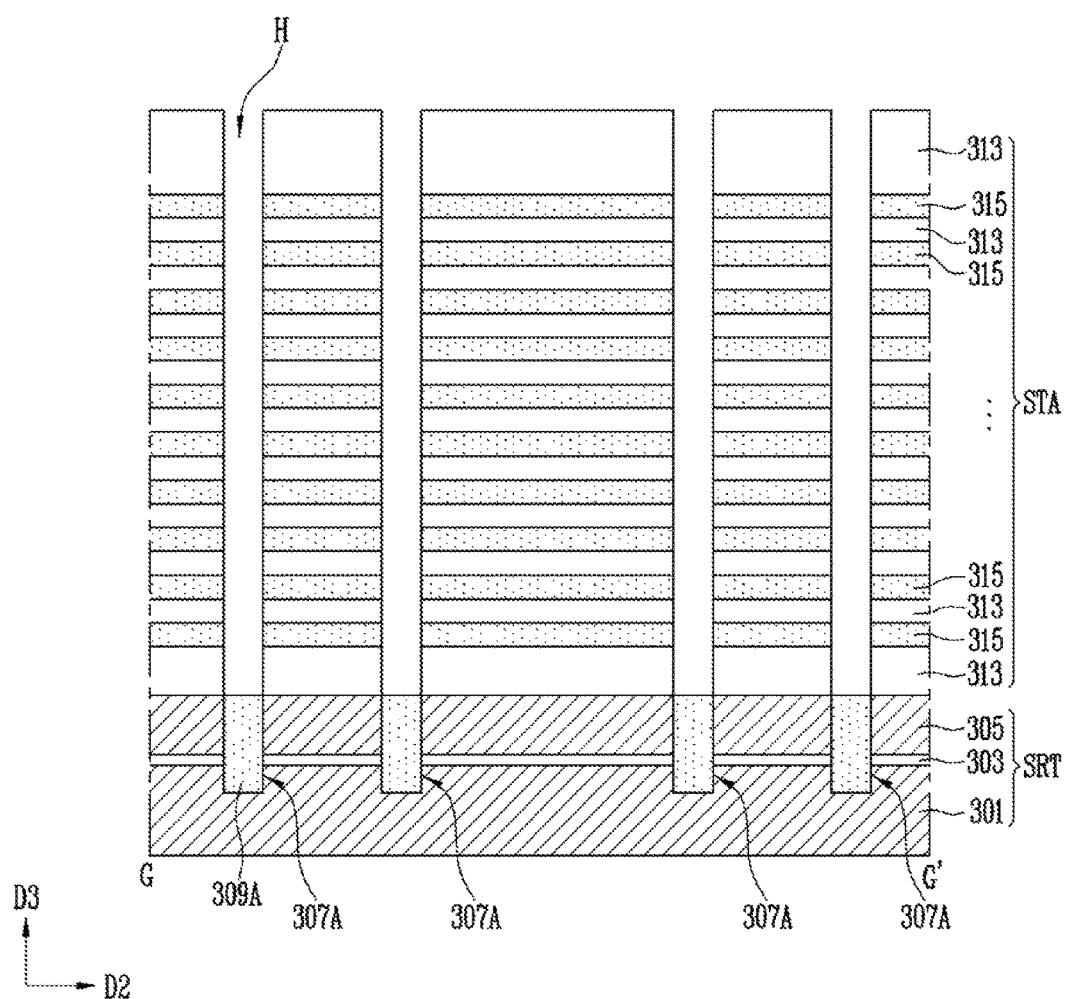
Figure 18C:
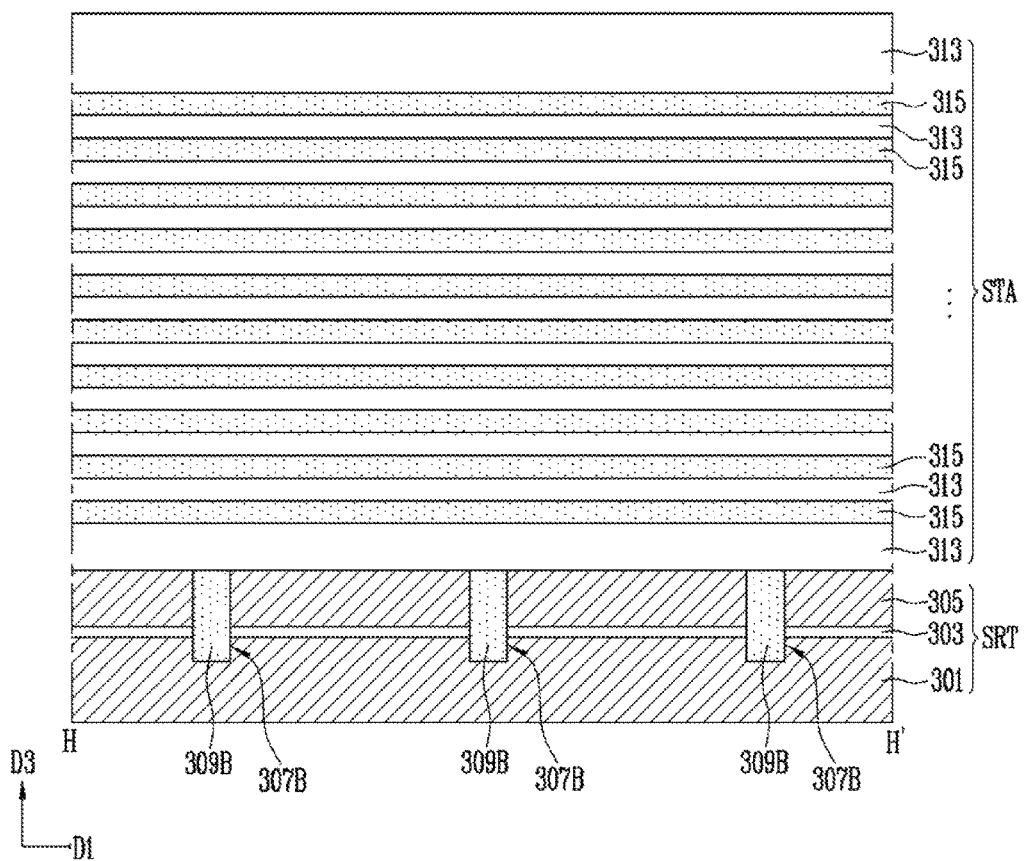

FIGS. 18A to 18C are cross-sectional views illustrating processes of forming a source stacked structure, forming sacrificial pillars, forming a stacked structure, and forming through holes.

Referring to FIGS. 18A to 18C, the process of forming a source stacked structure SRT may include forming a base source layer 301 and forming a sacrificial source layer 305 on the base source layer 301. A source protective layer 303 may be formed on the base source layer 301 before the sacrificial source layer 305 is formed. The base source layer 301 may include a conductive layer. The sacrificial source layer 305 may include a material having an etch rate different from first material layers 313 and second material layers 315 forming the stacked structure STA. For example, the sacrificial source layer 305 may include a silicon layer. The source protective layer 303 may include a material having an etch rate different from the sacrificial source layer 305. For example, the source protective layer 303 may include an oxide layer.

After the source stacked structure SRT is formed, the source stacked structure SRT may be etched to form first source holes 307A and second source holes 307B. The first source holes 307A and the second source holes 307B may pass through the sacrificial source layer 305 and extend into the base source layer 301. An etch process for forming the first source holes 307A and the second source holes 307B may include forming a mask pattern (not illustrated) on an upper portion of the source stacked structure SRT by a photolithography process, etching the source stacked structure SRT by an etch process using the mask pattern as an etch barrier, and removing the mask pattern. The position at which the first source holes 307A are formed may be designed in consideration of positions of through holes H to be formed during subsequent processes. More specifically, the first source holes 307A may be formed at positions where the first source holes 307A may overlap with the through holes H. The positions of the second source holes 307B may be designed in consideration of positions of first slits to be formed during subsequent processes. More specifically, the second source holes 307B may be formed at positions where the second source holes 307B overlap with the first slits.

Subsequently, first sacrificial pillars 309A filling the first source holes 307A and second sacrificial pillars 309B filling the second source holes 307B may be formed. The process of forming the first sacrificial pillars 309A and the second sacrificial pillars 309B may include forming a sacrificial layer on the source stacked structure SRT to completely fill the first source holes 307A and the second source holes 307B and planarizing the sacrificial layer to expose an upper surface of the source stacked structure SRT. The sacrificial layer may include a material having an etch rate different from the base source layer 301, the source protective layer 303, and the sacrificial source layer 305. For example, the sacrificial layer may include a titanium nitride layer.

Subsequently, the stacked structure STA may include the first material layers 313 and the second material layers 315 stacked alternately with each other. The first material layers 313 and the second material layers 315 may include the same materials as the first and second material layers as described above with reference to FIGS. 5A to 5C or the first and second material layers as described above with reference to FIGS. 12A and 12B. Hereinafter, for convenience of explanation, the first material layers 313 and the second material layers 315 including interlayer insulating layers and sacrificial material layers as described above with reference FIGS. 5A to 5C are exemplified.

Subsequently, the first material layers 313 and the second material layers 315 may be etched to form the through holes H. The through holes H may pass through the stacked structure STA to expose the first sacrificial pillars 309A. The processes of forming the through holes H may include forming a mask pattern (not illustrated) on an upper portion of the stacked structure STA by a photolithography process, etching the stacked structure STA by an etch process using the mask pattern as an etch barrier, and removing the mask pattern.

Figure 19A:
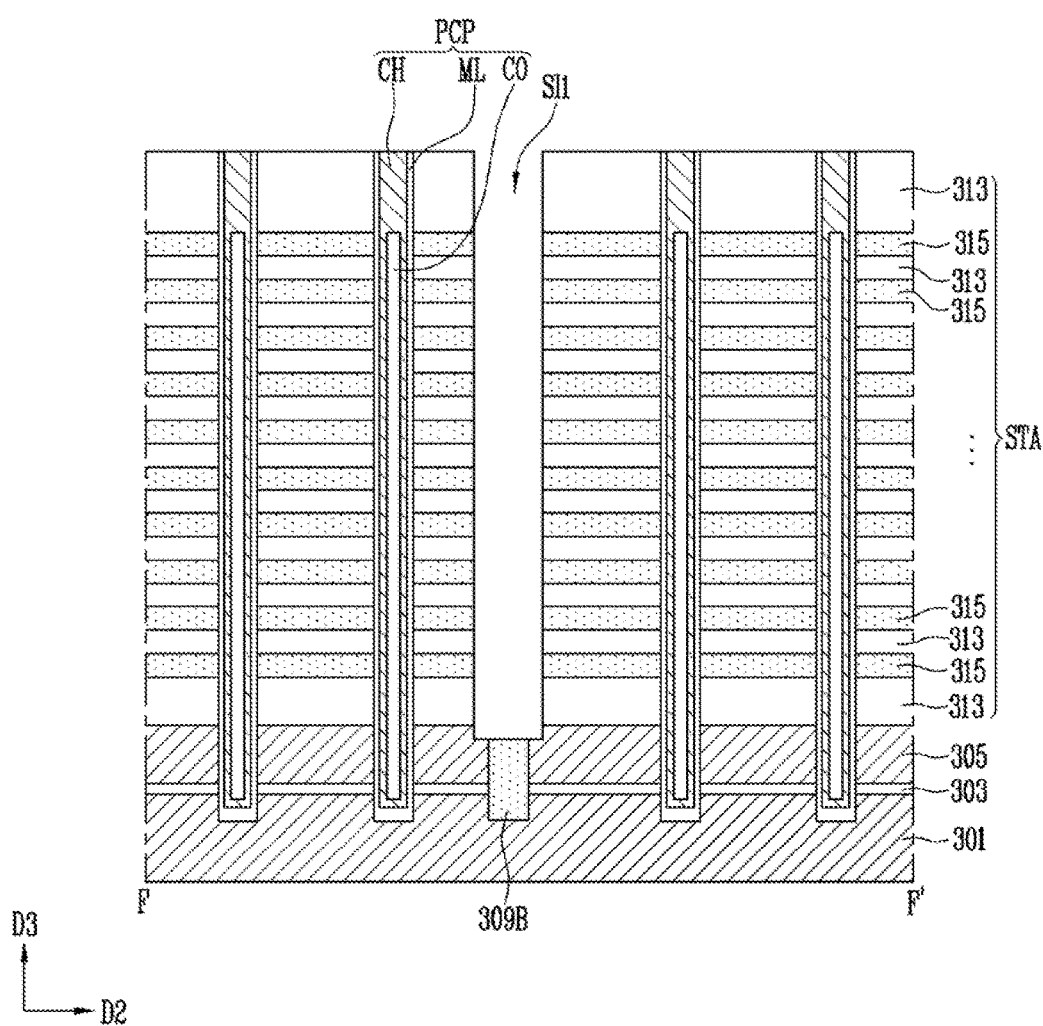
Figure 19B:
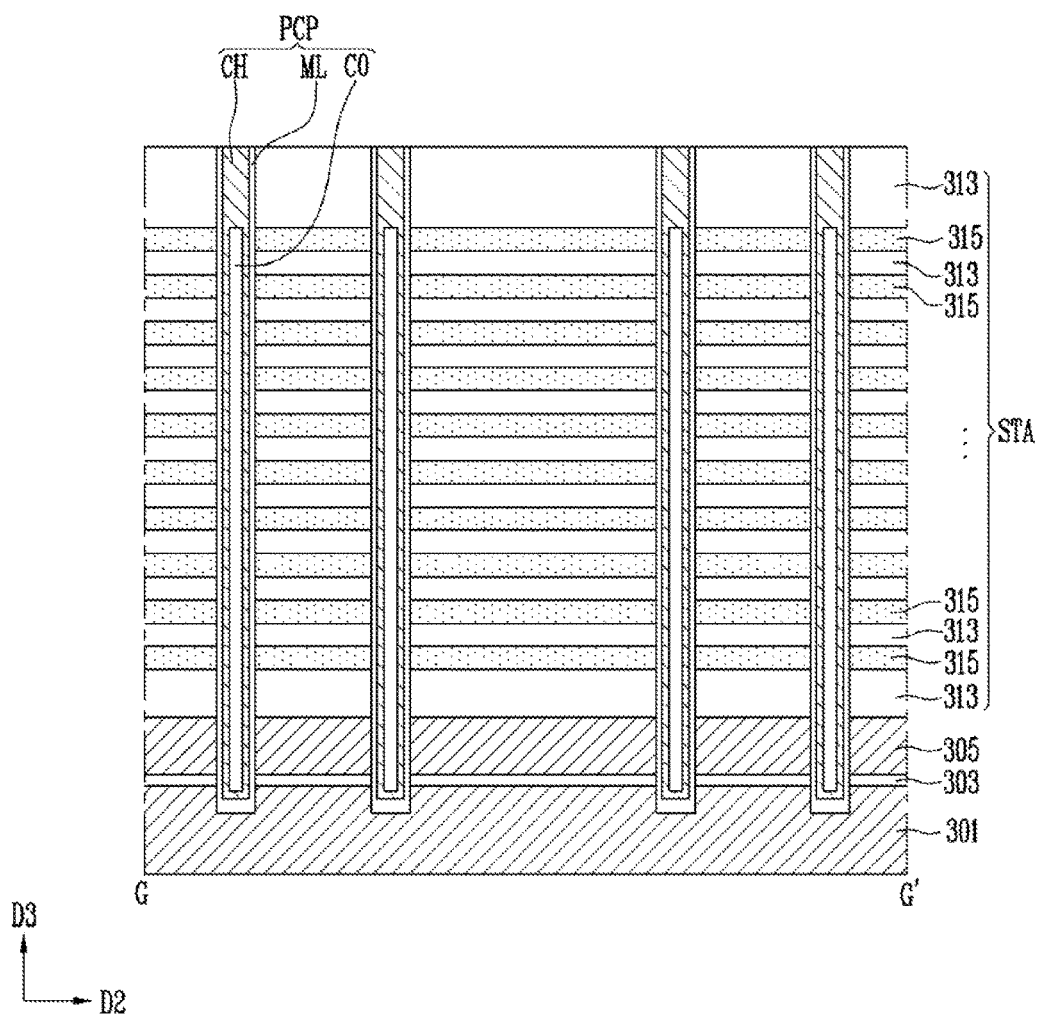
Figure 19C:
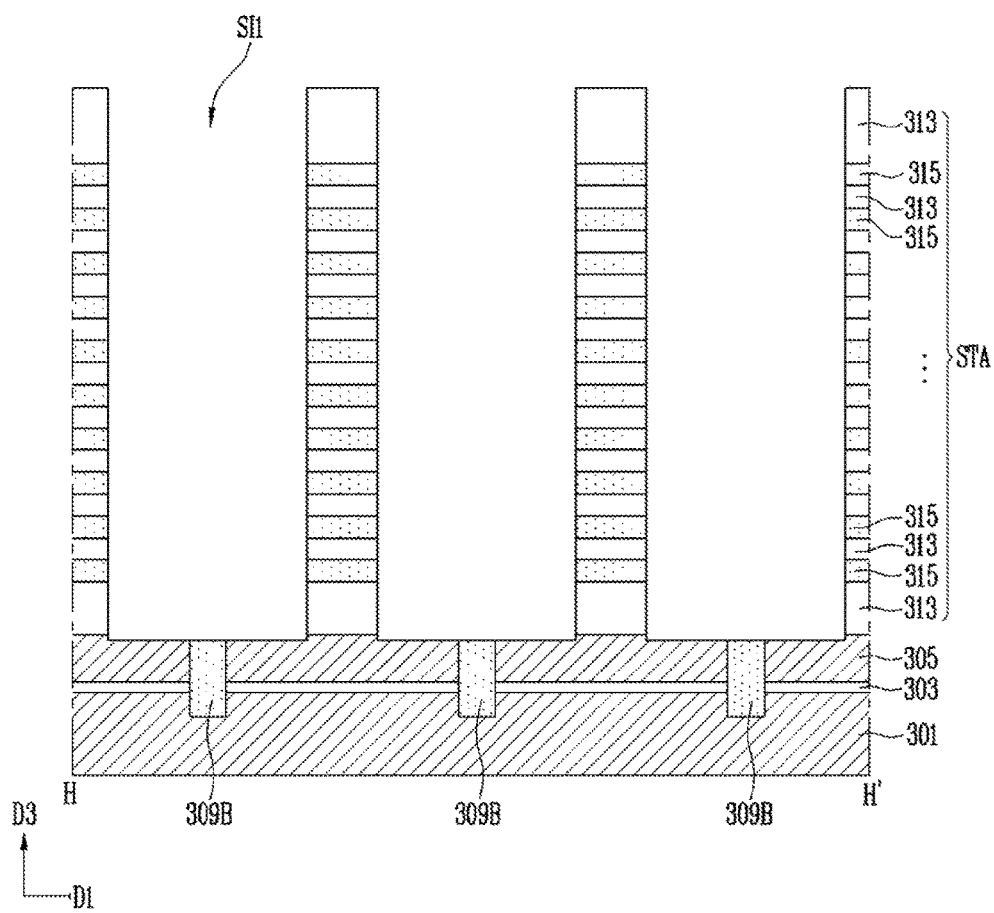

FIGS. 19A to 19C are cross-sectional views Illustrating a process of forming preliminary cell pillars and a process of forming first slits.

Referring to FIGS. 19A to 19C, the first sacrificial pillars (309A of FIGS. 18A and 185) exposed by the through holes (H of FIGS. 18A and 18B) may be removed to open channel holes defined through connections between the through holes and the first source holes (307A of FIGS. 18A and 18B). Subsequently, preliminary cell pillars PCP may be formed in the channel holes.

The processes of forming the preliminary cell pillars PCP may include forming a multilayer memory layer ML over a surface of each of the channel holes and forming a channel layer CH on the multilayer memory layer ML. The multilayer memory layer ML and the channel layer CH may extend along sidewalls and a bottom surface of each of the channel holes. The multilayer memory layer ML may be formed by sequentially stacking a first blocking insulating layer, a data storage layer and a tunnel insulating layer. The channel layer CH may surround a core insulating layer CO. To form the channel layer CH surrounding the core insulating layer CO, a first semiconductor layer may be formed on the multilayer memory layer ML in each of the channel holes, a central area of each of the channel holes opened by the first semiconductor layer may be filled with the core Insulating layer CO, the upper portion of the core insulating layer CO may be partially etched, and a portion from which the core insulating layer CO is etched may be filled with a second semiconductor layer. The second semiconductor layer may contact the first semiconductor layer and include impurities having a higher concentration than the first semiconductor layer. The first semiconductor layer may or may not be doped with impurities. Each of the first and second semiconductor layers may form the channel layer CH and include a silicon layer.

Subsequently, first slits SI1 passing through the first material layers 313 and the second material layers 315 may be formed. The first slits SI1 may overlap with the second sacrificial pillars 309B. The second sacrificial pillars 309B may be exposed by the first slits SI1. The process of forming the first slits SI1 may include forming a mask pattern (not illustrated) on an upper portion of the stacked structure STA by a photolithography process, etching the stacked structure STA by an etch process using the mask pattern as an etch barrier, and removing the mask pattern. The first slits SI1 may be spaced apart from each other in the first and the second directions D1 and D2 as described above with reference to FIG. 16.

Figure 20A:
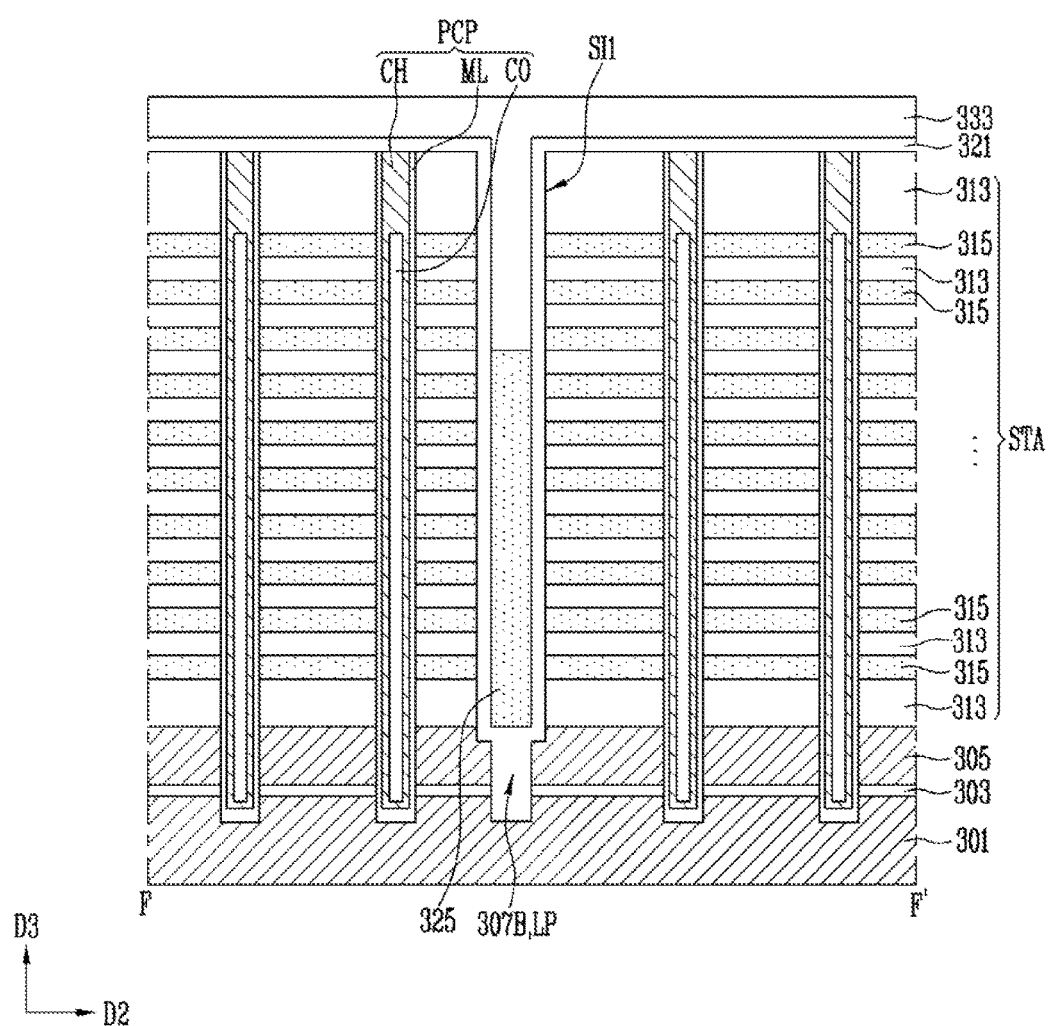
Figure 20B:
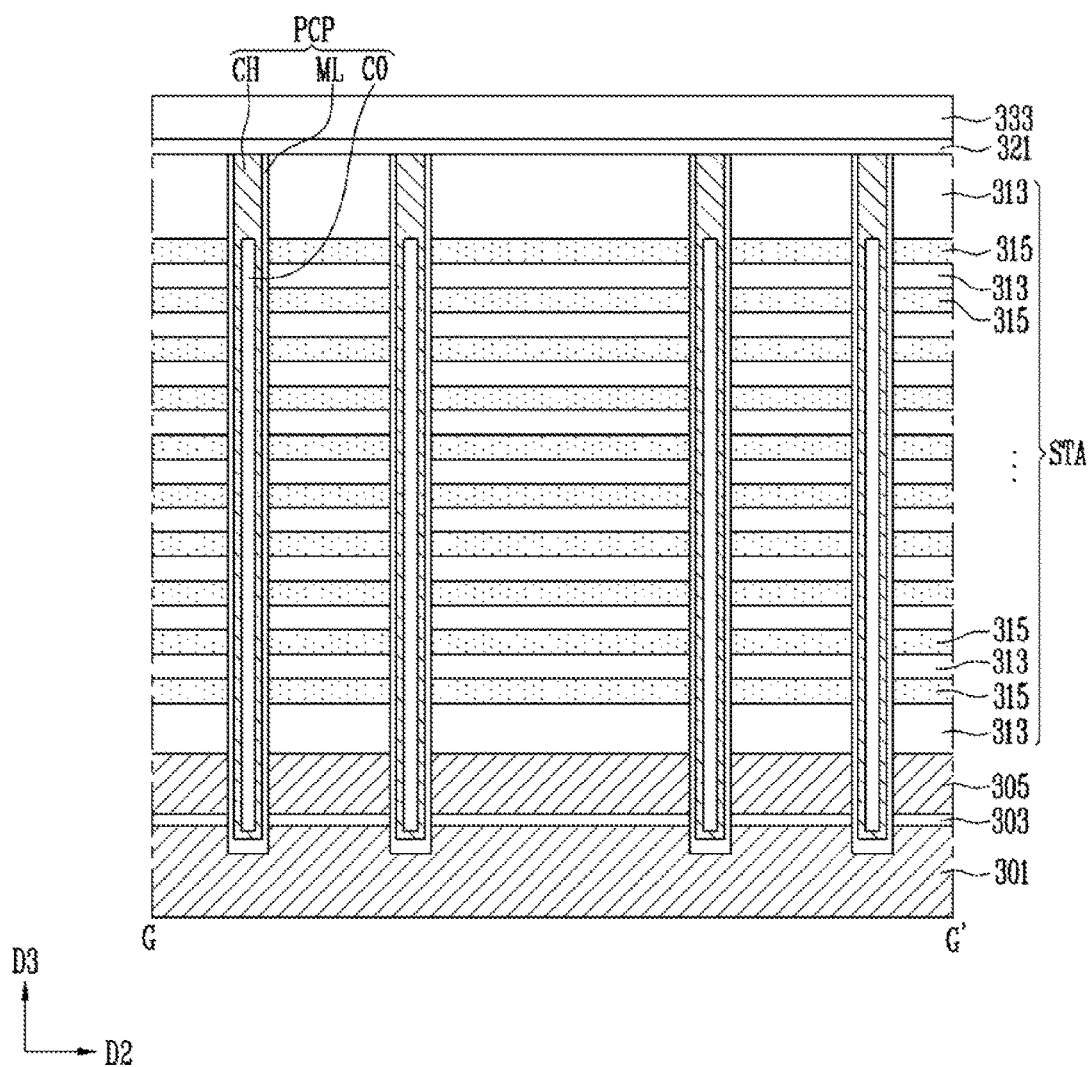
Figure 20C:
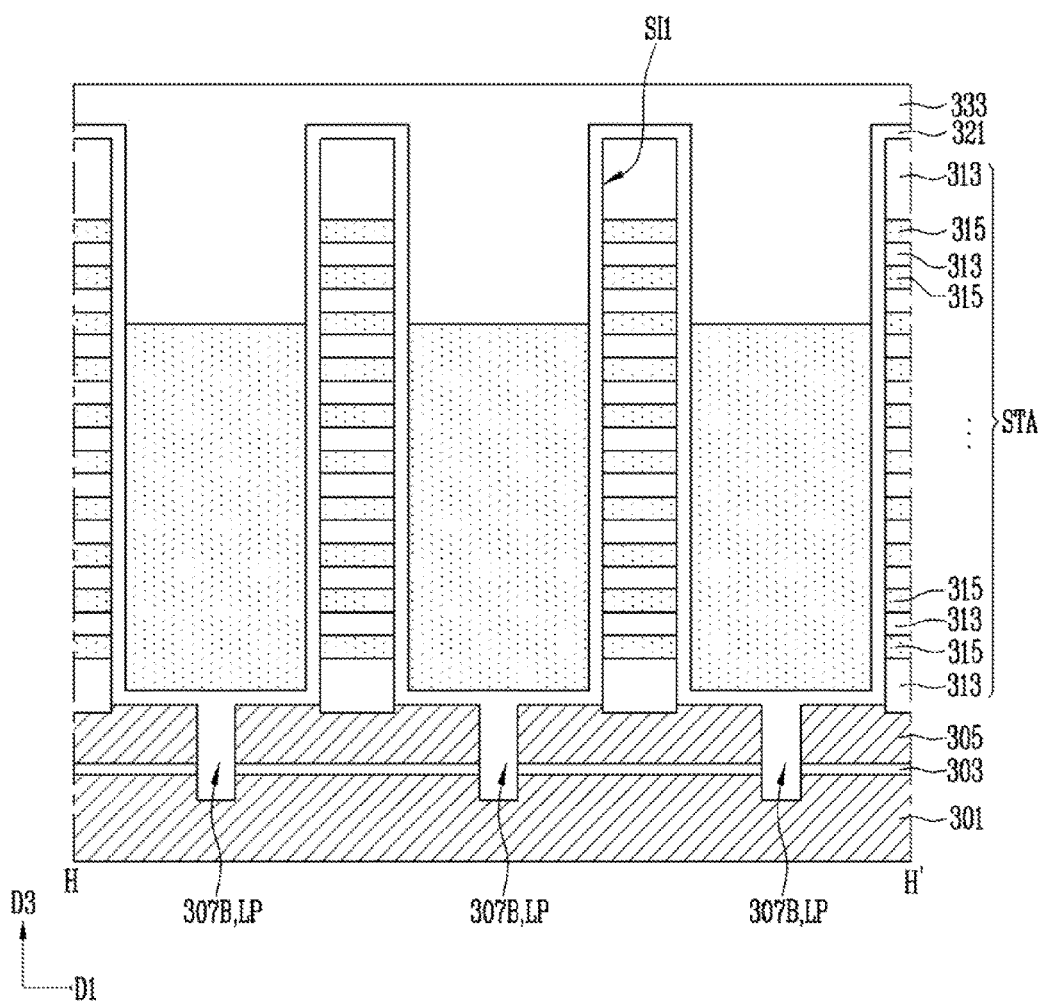

FIGS. 20A to 20C are cross-sectional views illustrating processes of forming material layers filling first slits and second source holes.

Referring to FIGS. 20A to 20C, a protective layer 321 may be formed on the surfaces of the first slits SI1. The protective layer 321 may extend to the upper surface of the stacked structure STA to cover the preliminary cell pillars PCP. The protective layer 321 may extend to fill the second source holes 307B.

The process of forming the protective layer 321 may include removing the second sacrificial pillars 309B in the second source holes 307B through the first slits SI1 to expose the second source holes 307B, and depositing the protective layer 321 to fill the second source holes 307B. The protective layer 321 in the second source holes 307B may be defined as insulating plugs LP.

The protective layer 321 may include a material having an etch rate different from a third material layer 325 to be formed during subsequent processes. The protective layer 321 may include an insulating material. For example, the protective layer 321 may include an oxide layer.

Subsequently, the third material layer 325 may be formed on the protective layer 321. The third material layer 325 may fill lower portions of the first slits SI1. The third material layer 325 filling the lower portions of the first slits SI1 may be formed by the processes described above with reference to FIGS. 6A to 6C and the processes described above with reference to FIGS. 7A to 7C.

Subsequently, a support insulating layer 333 may be formed to fill upper portions of the first slits SI1. The process of forming the support insulating layer 333 may be substantially the same as the process of forming the fourth material layer as described above with reference to FIGS. 7A to 7C.

The stacked structure STA may be supported by the third material layer 325 and the fourth material layer (i.e., the support insulating layer 333) filling the first slits SI1.

Figure 21A:
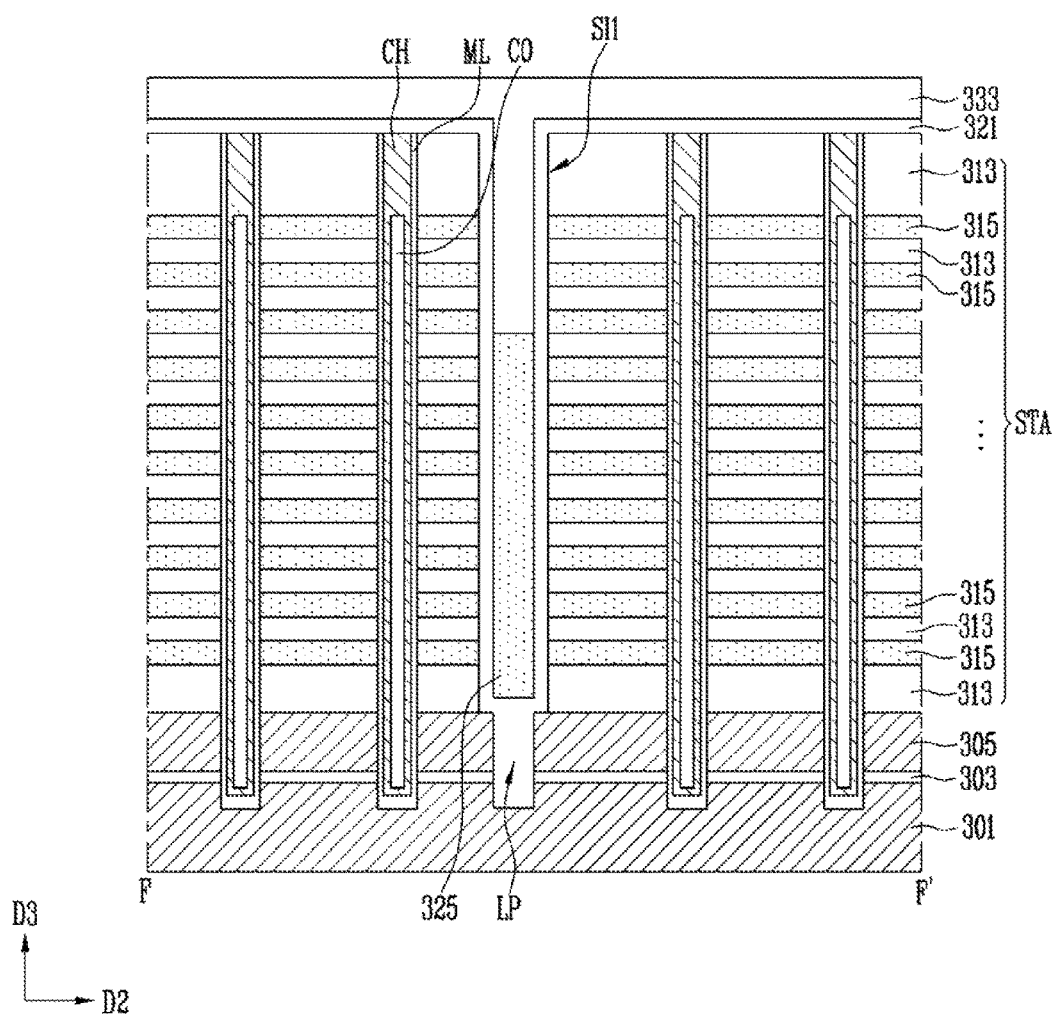
Figure 21B:
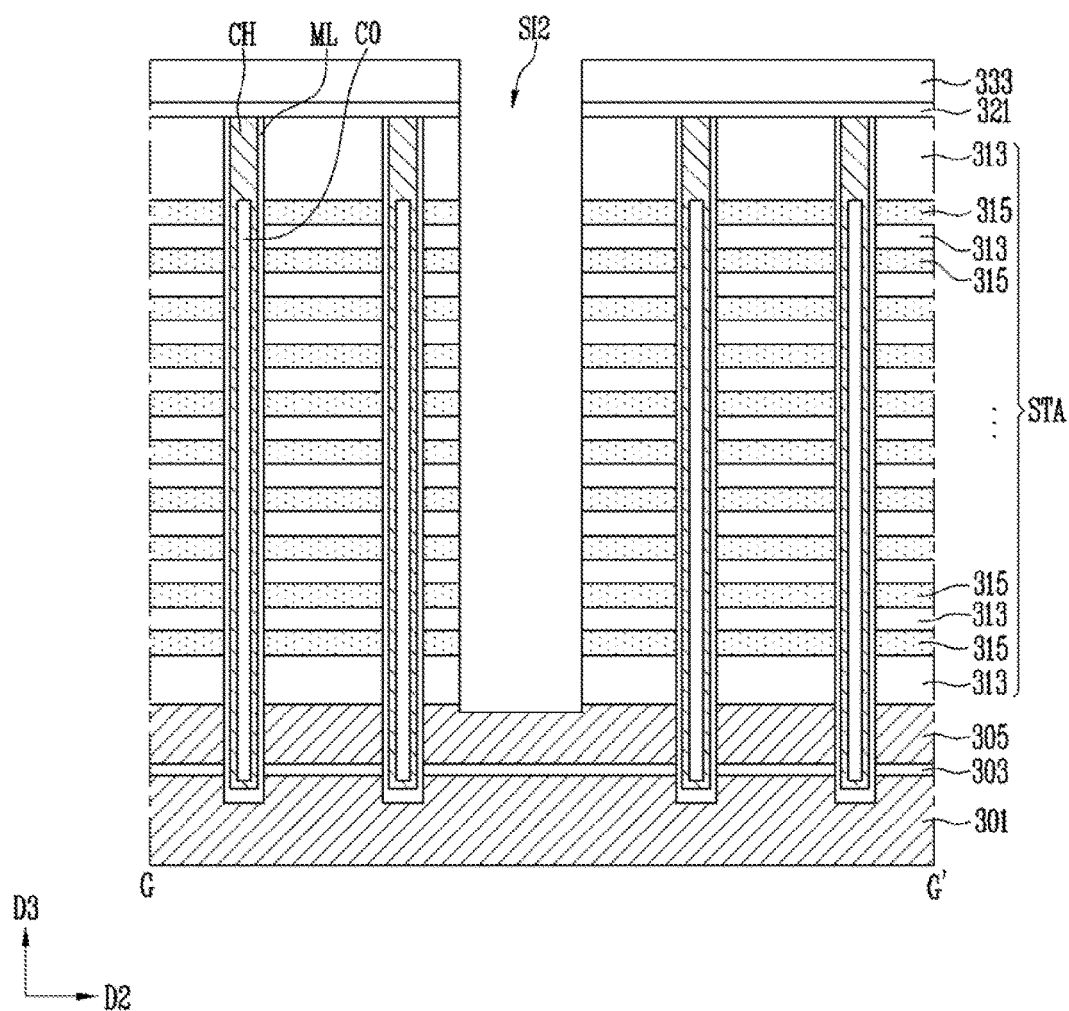

FIGS. 21A to 21C are cross-sectional views illustrating processes of forming second slits.

Referring to FIGS. 21A to 21C, second slits SI2 passing through the first material layers 313 and the second material layers 315 may be formed. The second slits SI2 may be arranged between neighboring first slits SI1 In the first direction D1 as described above with reference to FIG. 16. The second slits SI12 may be coupled to the first slits S11. The second material layers 315 and the third material layer 325 may be exposed by sidewalls of the second slits SI2.

The etch process of forming the second slits SI2 may be the same as described above with FIGS. 9A to 9C.

Figure 22A:
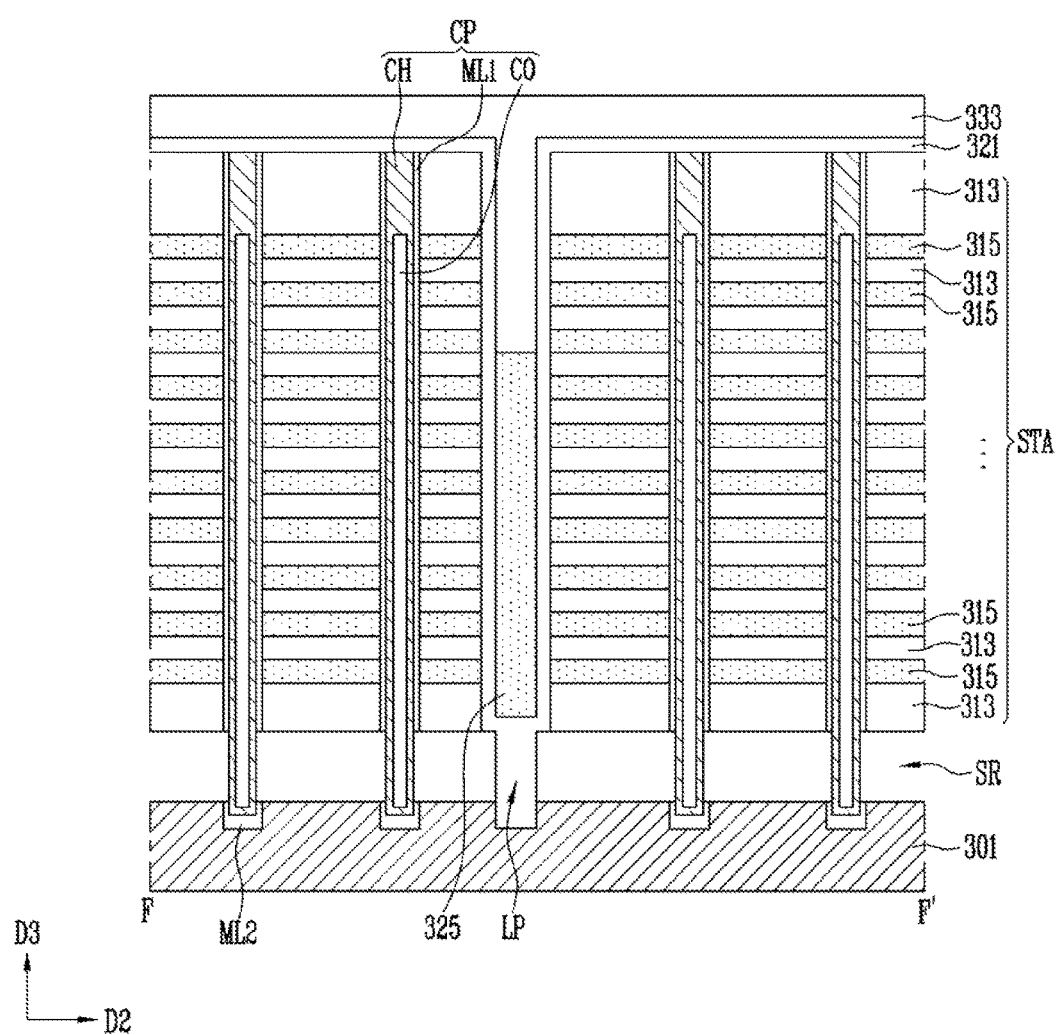
Figure 22B:
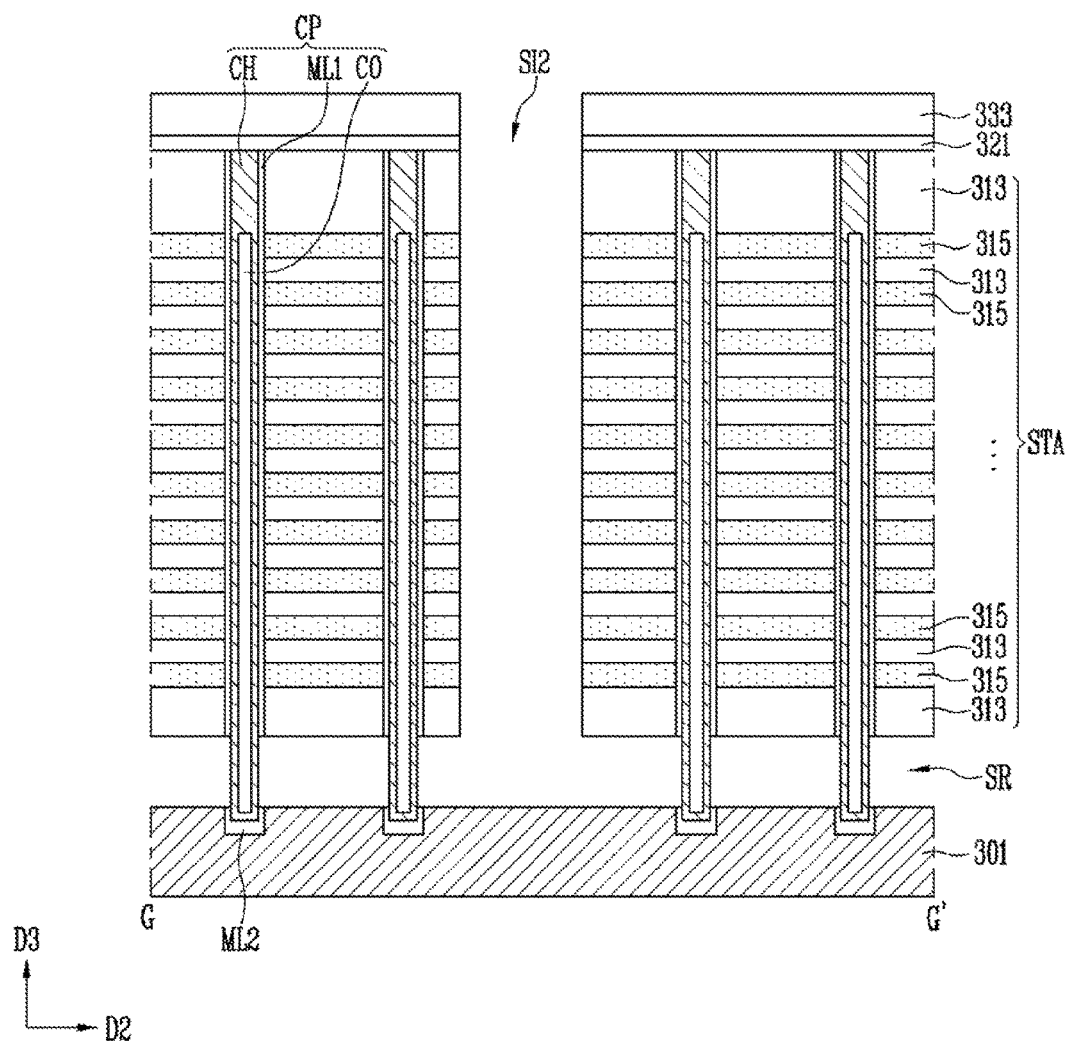
Figure 22C:
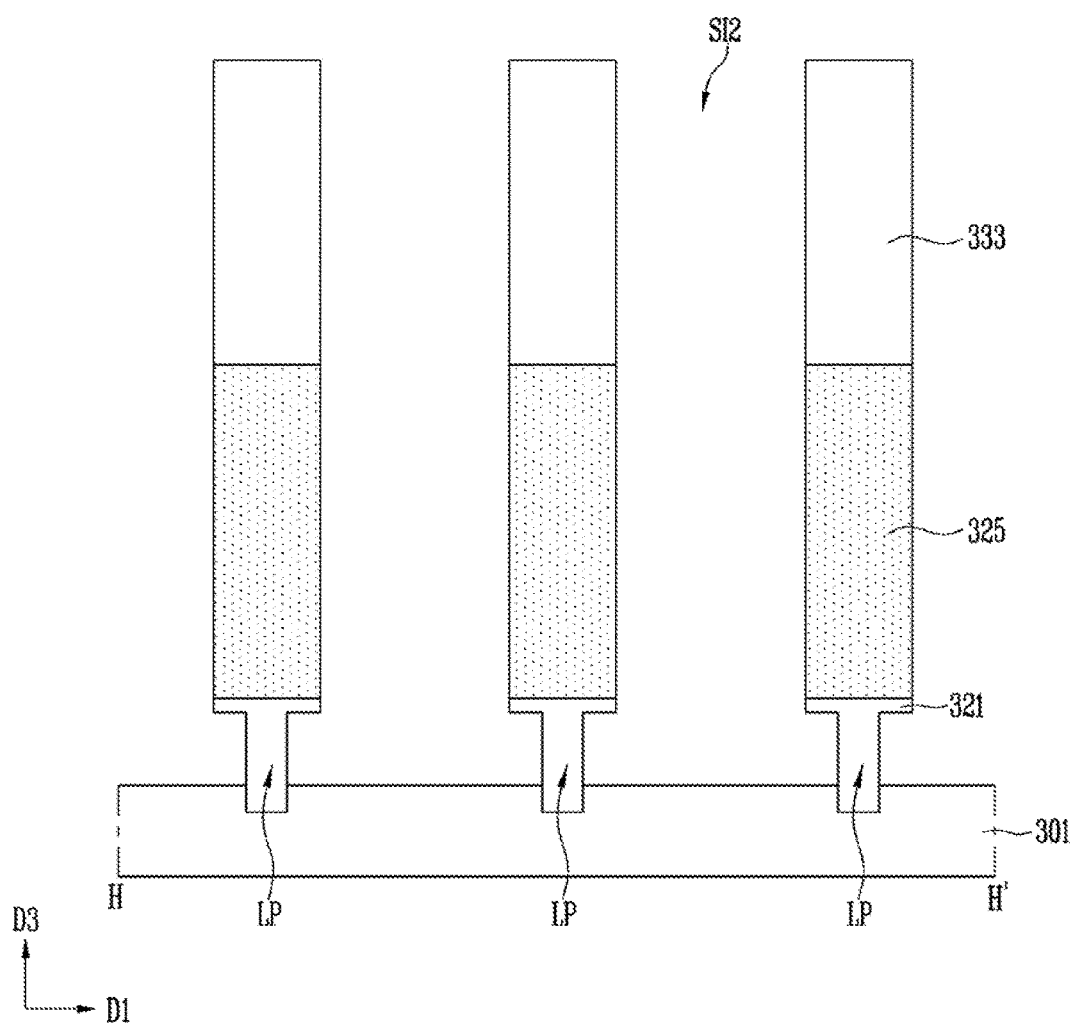

FIGS. 22A to 22C are cross-sectional views illustrating processes of opening a source region.

Referring to FIGS. 22A to 22C, the sacrificial source layer (305 of FIGS. 21A to 21C) may be removed through the second slits SI2 when the stacked structure STA are supported by the Insulating plugs LP. As a result, the multilayer memory layer (ML of FIGS. 21A and 21B) formed on sidewalls of the channel layer CH may be partially exposed, and a source region SR may be partially opened. The portion of the multilayer memory layer which is exposed by removing the sacrificial source layer may be removed through the second slits SI2. Therefore, the sidewalls of the channel layer CH may be exposed by the source region SR. The source region SR may divide the multilayer memory layer into a first multilayer memory layer ML1 and a second multilayer memory layer ML2. Therefore, cell pillar CP including the first multilayer memory layer ML1, the second multilayer memory layer ML2, the channel layer CH and the core insulating layer CO may be defined.

While the sacrificial source layer is removed, the source protective layer (303 of FIGS. 21A to 21C) may prevent loss of the base source layer 301. The source protective layer may be removed by the etch process for removing the multilayer memory layer. The source protective layer may be completely removed to expose the base source layer 301.

The source region SR may be defined between the stacked structure STA and the base source layer 301 and expose the sidewalls of the channel layer CH and the upper surface of the base source layer 301.

Figure 23B:
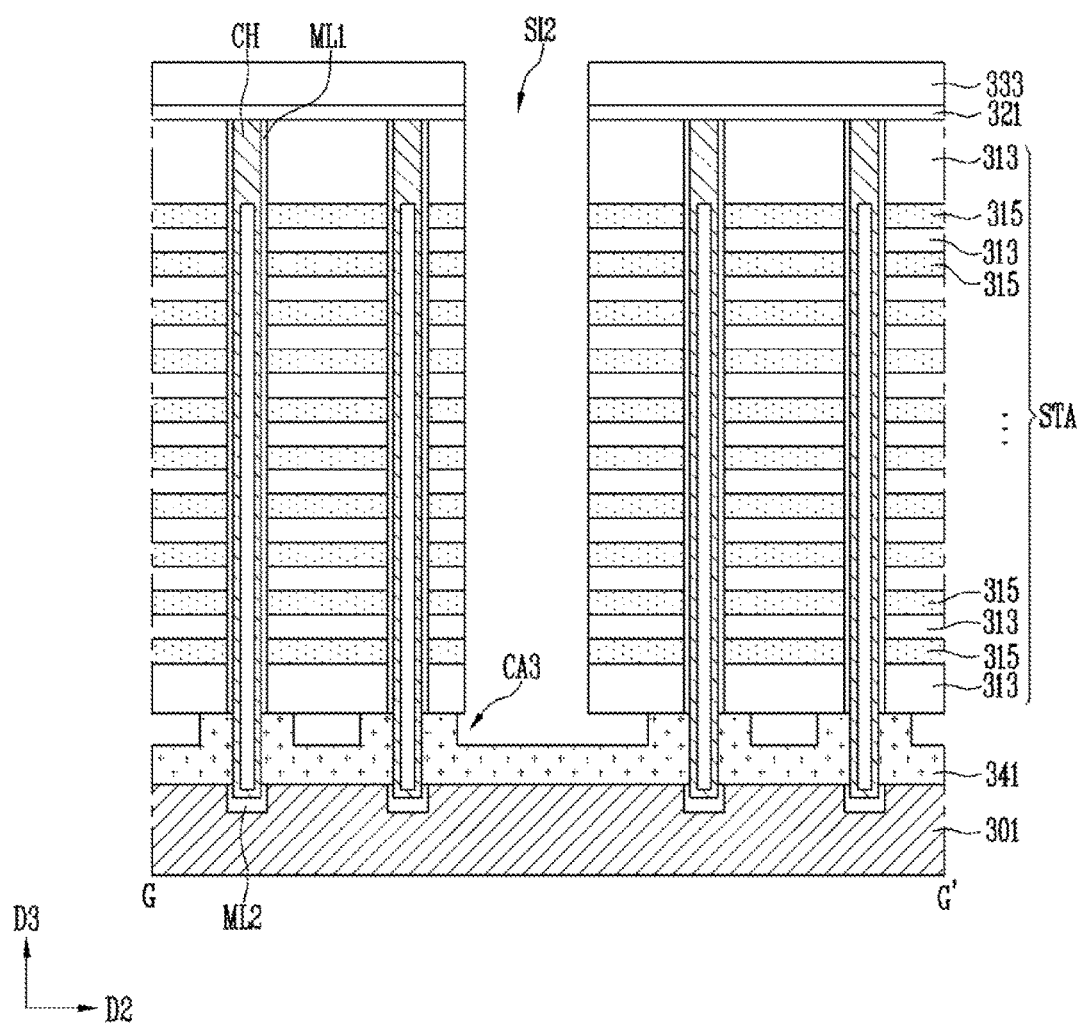
Figure 23C:
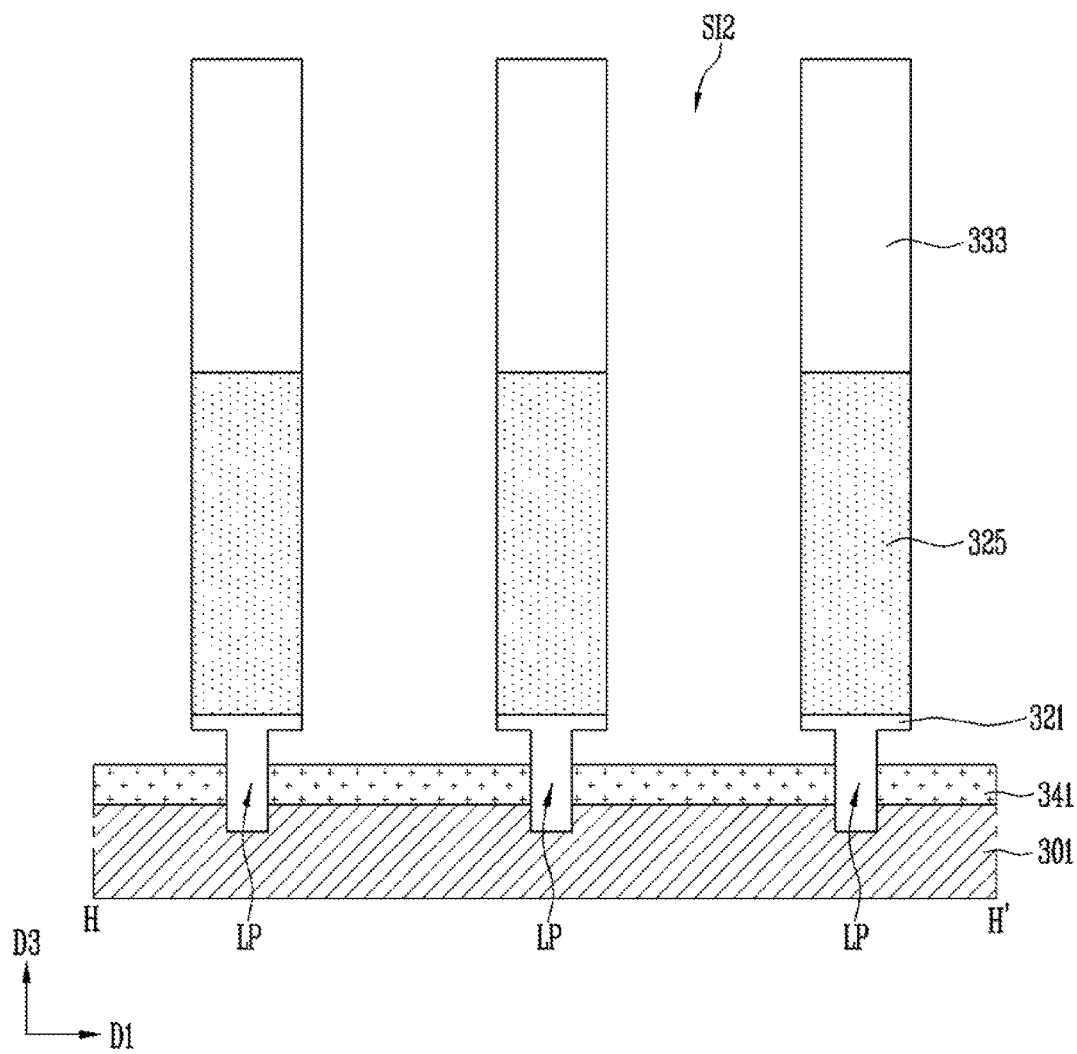

FIGS. 23A to 23C are cross-sectional views illustrating processes of forming a contact source layer.

Referring to FIGS. 23A to 23C, a contact source layer 341 may be formed in the source region (SR of FIGS. 22A and 22B) opened between the stacked structure STA and the base source layer 301 by the second slits S12. The contact source layer 341 may contact the base source layer 301 and the sidewalls of the channel layer CH.

The contact source layer 341 may be formed by a growth method using the base source layer 301 and the channel layer CH as a seed, or by a coating method for coating a conductive layer configured as the contact source layer 341.

The contact source layer 341 may be formed to completely fill the source region between the stacked structure STA and the base source layer 301. As shown in FIGS. 23A to 23C, the contact source layer 341 may have a predetermined thickness from the upper surface of the base source layer 301 and the sidewalls of the channel layer CH, and include grooves CA3 formed thereon.

As described above, the source layers 301 and 341 contacting the channel layer CH may be formed by sequentially forming the source stacked structure SRT, forming the first and second source holes 307A and 307B, forming the first sacrificial pillars 309A and the second sacrificial pillars 309B, opening the source region SR, and forming the contact source layer 341 as shown in FIGS. 18A to 23C. Since the sidewalls of the channel layer CH is exposed by the source region before the contact source layer 341 is formed, the contact source layer 341 may contact the sidewalls of the channel layer CH exposed by the source region.

Figure 24A:
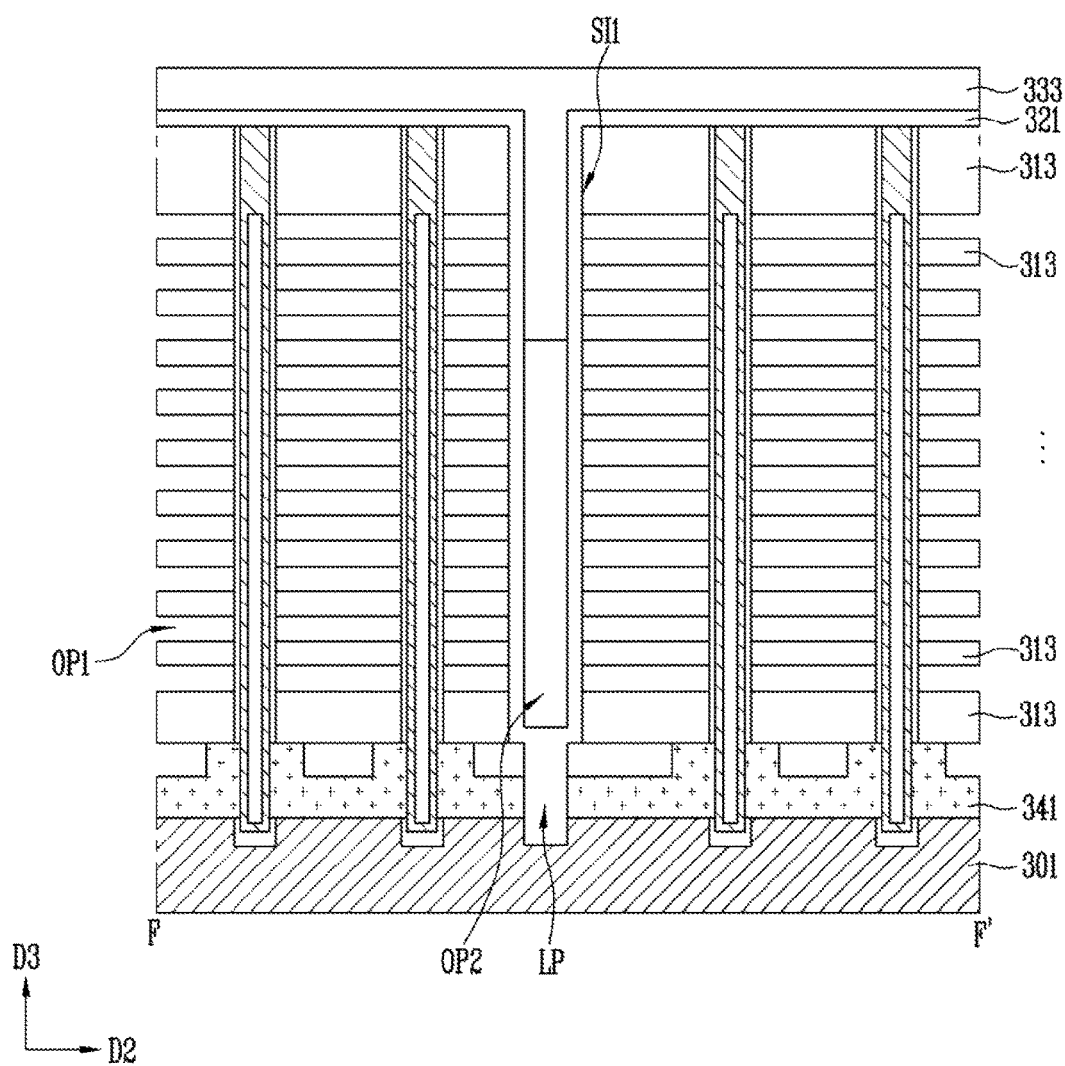
Figure 24B:
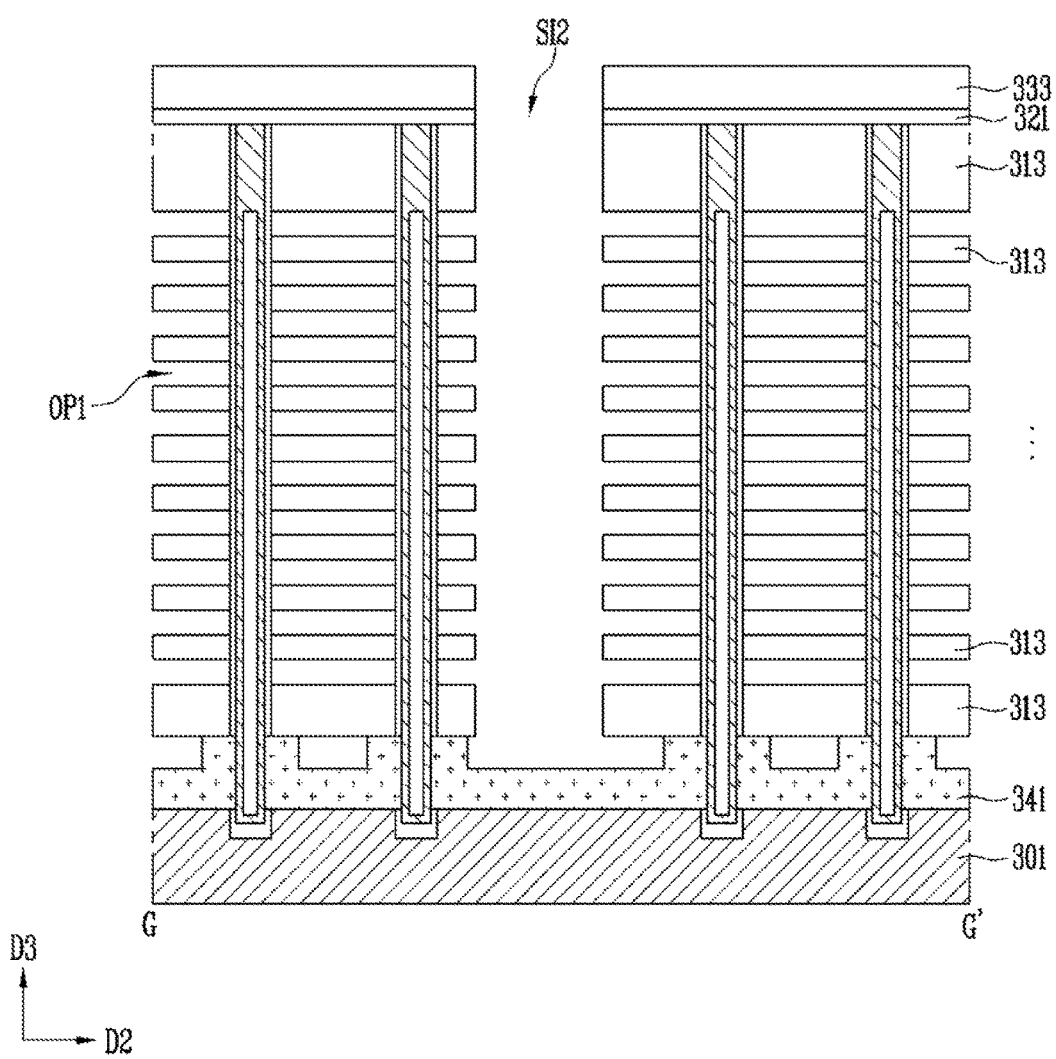
Figure 24C:
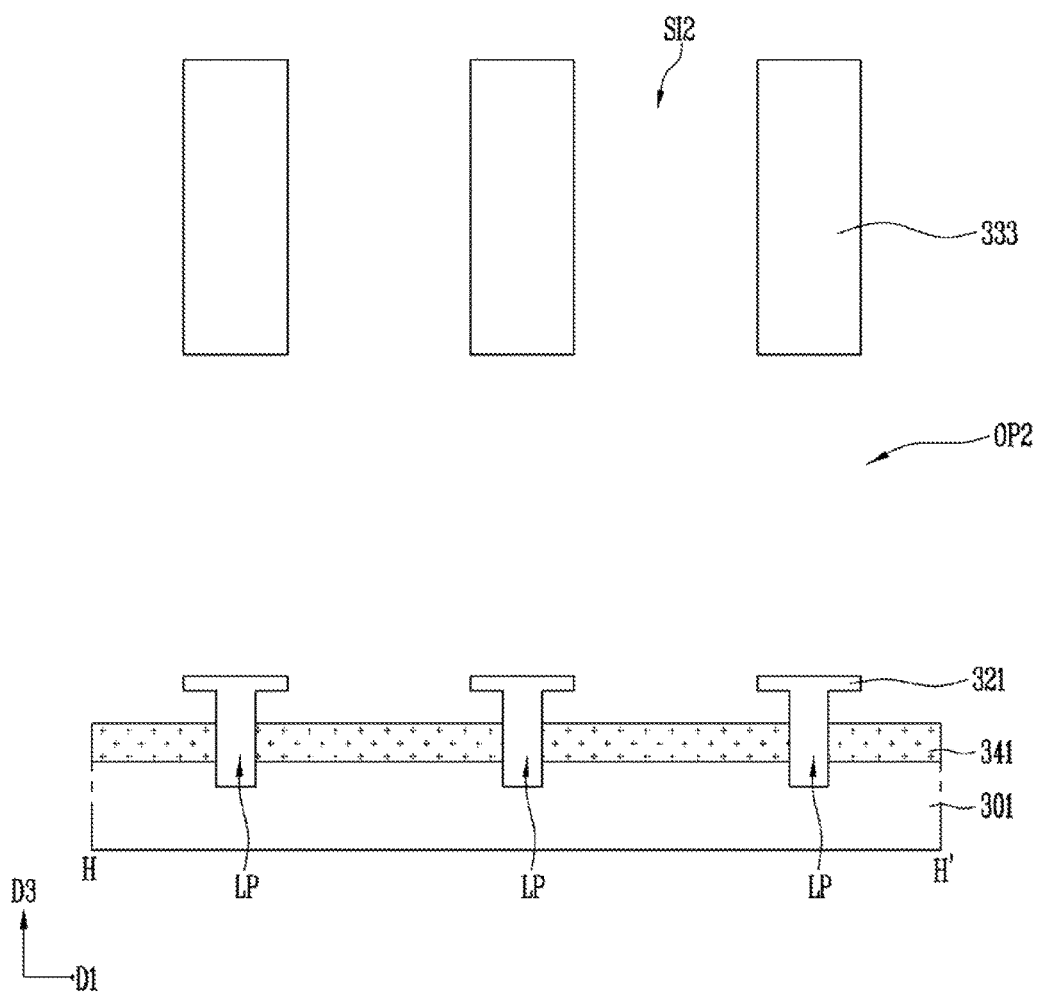

FIGS. 24A to 24C are cross-sectional views illustrating processes of forming first openings and second openings.

Referring to FIGS. 24A to 24C, the second material layers (315 of FIGS. 23A and 23B) and the third material layer (325 of FIG. 23A) may be removed by the second slits SI12 when the first material layers 313 are supported by the fourth material layer (i.e., the support insulating layer 333). As a result, first openings OP1 may be formed in regions from which the second material layers are removed, and second openings OP2 may be formed in the first slits SI1 from which the third material layer is removed. The processes of forming the first openings OP1 and the second openings OP2 may be substantially the same as described above with reference to FIGS. 10A to 10C.

Figure 25A:
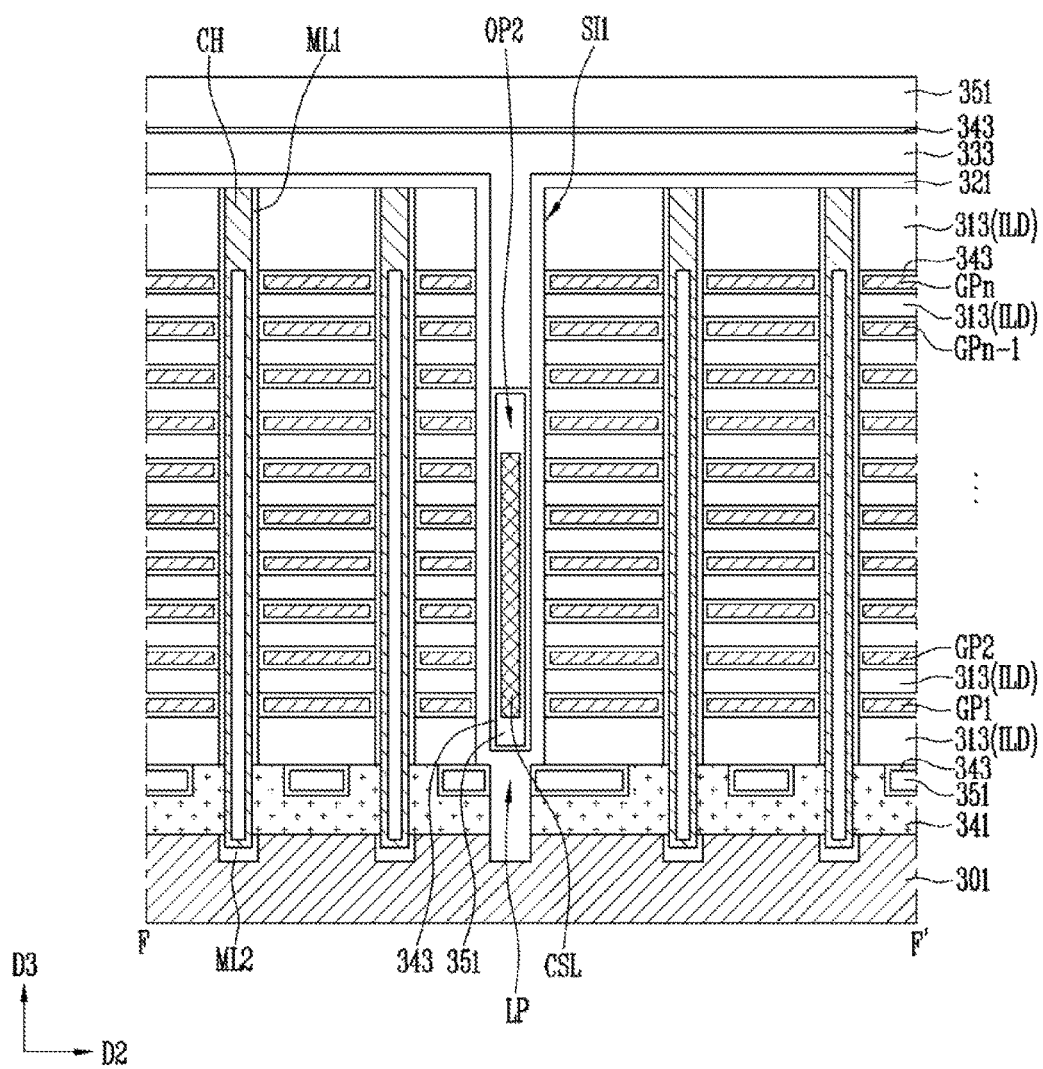
Figure 25B:
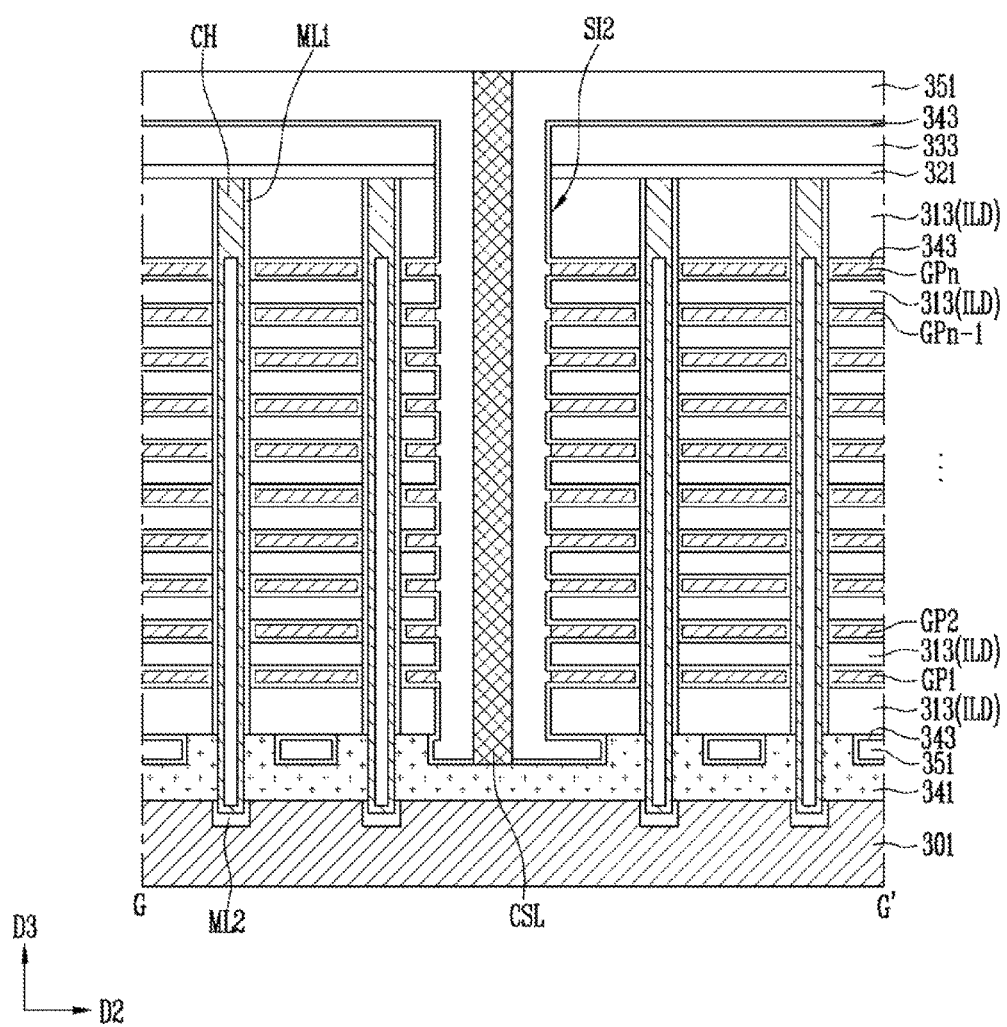
Figure 25C:
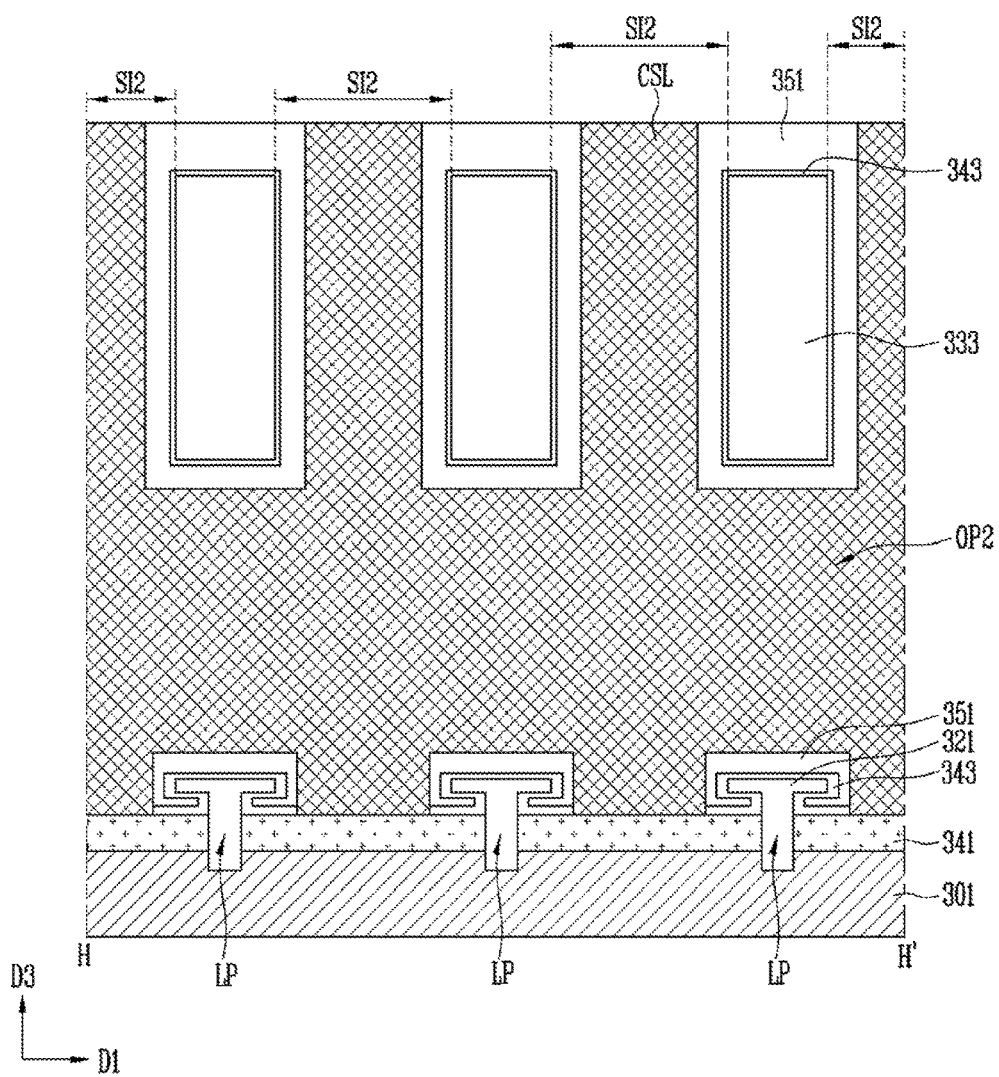

FIGS. 25A to 25C are cross-sectional views illustrating processes of forming conductive patterns and processes of forming a common source line.

Referring to FIGS. 25A to 25C, conductive patterns GP1 to GPn may be formed in the first openings OP1 as described above with reference to FIGS. 24A and 24B. To form the conductive patterns GP1 to GPn, the first openings OP1 may be filled with gate conductive materials by the second slits SI2 when the first material layers 313 are supported by the fourth material layer (i.e., the support insulating layer 333).

Before the conductive patterns GP1 to GPn are formed, a second blocking insulating layer 343 may be further formed on surfaces of the first openings OP1 as shown in FIGS. 24A and 24B. The conductive patterns GP1 to GPn may be formed on the second blocking insulating layer 343. The second blocking insulating layer 343 may extend the surfaces of the second slits SI2, the upper surface of the support insulating layer 333, the surfaces of the insulating plugs LP, the surface of the contact source layer 341, and surfaces of the second openings OP2.

The conductive patterns GP1 to GPn may be formed using the processes described above with reference to FIGS. 11A to 11C.

After the conductive patterns GP1 to GPn are formed, a sidewall insulating layer 351 may be formed on the surfaces of the second openings OP2 and the surfaces of the second slit SI2. The sidewall insulating layer 351 may extend along the upper surface of the support insulating layer 333. The sidewall insulating layer 351 may be formed on the second blocking insulating layer 343. As shown in FIGS. 24A and 24B, when the grooves CA3 are defined on the surface of the contact source layer 341, the sidewall insulating layer 351 may be formed to completely fill the grooves CA3 of the contact source layer 341. After the sidewall insulating layer 351 is formed, the sidewall insulating layer 351 and the second blocking insulating layer 343 may be partially removed to open bottom surface of the second slits SI2 so that the contact source layer 341 may be exposed.

Subsequently, a common source line CSL may be formed to completely fill the second openings OP2 and the second slits SI12. The common source line CSL may include a conductive material and contact the source layer arranged below the stacked structure, particularly, the contact source layer 341 through the bottom surfaces of the second slits SI12.

The first material layers 313 as shown in FIGS. 25A and 25B may correspond to the interlayer insulating layers ILD as shown in FIG. 16.

Figure 26:
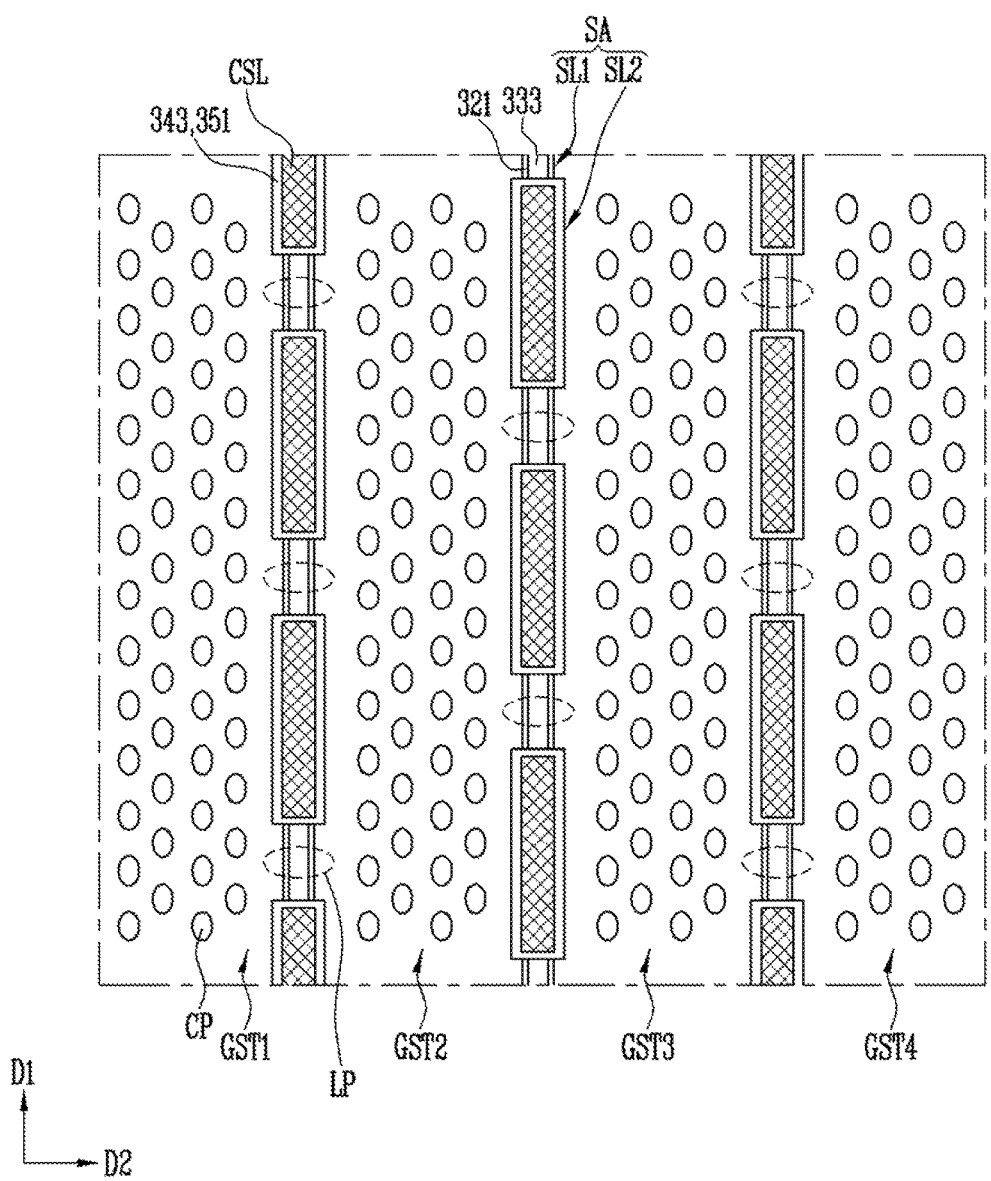
FIGS. 26 and 27 are plan views illustrating further embodiments of the present invention.
Figure 27:
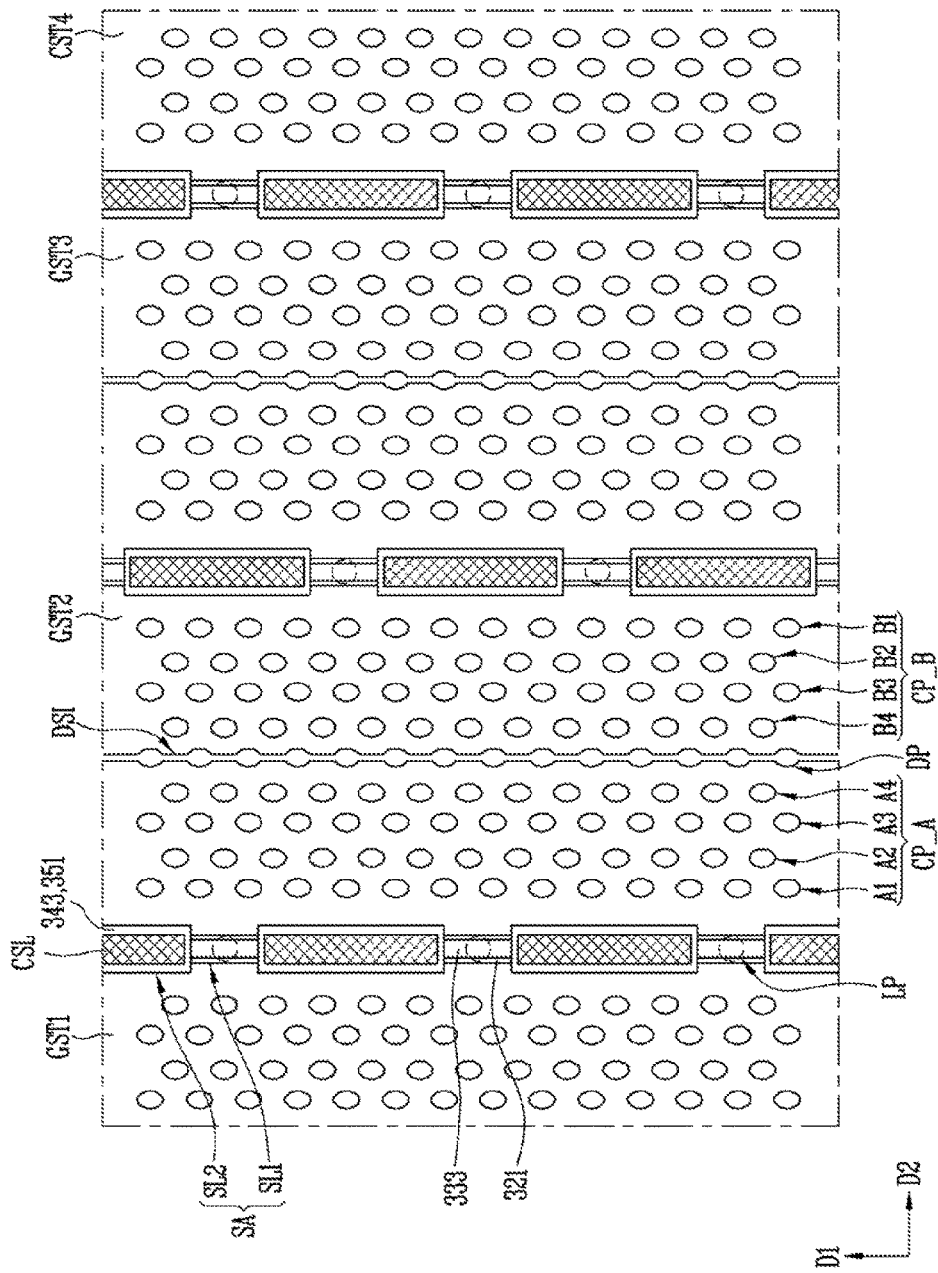

FIGS. 26 and 27 are plan views illustrating various examples of modifications of the present invention. More specifically, FIGS. 26 and 27 are plan views taken along a plane extending in a first direction D1 and a second direction D2 on a top surface of gate stacked structures.

Referring to FIGS. 26 and 27, the semiconductor device may include gate stacked structures GST1 to GST4 spaced apart from each other by separation areas SA. Cell pillars CP may be formed through each of the gate stacked structures GST1 to GST4. Each of the separation areas SA may include first slits SI1 the second slits SI2 arranged alternately with each other in the first direction D1.

The first slits SI1 and the second slits SI2 may have the same structures as described above with reference to FIG. 1.

A common source line CSL may have substantially the same structure as described above with reference to FIG. 16.

The common source line CSL may be spaced apart from the gate stacked structures GST1 to GST4 by a protective layer 321 or a sidewall Insulating layer 351. The protective layer 321 may be formed on sidewalls of the first slits SI1. The sidewall insulating layer 351 may be formed on sidewalls of each of the second slits SI2. The sidewall insulating layer 351 may be arranged adjacent to a second blocking insulating layer 343.

The common source line CSL may include first concave portions filled with a support insulating layer 333. The first concave portions may be arranged in the first slits SI1 and spaced apart from each other in the first direction D1. The arrangement of the first concave portions may be the same as described above with reference to FIG. 3.

The sidewall insulating layer 351 may extend along the boundary between the common source line CSL and the support insulating layer 333. The cell pillars CP passing through the gate stacked structures GST1 to GST4 may have the same arrangement as described above with reference to FIG. 1.

Insulating plugs LP may be arranged in a direction in which the separation areas SA extend. The insulating plugs LP may overlap with the first slits SI1 as described above with reference to FIG. 16.

Referring to FIG. 26, the insulating plugs LP may be formed into an oval shape. However, the insulating plugs LP may have various cross-sectional shapes.

Referring to FIG. 27, the cell pillars CP may be divided into a first group CP_A and a second group CP_B passing through the gate stacked structures GST1 to GST4. The cell pillars CP of the first group CP_A may include a plurality of columns A1 to A4, and the cell pillars CP of the second group CP_B may include a plurality of columns B1 to B4 symmetrical to the cell pillars CP of the first group CP_A.

A drain separation slit DSI may pass through upper stacked structures of each of the gate stacked structures GST1 to GST4. The drain separation slit DSI may extend in the first direction D1. The drain separation slit DSI may be arranged between the cell pillars CP of the first group CP_A and the cell pillars CP of the second group CP_B.

According to an embodiment, the semiconductor device may further include dummy pillars DP passing through the gate stacked structures GST1 to GST4. The dummy pillars DP may be arranged in a line in the first direction D1 between the cell pillars CP of the first group CP_A and the cell pillars CP of the second group CP_B. In other words, the dummy pillars DP may be arranged along the drain separation slit DSI while overlapping with the drain separation slit DSI.

The cross-section of the cell pillars CP and the separation area SA in the second direction D2 as shown in FIGS. 26 and 27 may be the same as shown in FIGS. 17A and 17B. The cross-section of the separation area SA in the first direction D1 may be the same as shown in FIG. 17C.

FIGS. 1 to 27 show an example in which the common source line contacting the source layer is arranged in the first slits and the second slits, and the cell pillars include straight type channel layers. However, the invention is not limited thereto. For example, the invention may also apply to the structure in which each of the cell pillars includes a channel layer having various shapes including a U or W shape. The first slits and second slits may include only insulating materials.

According to embodiments, a support insulating layer may be formed in separation areas between gate stacked structures, so that structural distortion, such as bending of gate stacked structures, may be reduced.

FIG. 28 is a block diagram illustrating a memory system 1100, according to an embodiment of the present invention.

Referring to FIG. 28, the memory system 1100 may include a controller 1110 and a memory device 1120. The memory device 1120 may include at least one of the structure shown in FIGS. 1 to 3, the structure shown in FIG. 14, the structure shown in FIGS. 15A to 15C, the structure shown in FIG. 16, the structure shown in FIGS. 17A to 17C, and the structure shown in FIGS. 26 and 27.

The memory device 1120 may be a multi-chip package including a plurality of flash memory chips. According to an embodiment, resistance of conductive patterns forming a chip may be reduced without increasing a chip size, and bridge defects between different conductive patterns may be avoided.

The memory controller 1110 may be configured to control the memory device 1120 and include a static random access memory (SRAM) 1111, a CPU 1112, a host interface 1113, an error correction code (ECC) 1114, and a memory interface 1115. The SRAM 1111 may be used as an operation memory of the CPU 1112, the CPU 1112 may perform a control operation for data exchange of the memory controller 1110, the host interface 1113 may include a data exchange protocol in contact with a host. In addition, the ECC 1114 may detect and correct errors included in the data read from the memory device 1120, and the memory interface 1115 may perform interfacing with the memory device 1120. In addition, the memory controller 1110 may further include a read only memory (ROM) for storing code data for interfacing with the host.

The memory system 1100 described above may be a memory card of a solid state disk (SSD) in which the memory device 1120 and the controller 1100 are combined. For example, when the memory system 1100 is the SSD, the memory controller 1110 may communicate with an external source (e.g. a host) through one of various interface protocols such as universal serial bus (USB), multimedia card (MMC), peripheral component interconnection-express (PCI-E), serial advanced technology attachment (SATA), parallel advanced technology attachment (PATA), small computer small interface (SCSI), enhanced small disk interface (ESDI), integrated drive electronics (IDE) and the like.

Figure 29:
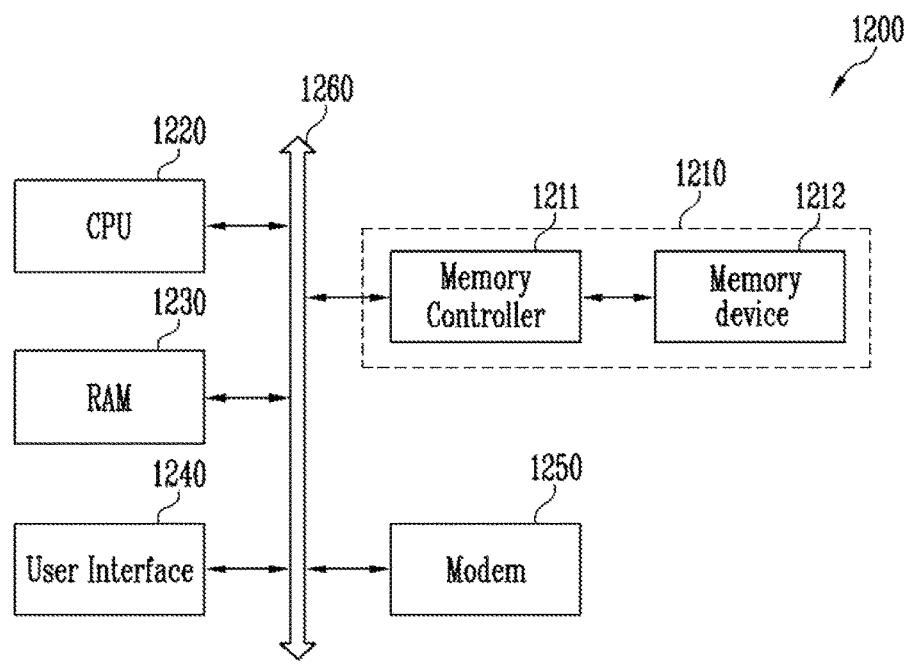
FIG. 29 is a block diagram illustrating a computing system including the memory system shown in FIG. 28, according to an embodiment of the present invention.

FIG. 29 is a block diagram illustrating a computing system 1200 including the memory system shown with reference to FIG. 28, according to an embodiment of the present invention.

Referring to FIG. 29, the computing system 1200 according to an embodiment of the invention may include the CPU 1220 electrically connected to a system bus 1260, a random access memory (RAM) 1230, a user Interface 1240, a modem 1250, a memory system 1210, and the like. In addition, when the computing system 1200 is a mobile device, a battery for supplying an operating voltage to the computing system 1200 may be further included, and an application chipset, a camera image processor (CIS), a mobile deem, and the like may be further included.

The memory system 1210 may include a memory device 1212 and a memory controller 1211. The memory device 1212 and the memory controller 1211 may correspond to the memory device 1120 and the memory controller 1110 described above with reference to FIG. 28.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A semiconductor device comprising:
   gate stacked structures surrounding channel layers;
   a common source line filling a separation area between the gate stacked structures adjacent to each other and having an upper surface including first concave portions, wherein the first concave portions are arranged in a first direction crossing a lengthwise direction of the channel layer; and
   a support insulating layer filling the first concave portions and having sidewalls facing portions of the channel layers.

2. The semiconductor device of claim 1, wherein the separation area and the common source line extend in the first direction.

3. The semiconductor device of claim 2, wherein the first concave portions are spaced apart from each other in the first direction.

4. The semiconductor device of claim 2, wherein the separation area includes first slits and second slits arranged alternately with each other in the first direction and coupled to each other.

5. The semiconductor device of claim 4, wherein the common source line comprises:
   first portions arranged below the support insulating layer in the first slits; and
   second portions arranged in the second slits and extending to be longer than the first portions in a third direction perpendicular to the first direction.

6. The semiconductor device of claim 1, wherein the common source line includes a bottom surface including second concave portions overlapping with the first concave portions.

7. The semiconductor device of claim 1, further comprising:
   a source layer arranged below the gate stacked structures so as to contact the channel layers.

8. The semiconductor device of claim 7, wherein the common source line comprises:
   a first portion arranged between the source layer and the support insulating layer and spaced apart from the source layer; and
   a second portion contacting the source layer and extending to face the sidewalls of the support insulating layer.

9. The semiconductor device of claim 8, further comprising:
   at least one insulating layer arranged between the first portion and the source layer.

10. The semiconductor device of claim 7, wherein each of the channel layers extends into the source layer, the source layer including a contact source layer contacting sidewalls of the channel layers and a base source layer arranged below the contact source layer, and
    the semiconductor device further comprises insulating plugs passing through the contact source layer and overlapping with the first concave portions.

11. A semiconductor device comprising:
    gate stacked structures;
    a channel layer penetrating each of the gate stacked structures; and
    a common source line having uneven sidewalls facing the gate stacked structures and arranged between the gate stacked structures,
    wherein each of the uneven sidewalls is defined by depressions and protrusions alternating with each other in a first direction crossing a lengthwise direction of the channel layer.

12. The semiconductor device of claim 11, wherein the common source line includes:
- an upper surface including first concave portions spaced apart from each other in the first direction; and
- a bottom surface including second concave portions spaced apart from each other in the first direction and overlapping with the first concave portions.

13. The semiconductor device of claim 11, further comprising:
- first slits arranged in the first direction between the gate stacked structures and having lower portions filled with the common source line; and
- a support insulating layer provided on the common source line to fill upper portions of the first slits.

14. The semiconductor device of claim 13, further comprising:
- second slits neighboring the first slits in the first direction, between the gate stacked structures, and filled with the common source line.

15. The semiconductor device of claim 11, wherein
- a portion of the common source line is higher than the gate stacked structures and the channel layer, and
- a remaining portion of the common source line is lower than the gate stacked structures and the channel layer.

16. A semiconductor device comprising:
- gate stacked structures; and
- a common source line arranged between the gate stacked structures,
- wherein the common source line has uneven sidewalls facing the gate stacked structures, an uneven bottom surface and an uneven upper surface.

17. The semiconductor device of claim 16, further comprising:
- a channel layer penetrating each of the gate stacked structures,
- wherein each of the uneven sidewalls is defined by depressions and protrusions alternating with each other in a first direction crossing a lengthwise direction of the channel layer.

18. The semiconductor device of claim 16, further comprising:
- a channel layer penetrating each of the gate stacked structures,
- wherein the uneven bottom surface is defined by depressions and protrusions alternating with each other in a first direction crossing a lengthwise direction of the channel layer.

19. The semiconductor device of claim 16, further comprising:
- a channel layer penetrating each of the gate stacked structures,
- wherein the uneven upper surface is defined by depressions and protrusions alternating with each other in a first direction crossing a lengthwise direction of the channel layer.

* * * * *

UNITED STATES PATENT AND TRADEMARK OFFICE
CERTIFICATE OF CORRECTION

PATENT NO. : 10,192,880 B2
APPLICATION NO. : 15/638496
DATED : January 29, 2019
INVENTOR(S) : Ki Hong Lee It is certified that error appears in the above-identified patent and that said Letters Patent is hereby corrected as shown below:

In the Specification

Column 25, Line 5, "15C" should be changed to --15B--.

Signed and Sealed this
Thirty-first Day of May, 2022

Katherine Kelly Vidal
*Director of the United States Patent and Trademark Office*